(12) United States Patent
Tsodokov

(10) Patent No.: US 11,472,155 B2
(45) Date of Patent: *Oct. 18, 2022

(54) TRANSLUCENT BUILDING MATERIAL

(71) Applicant: Metacomb, Inc., Cambridge, MA (US)

(72) Inventor: Vsevolod Tsodokov, Somerville, MA (US)

(73) Assignee: Metacomb, Inc., Cambridge, MA (US)

(*) Notice: Subject to any disclaimer, the term of this patent is extended or adjusted under 35 U.S.C. 154(b) by 415 days.

This patent is subject to a terminal disclaimer.

(21) Appl. No.: 16/548,173

(22) Filed: Aug. 22, 2019

(65) Prior Publication Data

US 2020/0079049 A1    Mar. 12, 2020

Related U.S. Application Data

(60) Continuation of application No. 15/358,290, filed on Nov. 22, 2016, now Pat. No. 10,434,743, which is a
(Continued)

(51) Int. Cl.
*B32B 3/28* (2006.01)
*B32B 29/08* (2006.01)
(Continued)

(52) U.S. Cl.
CPC .............. *B32B 3/28* (2013.01); *B32B 29/08* (2013.01); *E04B 9/04* (2013.01); *E04F 13/0871* (2013.01);
(Continued)

(58) Field of Classification Search
CPC ...... E04C 2/322; E04F 13/0871; E04F 15/10; E04B 9/04; B32B 29/08; H02S 20/26; H01L 31/0481
See application file for complete search history.

(56) References Cited

U.S. PATENT DOCUMENTS 2,719,566 A    10/1955    Blatt
3,272,686 A     9/1966    Prates et al.
(Continued)

FOREIGN PATENT DOCUMENTS

CA    2546712 A1    6/2005
DE     373934 C     4/1923
(Continued)

OTHER PUBLICATIONS

Stellar Scrap Lights, htt://www.graypants.com/?p=1214, dated May 14, 2010, 3 pages.
(Continued)

*Primary Examiner* — Christine T Cajilig
(74) *Attorney, Agent, or Firm* — Goodwin Procter LLP

(57) ABSTRACT

A manufacturing process, and related products, for fabricating translucent articles in the form of tiles. The manufacturing process includes holding together a stack of corrugated cardboard pieces and saturating the cardboard pieces with an impregnating agent. Additional steps may include machining the cardboard pieces to define a block of a desired shape, slicing the block into tile components, and/or coating one or more tile components with a coating material to produce the article. Articles include translucent tiles made of corrugated cardboard pieces saturated with an impregnating agent. The tiles may be arranged to define a surface, such as a floor, a wall, a roof, a lighting installation, an architectural construction element, an architectural aesthetic element, or a solar panel.

29 Claims, 53 Drawing Sheets

Related U.S. Application Data division of application No. 14/063,490, filed on Oct. 25, 2013, now Pat. No. 9,796,153, which is a division of application No. 12/896,334, filed on Oct. 1, 2010, now Pat. No. 8,597,455.

(60) Provisional application No. 61/353,494, filed on Jun. 10, 2010, provisional application No. 61/278,181, filed on Oct. 2, 2009.

(51) Int. Cl.
| | | |
|---|---|---|
| *H01L 31/048* | (2014.01) | |
| *H02S 20/26* | (2014.01) | |
| *E04B 9/04* | (2006.01) | |
| *E04F 13/08* | (2006.01) | |
| *E04F 15/10* | (2006.01) | |
| *E04C 2/32* | (2006.01) | |

(52) U.S. Cl.
CPC .......... *E04F 15/10* (2013.01); *H01L 31/0481* (2013.01); *H02S 20/26* (2014.12); *E04C 2/322* (2013.01); *Y02B 10/10* (2013.01)

(56) References Cited

U.S. PATENT DOCUMENTS

| | | | |
|---|---|---|---|
| 3,574,103 A | 4/1971 | Latkin | |
| 3,857,217 A | 12/1974 | Reps | |
| 3,875,680 A | 4/1975 | Back et al. | |
| 3,895,152 A | 7/1975 | Carlson et al. | |
| 3,936,157 A | 2/1976 | Kapany | |
| 3,950,585 A | 4/1976 | Hale | |
| 4,119,750 A | 10/1978 | Porter | |
| 4,132,042 A | 1/1979 | Di Maio | |
| 4,343,533 A | 8/1982 | Currin et al. | |
| 4,346,541 A | 8/1982 | Schmitt | |
| 4,548,678 A | 10/1985 | Laflin et al. | |
| 4,579,756 A * | 4/1986 | Edgel | B32B 27/08 |
| | | | 428/34 |
| 4,711,681 A | 12/1987 | Grossmann et al. | |
| 4,803,108 A | 2/1989 | Leuchten et al. | |
| 4,827,690 A | 5/1989 | Viger | |
| 5,156,433 A | 10/1992 | Decker | |
| 5,265,561 A | 11/1993 | Crawford | |
| 5,270,092 A | 12/1993 | Griffith et al. | |
| 5,310,586 A | 5/1994 | Mullen | |
| 5,379,557 A | 1/1995 | Kotter | |
| 5,383,999 A | 1/1995 | Kuo | |
| 5,413,662 A | 5/1995 | Skinner, III | |
| 5,463,965 A | 11/1995 | Cordrey | |
| 5,491,309 A | 2/1996 | Kotter | |
| 5,505,769 A | 4/1996 | Dinnage et al. | |
| 5,538,775 A | 7/1996 | Kawakami et al. | |
| 5,580,409 A | 12/1996 | Andersen et al. | |
| 5,653,574 A | 8/1997 | Lin | |
| 5,749,998 A | 5/1998 | Skinner | |
| 5,791,118 A | 8/1998 | Jordan | |
| 5,830,548 A | 11/1998 | Andersen et al. | |
| 6,083,855 A | 7/2000 | Olson et al. | |
| 6,174,587 B1 | 1/2001 | Figge, Sr. | |
| 6,187,401 B1 | 2/2001 | Heisel et al. | |
| 6,224,706 B1 | 5/2001 | Matich | |
| 6,372,694 B1 | 4/2002 | Osinga et al. | |
| 6,557,308 B1 | 5/2003 | Snel | |
| 6,667,089 B1 | 12/2003 | Barker | |
| 6,673,415 B1 | 1/2004 | Yamazaki et al. | |
| 6,699,558 B1 | 3/2004 | Milburn | |
| 7,169,459 B2 | 1/2007 | Lichodziejewski et al. | |
| 7,194,846 B2 | 3/2007 | Swiszcz et al. | |
| 7,497,318 B2 | 3/2009 | Lin | |
| 7,713,955 B2 | 5/2010 | Whiteford et al. | |
| 8,597,455 B1 | 12/2013 | Tsodokov | |
| 2001/0042593 A1 | 11/2001 | Zhou et al. | |
| 2001/0050852 A1 | 12/2001 | Jones | |
| 2004/0035063 A1 | 2/2004 | Bryant et al. | |
| 2004/0123555 A1 | 7/2004 | Cole | |
| 2004/0200161 A1* | 10/2004 | Liu | E04F 13/0855 |
| | | | 52/235 |
| 2005/0100714 A1 | 5/2005 | Sutcliffe et al. | |
| 2005/0136198 A1* | 6/2005 | Bourlier | B32B 17/10055 |
| | | | 428/34 |
| 2006/0105135 A1 | 5/2006 | Chien et al. | |
| 2007/0074755 A1* | 4/2007 | Eberspacher | H01L 31/02008 |
| | | | 136/244 |
| 2007/0199653 A1 | 8/2007 | Lockwood | |
| 2008/0026662 A1 | 1/2008 | Ramsey | |
| 2009/0067164 A1 | 3/2009 | Ambroggio et al. | |
| 2009/0266005 A1 | 10/2009 | Snel | |
| 2009/0282778 A1 | 11/2009 | Bertero | |
| 2010/0050556 A1 | 3/2010 | Burns | |
| 2010/0143662 A1 | 6/2010 | Suare et al. | |
| 2011/0088931 A1 | 4/2011 | Lettow et al. | |
| 2011/0155222 A1 | 6/2011 | Ehbing et al. | |
| 2011/0200785 A1 | 8/2011 | Neitzke | |
| 2012/0048487 A1* | 3/2012 | Brewster | B32B 23/08 |
| | | | 160/368.1 |
| 2012/0052238 A1 | 3/2012 | Daniel | |
| 2013/0206501 A1 | 8/2013 | Yu et al. | |

FOREIGN PATENT DOCUMENTS

| | | | | |
|---|---|---|---|---|
| DE | 9215985 U1 * | 3/1994 | | B31F 1/2895 |
| DE | 102008062678 A1 * | 6/2010 | | B32B 7/14 |
| EP | 1179633 A1 | 2/2002 | | |
| EP | 1777255 A2 | 4/2007 | | |
| GB | 176853 A | 3/1922 | | |
| GB | 932842 A * | 7/1963 | | E04C 2/36 |
| GB | 2282103 A | 3/1995 | | |
| JP | 2007308956 A | 11/2007 | | |
| WO | WO-1987005955 A1 | 10/1987 | | |
| WO | WO-1987005956 A1 | 10/1987 | | |
| WO | WO-1991011567 A1 | 8/1991 | | |
| WO | WO-1993002853 A1 | 2/1993 | | |
| WO | WO-1998004401 A1 | 2/1998 | | |
| WO | WO-1998049116 A1 | 11/1998 | | |
| WO | WO-1999031974 A1 | 7/1999 | | |
| WO | WO-2001083201 A1 | 11/2001 | | |
| WO | WO-2004085150 | 10/2004 | | |
| WO | WO-2007104584 A1 | 9/2007 | | |
| WO | WO-2007113004 A1 | 10/2007 | | |
| WO | WO-2007141659 A2 | 12/2007 | | |
| WO | WO-2009029089 A1 | 3/2009 | | |
| WO | WO-2009076954 A1 | 6/2009 | | |
| WO | WO-2009137894 A1 | 11/2009 | | |
| WO | WO-2009149850 A2 | 12/2009 | | |
| WO | WO-2010022477 A1 | 3/2010 | | |
| WO | WO-2010039442 A1 | 4/2010 | | |

OTHER PUBLICATIONS

Baypreg Product Sheet. http://www.polyurethanes.covestro.com/Products/Polysurethane-Systems/BAYPREG.aspx.

Panelite Express Product Order Sheet. Aug. 12, 2009, Accessed on Sep. 8, 2015 from https://web.archive.org/web/200908224041654/http://www/panelite.us/downloads/panelite_express.pdf.

Panelite Products Webpage.2007. Accessed on Sep. 8, 2015 frin https://web.archive.org.web20070930001704/http://www.panelite.us/.

Panelite Bonded Series Catalog.2011. Accessed on Sep. 8, 2015 from https://web.archive.org/web/20110813083142/http://www.panelite.us/downloads/Panelite%20Bonded%20Series%20Catalogue.pdf.

"Ecoben Wave," http://www.bencore.co.uk/en/ecoben_wave.aspx, downloaded on Apr. 30, 2014, 2 pages.

"Gamma Colori Standard; Standard Colour Range," http://www.bencore.co.uk/pdf/gamma_colori_2012.pdf, Jan. 2012, 17 pages.

"Bencore Presents Ecoben Wave," http://www.eyesin.com/blog/2012/03/09/bencore-presents-ecoben-wave/, downloaded on Apr. 30, 2014, 9 pages.

"Ecoben Wave Panel from Bencore," http://materialsandsources.com/ecoben-wave-panel-bencore/, Dec. 2, 2013, 4 pages.

(56) References Cited

OTHER PUBLICATIONS

"Ecoben," http://materia.nl/material/ecoben/, Dec. 19, 2011, 2 pages.
"Panelite, Bonded Series Fabrication Guide," http://www.panelite.us/wp-content/uploads/2013/07/Panelite-Bonded-Series-Fabrication-Manual-c-2013.pdf, 2013, 22 pages.
"R100—Recycled Fiber (Ecoben)," http://www.panelite.us/products/interior-bonded-series/product-options/r100-recycied-fiber-ecoben/, downloaded on May 2, 2014, 3 pages.
"Panelite, Bonded Series Color Options," http://www.paneiite.us/products/interior-bonded-series/product-options/bonded-series-color-options/, downloaded on May 2, 2014, 5 pages.

\* cited by examiner

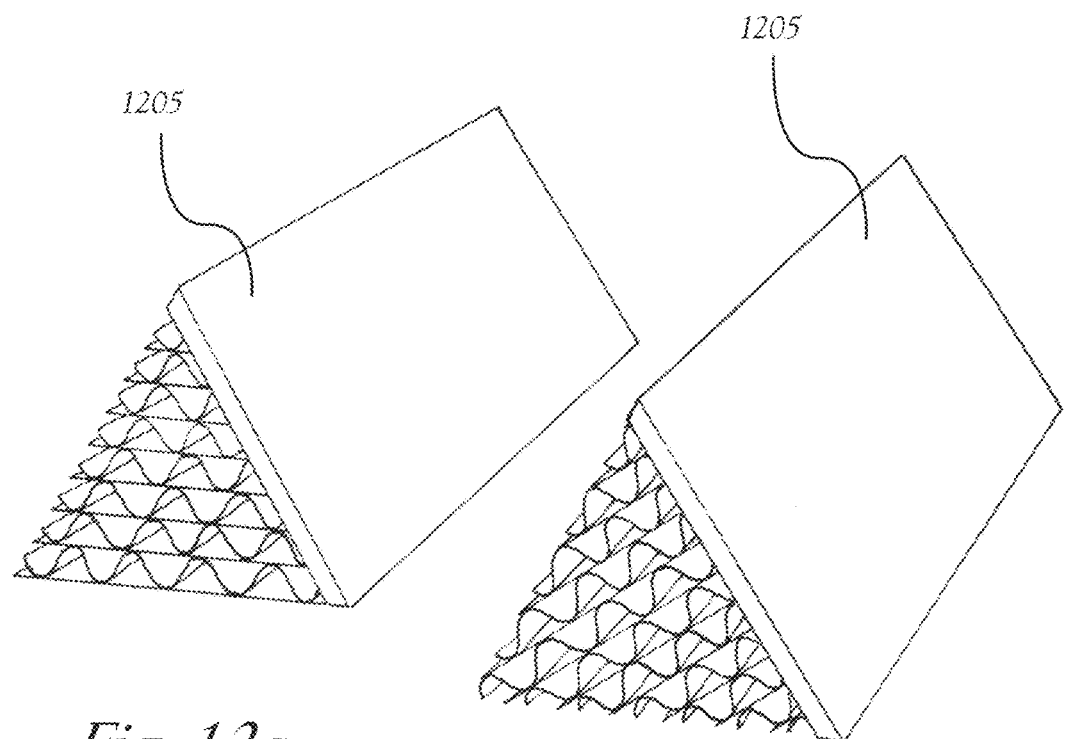
Fig. 12c
Fig. 12d
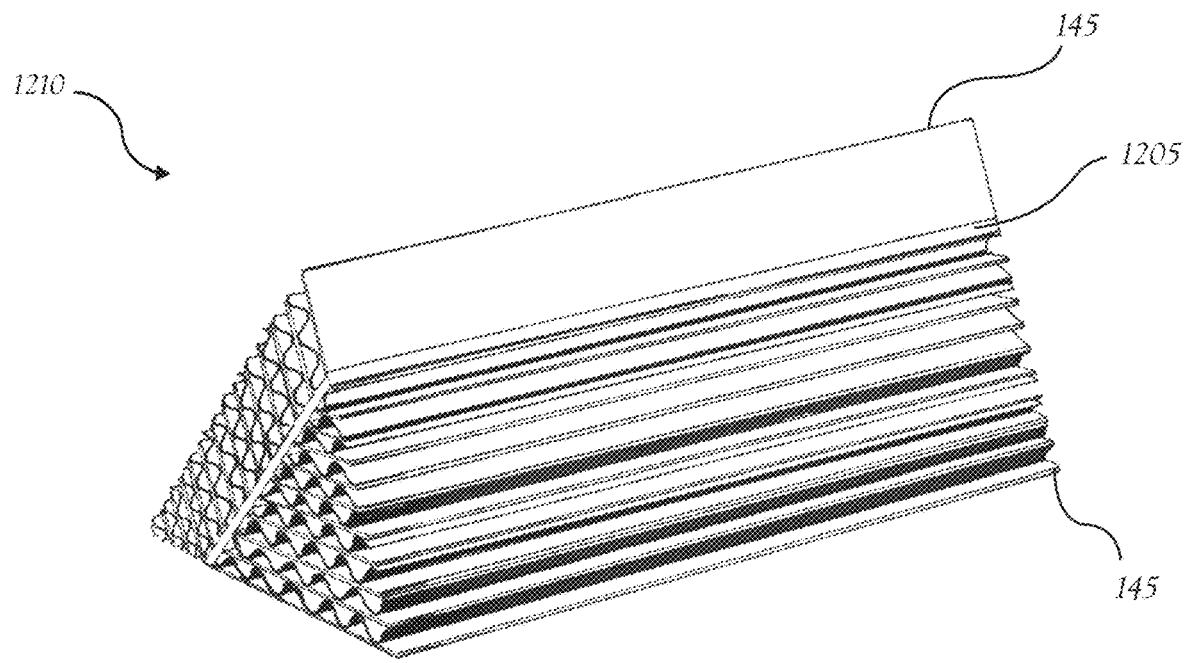
Fig. 12e

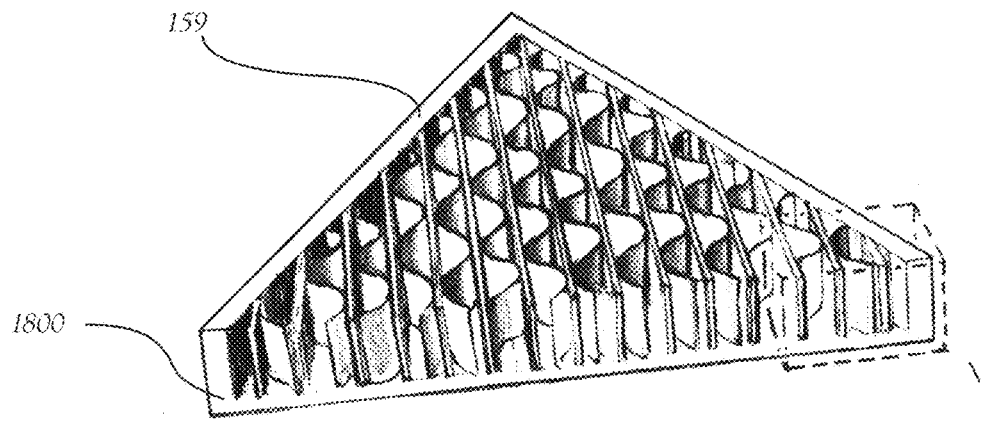
Fig. 18a1
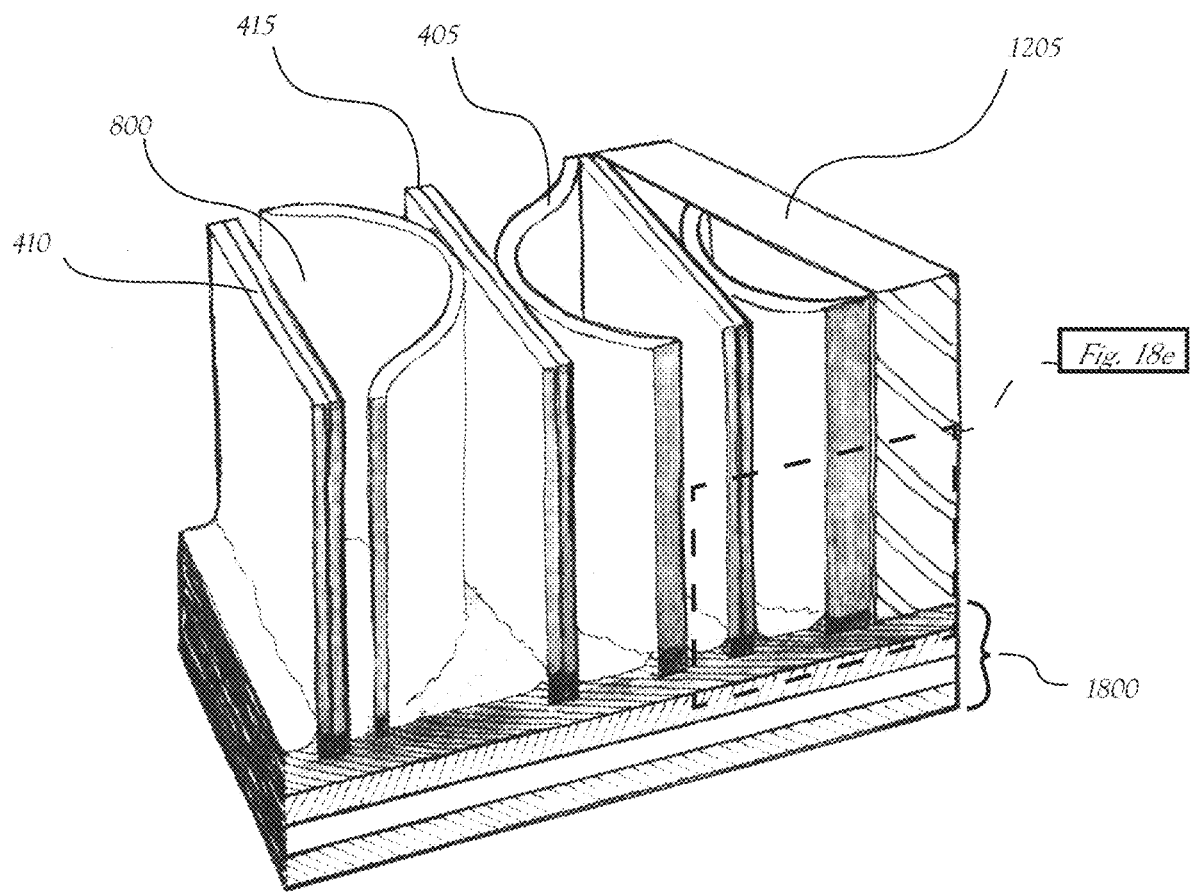
Fig. 18a2

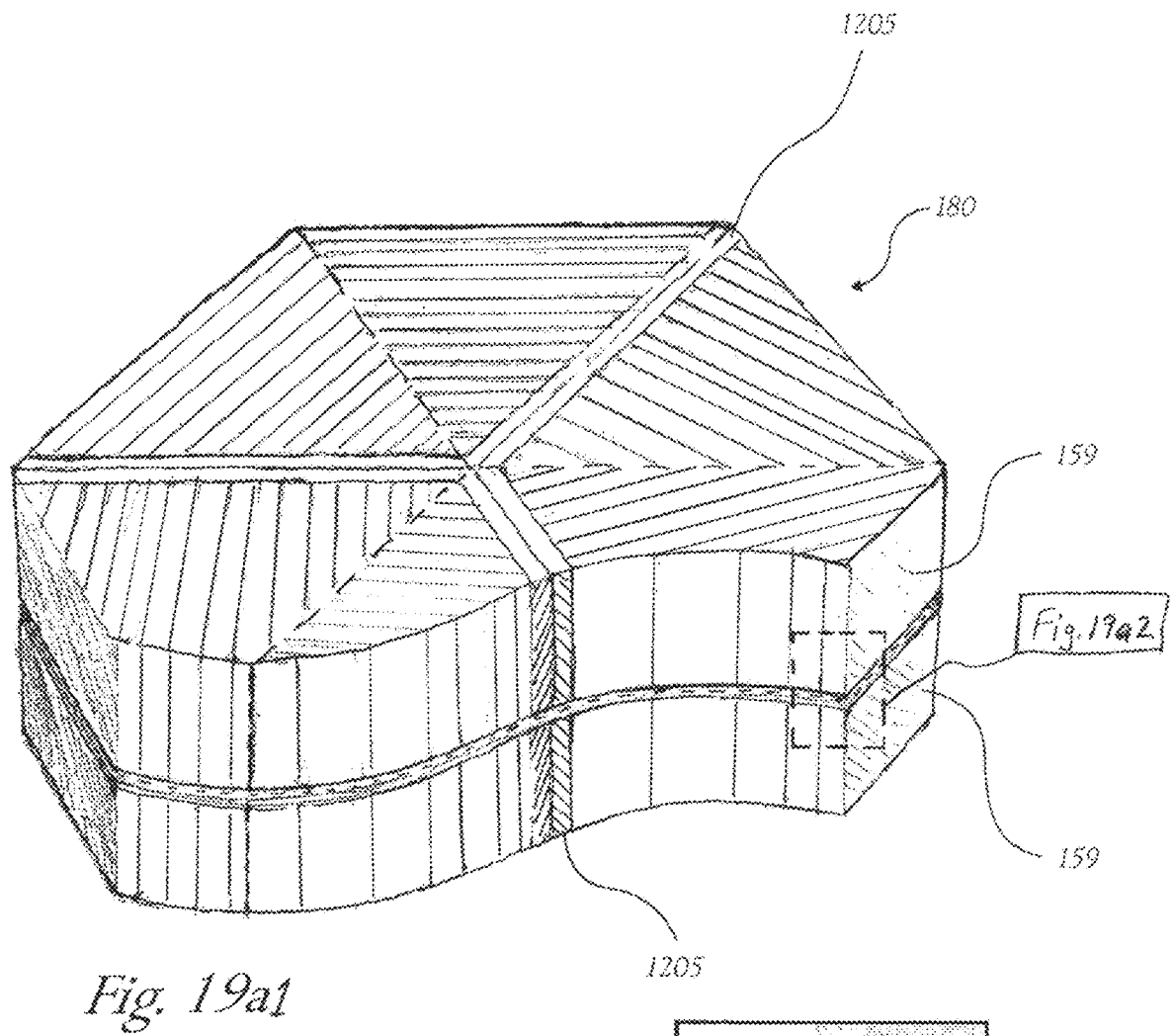
Fig. 19a1
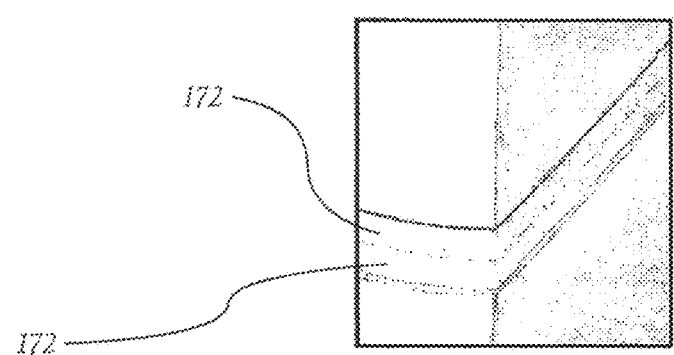
Fig. 19a2

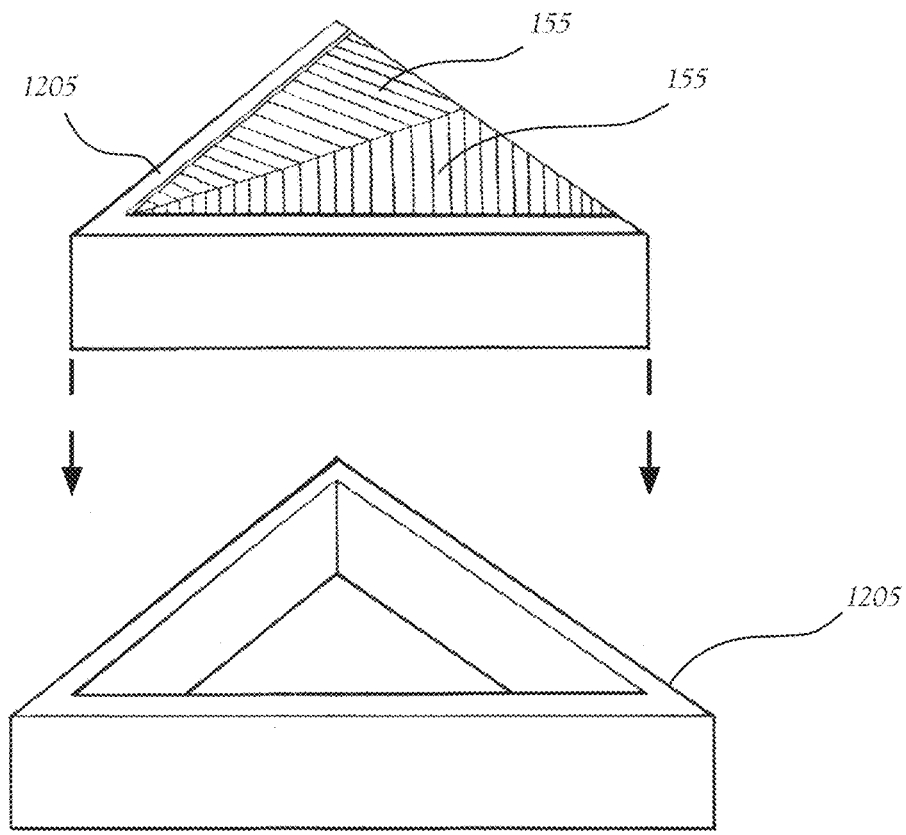
*Fig. 23e1*
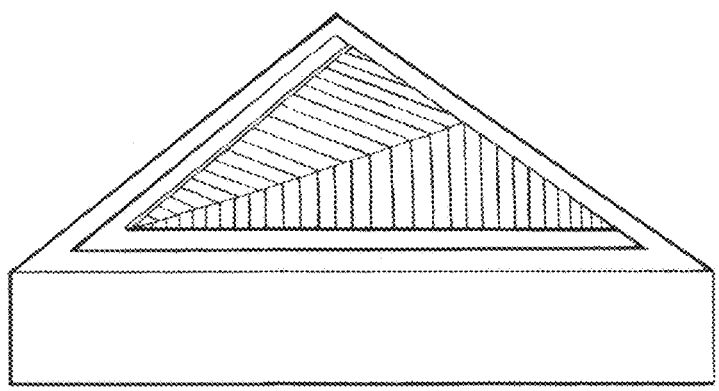
*Fig. 23e2*

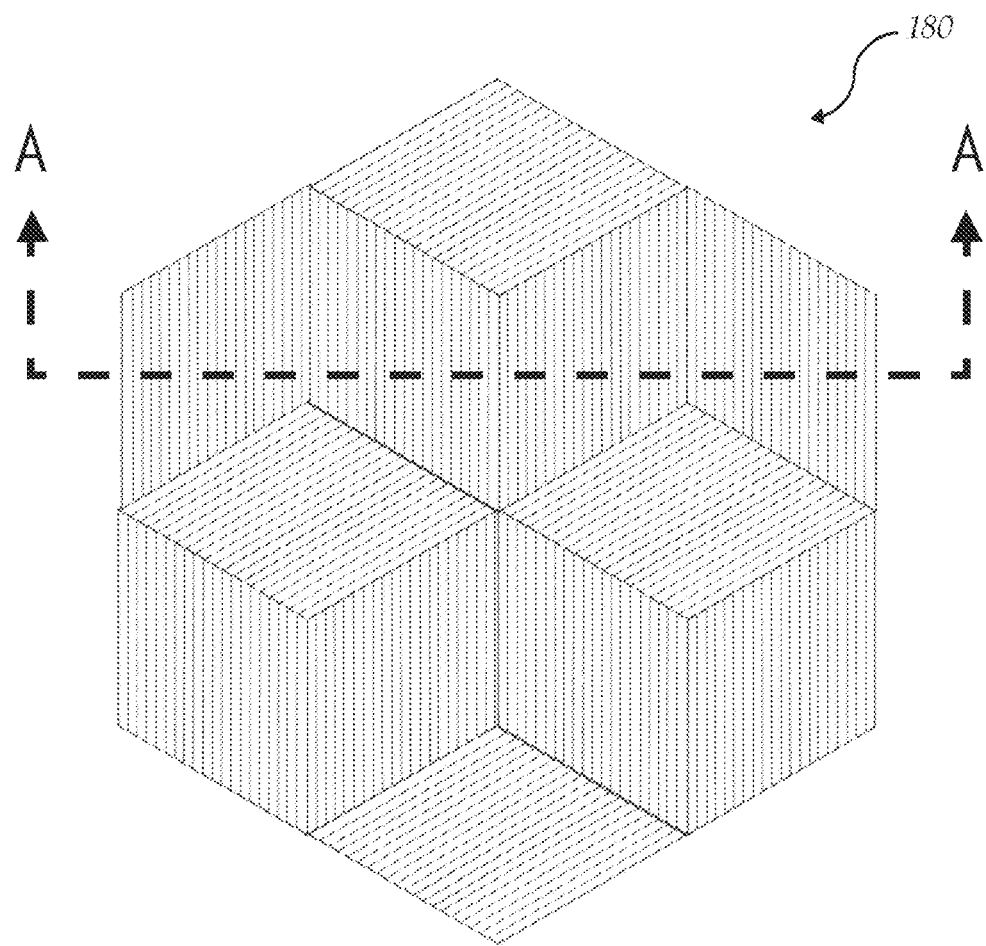
Fig. 25e1
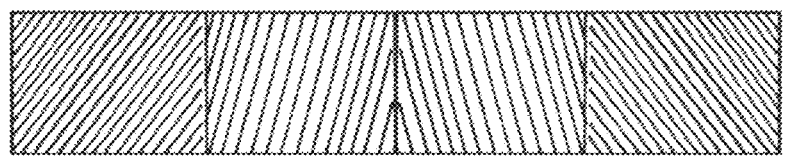
Fig. 25e2

TRANSLUCENT BUILDING MATERIAL

CROSS-REFERENCE TO RELATED APPLICATIONS

This application is a continuation of U.S. patent application Ser. No. 15/358,290 filed on Nov. 22, 2016, which is a divisional of U.S. patent application Ser. No. 14/063,490, filed on Oct. 25, 2013, now U.S. Pat. No. 9,796,153, which is a divisional of U.S. patent application Ser. No. 12/896,334, filed Oct. 1, 2010, now U.S. Pat. No. 8,597,455, which claims priority to and the benefit of U.S. Provisional Patent Application Ser. No. 61/278,181, filed on Oct. 2, 2009, and U.S. Provisional Patent Application Ser. No. 61/353,494, filed on Jun. 10, 2010 the disclosure of each of these applications is hereby incorporated by reference in its entirety.

FIELD OF THE INVENTION

This invention relates generally to processing corrugated cardboard to form a translucent, decorative, structural material.

BACKGROUND

Ever-growing landfills present a major environmental concern. A high demand exists for technologies that reduce accumulation of waste by using waste material to create useful and functional objects. Accordingly, the recycling industry is one of the fastest growing industries today. About 35 percent of waste deposited in landfills consists of paper and paperboard products. In an attempt to reduce this accumulation of waste, a major effort in the printing industry centers on the collection and recycling of paper and paper products. U.S. Pat. No. 5,265,561 to Crawford and U.S. Pat. No. 5,749,998 to Skinner, the disclosures of which are incorporated by reference, are two examples of patents that address the issue of accumulating waste. In particular, Skinner describes the potential in the strength of corrugated cardboard, by creating a thick corrugated web that may be used in the shipping industry and as a structural component. Crawford describes absorbent qualities of cardboard in an industrial application of waste clean-up. Crawford also addresses waste disposal problems, acknowledging that wood pallets and cardboard are deposited and accumulated in landfills at an alarming rate.

Although existing technologies utilize some of the qualities of corrugated cardboard, it has been discovered that there is a need for methods and products that utilize the aesthetic qualities of corrugated cardboard in combination with its structural features to expand recycling possibilities, as described below.

SUMMARY

Embodiments of the present invention include a manufacturing process for and related products constituted of translucent material formed from corrugated cardboard, such as used or scrap corrugated cardboard. The cardboard may be collected locally, e.g., house to house and/or from local businesses. Although the final product may be produced by using new or used cardboard, the use of old corrugated cardboard has the additional benefit of providing a new method for recycling old corrugated cardboard.

The translucent material disclosed herein may be used to cover or configure a surface by tiling. Because of its translucent qualities, such material is suitable for numerous applications. For example, the material may be used as a component in a lighting installation or as an element in interior decoration and furniture industries. Exemplary products that may be formed from such translucent material include furniture, lamps, lighting displays, decorative wall panels, and floor or ceiling tiles. The translucent material may also be used to make building components, and even buildings. In particular, an appropriately configured tile may be included inside different building blocks as an internal component providing great strength in relation to its weight, while also functioning as a vapor control layer and or an air control layer in multifunctional building materials.

In an embodiment of the invention, a method allows the utilization of one or more of a number of properties of cardboard, such as flexibility, rigidity, absorption, and translucency. The finished tiled surface not only has a structural function but may also provide aesthetic benefits, such as a visually pleasing appearance and translucency. The tile design disclosed herein is typically based on proportions, and may thus be independent of measurement units. Therefore, a plurality of tiles may coordinate with each other in the same way, whether in small-scale structures, e.g., lamps, or in large-scale structures, e.g., architectural features.

In an aspect, an embodiment of the invention includes a process for manufacturing a translucent building material including corrugated cardboard. The process includes the steps of providing a plurality of corrugated cardboard pieces, the cardboard pieces including flutes, holding together the corrugated cardboard pieces to define a rough block, saturating the rough block with an impregnating agent to form a working block, machining the working block to define a finished block having a cross-section with a precise geometric shape, and slicing the finished block at a predetermined angle to a direction of the flutes into slices having a consistent thickness to define a plurality of tile components. The working block, the finished block, and/or the tile components may be manufactured according to the process described above.

One or more of the following features may be included. The holding step may include adhering the corrugated cardboard pieces together with an adhesive. The adhesive and the impregnating agent may include a common material, and the common material may include a plasticizer. The impregnating agent may be a penetrating sealer, such as a two-part epoxy, polyaspartic polyurea, silicates, siliconates, plant-based resins, and/or combinations thereof. The impregating agent may include a flame retardant. The step of providing the plurality of corrugated cardboard pieces may include cutting corrugated cardboard sheets into uniform strips. The saturating step may be performed under a partial vacuum. The process may include adhering a rigidifying component to at least one of the plurality of corrugated cardboard pieces. The precise geometric shape may be a triangle, a square, a rectangle, a trapezoid, a pentagon, a hexagon, a circle and portions and combinations thereof. Flutes or undulations of the plurality of corrugated cardboard pieces may be aligned in a common direction. The direction of the flutes may define a light path through each tile component.

The process may further include the steps of: (i) providing a coating material in a mold; (ii) placing a corrugated component into the coating material, the corrugated component including at least one of the plurality of tile components; and (iii) curing the coating material to create an outer layer component having a texture. The process may also include adhering at least a portion of the plurality of tile components together to define a geometric pattern. The curing step may include removing the corrugated component with the cured coating material from the mold, thereby creating a translucent tile. The translucent tile may be manufactured according to this process. The corrugated component may include a single tile component. The coating material may be a thermosetting acrylic, thermosetting epoxy, polyamide, photocurable acrylic, polyaspartic polyurea, and/or combinations thereof. The thermosetting epoxy may be a one-part epoxy and/or a two-part epoxy. The first part of the two-part epoxy may include a resin and the second part of the two-part epoxy may include a hardener. The resin may include a bisphenol-A based epoxy resin. The first part of the two-part epoxy may include benzyl alcohol, bisphenol-F type epoxy resin, and ethylene glycol monobutyl ether. The hardener may include a modified polyamine. The modified polyamine may include polyoxypropylenediamine, reaction products of isophorone diamine with phenol/formaldehyde, isophoronediamine, reaction products of benzene-1,3-dimethanamine with hydroxybenzene and formaldehyde, hydroxybenzene, and/or m-Xylene diamine. The coating material may include a polyamide, and the coating material may also have an additive of one or more heat stabilizers, light stabilizers, lubricants, plasticizers, pigments, nucleating agents, flame retardants, and/or reinforcing fillers. The thermosetting epoxy may be a laminating epoxy and/or a surface-coating epoxy. The coating material may have a high percentage of solids, e.g., the percentage of solids may be up to about 100%. The coating material may have a high glass transition temperature $T_g$. For example, the glass transition temperature $T_g$ may be at least 115° C. The outer layer component may be substantially water-impermeable.

The process may further include the steps of forming a plurality of translucent tiles, and arranging the plurality of translucent tiles to define a surface. The surface may be a floor, a wall, a roof, a lighting installation, an architectural construction element, an architectural aesthetic element, and/or a solar panel. A working block may be manufactured according to the process. The working block, finished block, and/or translucent tile may be manufactured in accordance with some or all of the process steps described above.

The description of elements of the embodiments of other aspects of the invention may be applied to this aspect of the invention as well.

In another aspect, embodiments of the invention include a translucent tile having a plurality of pieces of corrugated cardboard at least partially saturated by an impregnating agent. Ends of the corrugated cardboard pieces may define a surface, cross-sections of flutes disposed in the corrugated cardboard pieces may intersect the surface such that the tile is translucent, and a transparent outer layer component may be disposed proximate the surface.

One or more of the following features may be included. The surface may be substantially planar. A rigidifying component may be disposed perpendicularly to the surface of the tile. The transparent outer layer component may include a coating material having a polymer. The plurality of pieces of cardboard may be substantially saturated by the impregnating agent, and the transparent outer layer component may be substantially free of holes, such that the translucent tile is liquid-tight and/or water-impermeable.

The description of elements of the embodiments of other aspects of the invention may be applied to this aspect of the invention as well.

In yet another aspect, embodiments of the invention include a method for using translucent tile. The method includes the steps of providing a plurality of translucent tiles, each translucent tile incorporating (i) corrugated cardboard at least partially saturated with an impregnating agent, and (ii) a translucent outer layer component, and arranging the plurality of translucent tiles to define a surface. The surface may be a floor, a wall, a roof, a lighting installation, an architectural construction element, an architectural aesthetic element, and/or a solar panel.

The description of elements of the embodiments of other aspects of the invention may be applied to this aspect of the invention as well.

In still another aspect, embodiments of the invention include a translucent tile having a plurality of pieces of tubing at least partially coated by an impregnating agent, wherein (i) ends of the tubing pieces define a surface, and (ii) cross-sections of the tubing pieces intersect the surface such that the tile is translucent.

The description of elements of the embodiments of other aspects of the invention may be applied to this aspect of the invention as well.

In yet another aspect, embodiments of the invention include a process for manufacturing a translucent building material including corrugated cardboard. The process includes the steps of providing a plurality of uniform corrugated cardboard strips, the cardboard strips including flutes, holding together the cardboard strips to define a surface intersected by the flutes, placing the cardboard strips into a mold such that the surface is proximate the mold, saturating the cardboard strips with an impregnating agent, and curing the impregnating agent to create an outer layer component disposed proximate the surface. The translucent building material may be manufactured according to the process described above. The curing step may include trimming the translucent outer layer component to create a translucent tile.

The description of elements of the embodiments of other aspects of the invention may be applied to this aspect of the invention as well.

In still another aspect, embodiments of the invention include a process for manufacturing a translucent building material including corrugated cardboard. The process includes the steps of providing a plurality of corrugated cardboard pieces, the cardboard pieces including flutes, holding together the cardboard pieces to define a rough block, saturating the rough block with an impregnating agent to form a working block, and slicing the working block at a predetermined angle to a direction of the flutes into slices having a consistent thickness to define a plurality of tile components. In an embodiment, the plurality of corrugated cardboard pieces includes uniform strips of cardboard.

Figure 1:
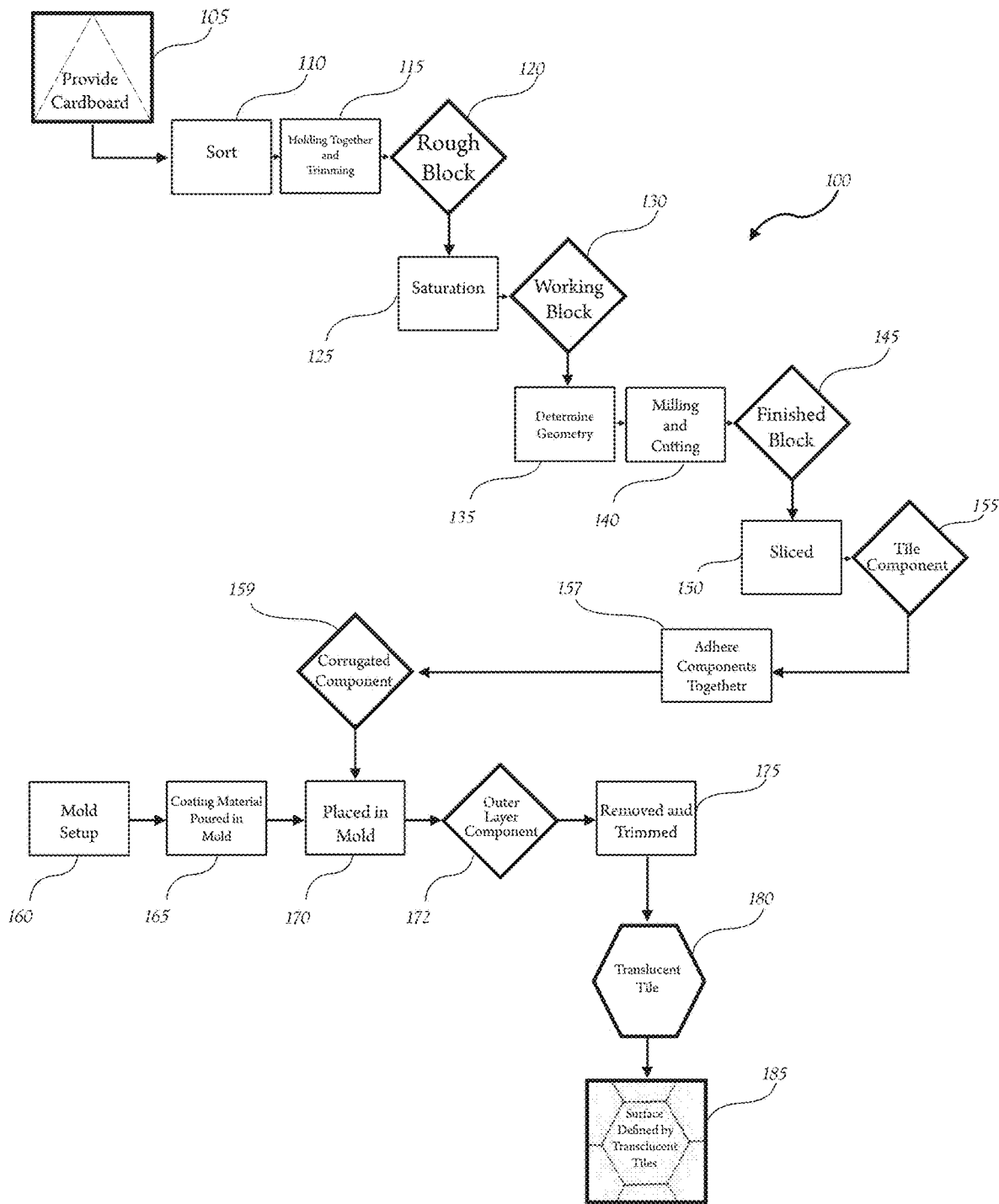
FIG. 1 is a flow chart illustrating a method in accordance with an embodiment of the invention.
Figure 2:
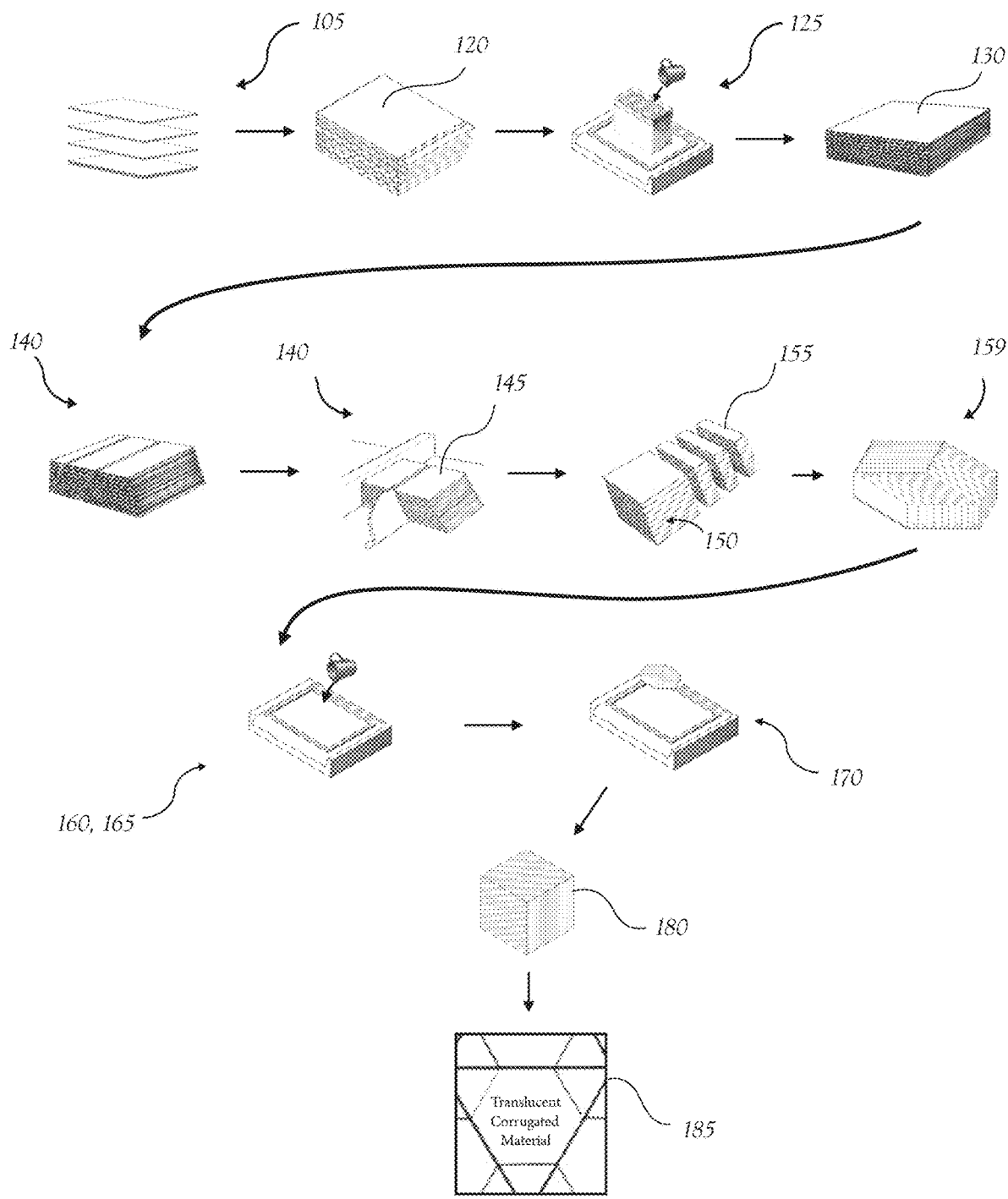
FIG. 2 is a schematic diagram illustrating the method of FIG. 1.
Figure 4A:
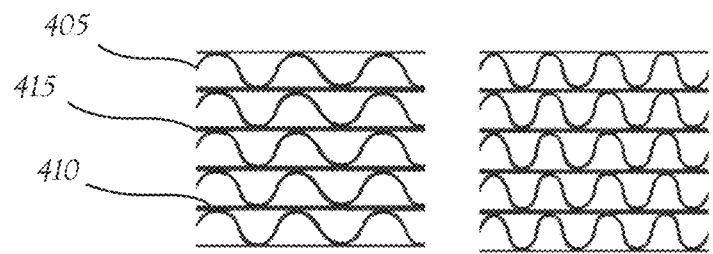
FIGS. 4a and 4b are schematic views of cross-sections of different flute patterns arranged in accordance with embodiments of the invention, with FIG. 4a depicting cardboard pieces with similar flute patterns stacked together and FIG.
Figure 4B:
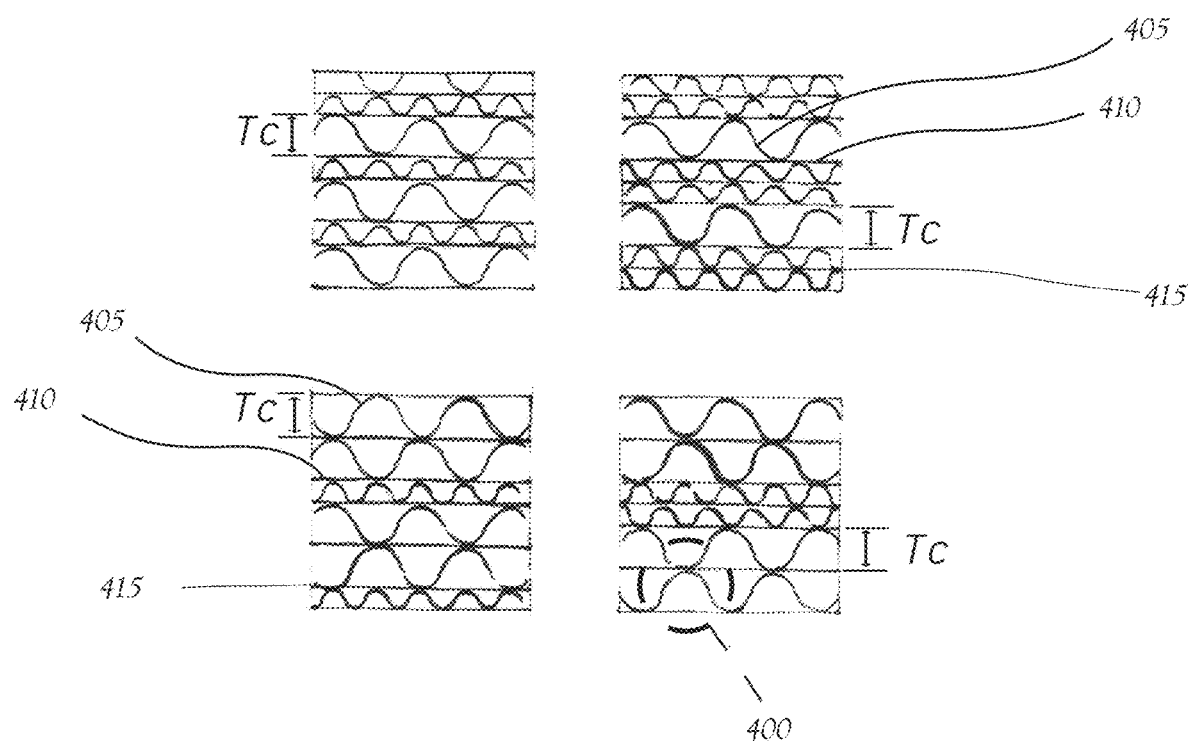
Figure 4C:
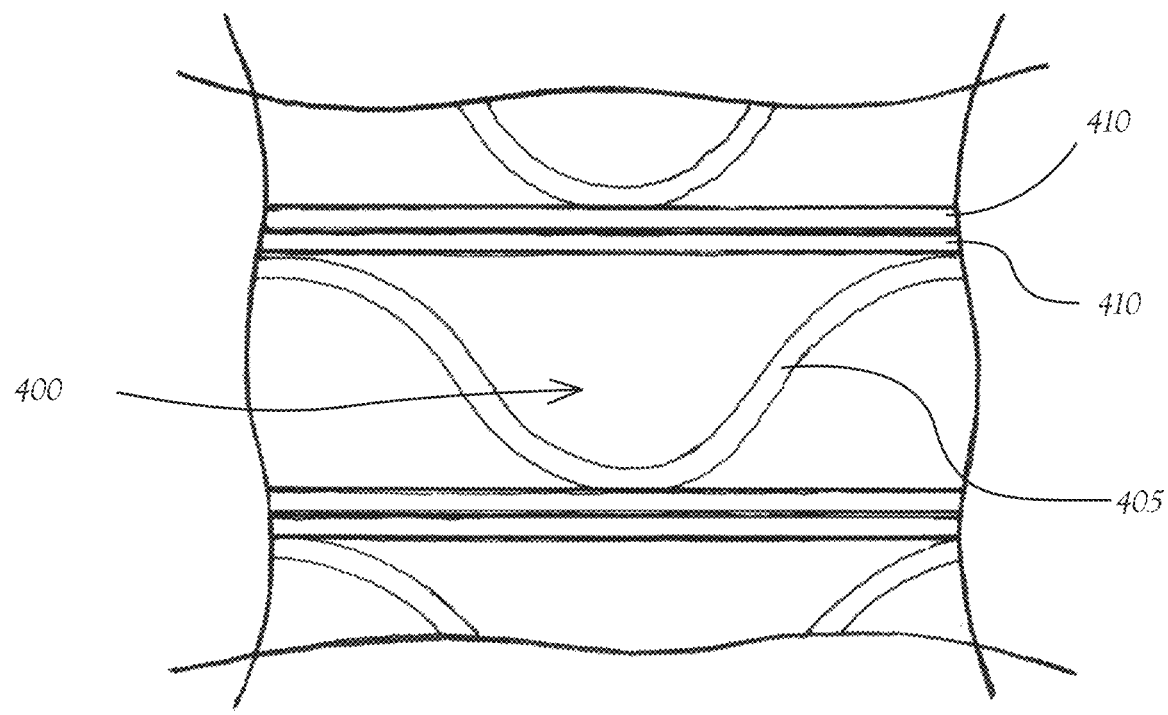
Figure 5A:
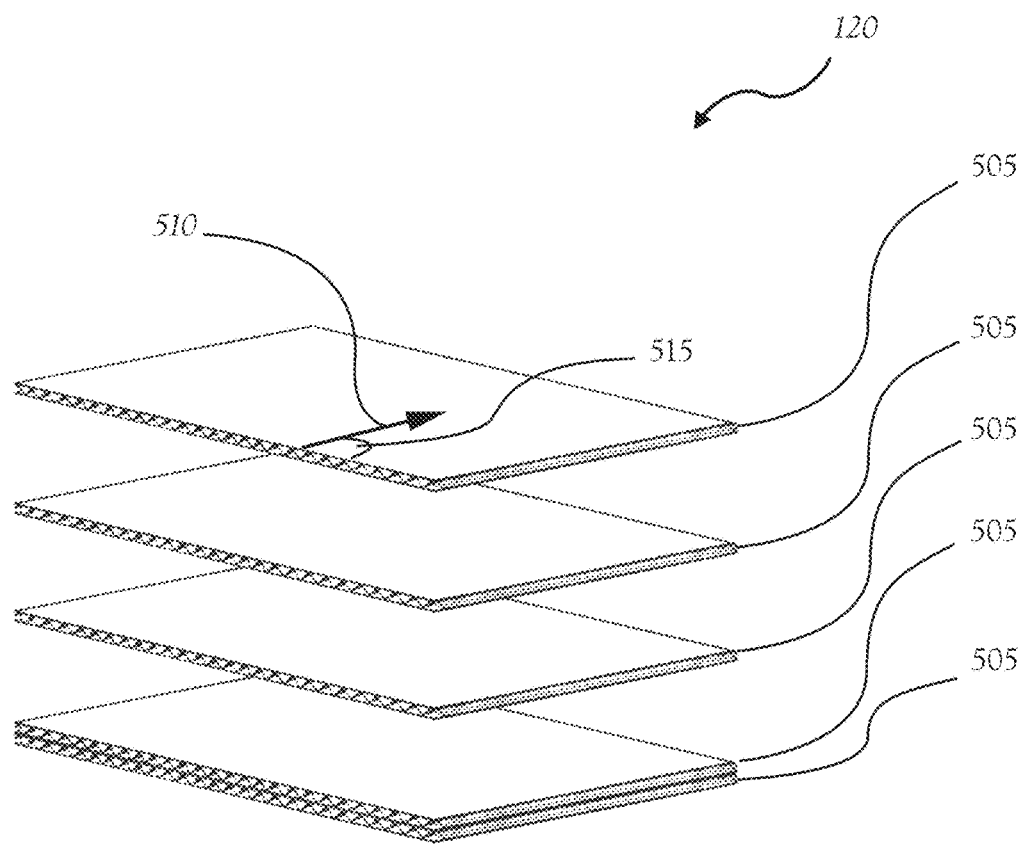
Figure 5B:
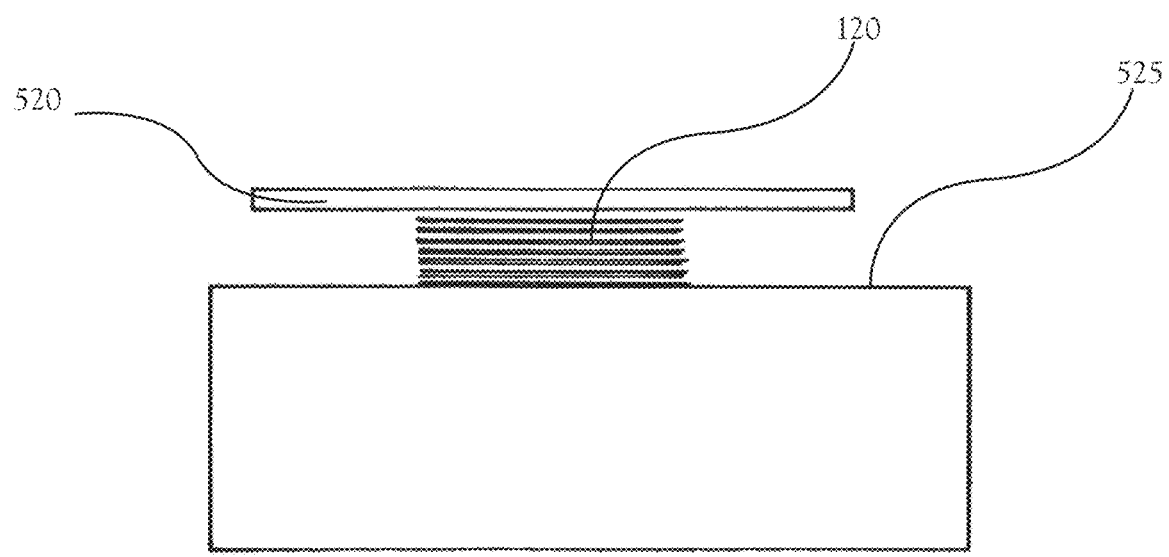
Figure 5C:
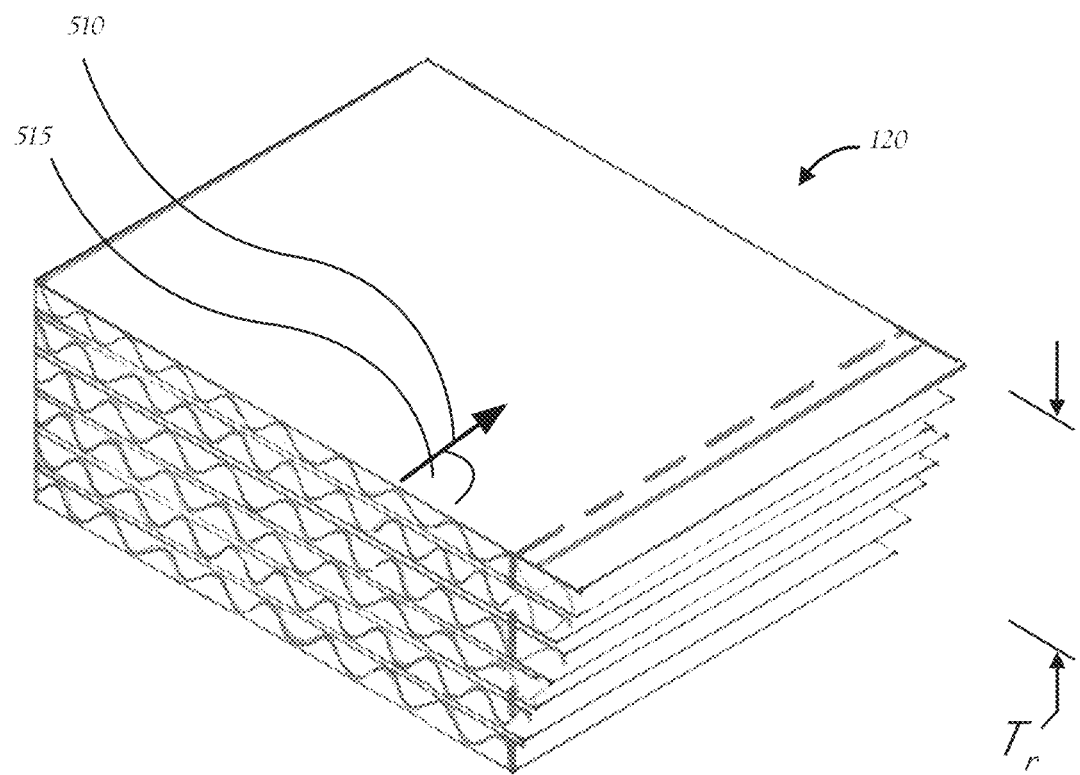
Figure 6A:
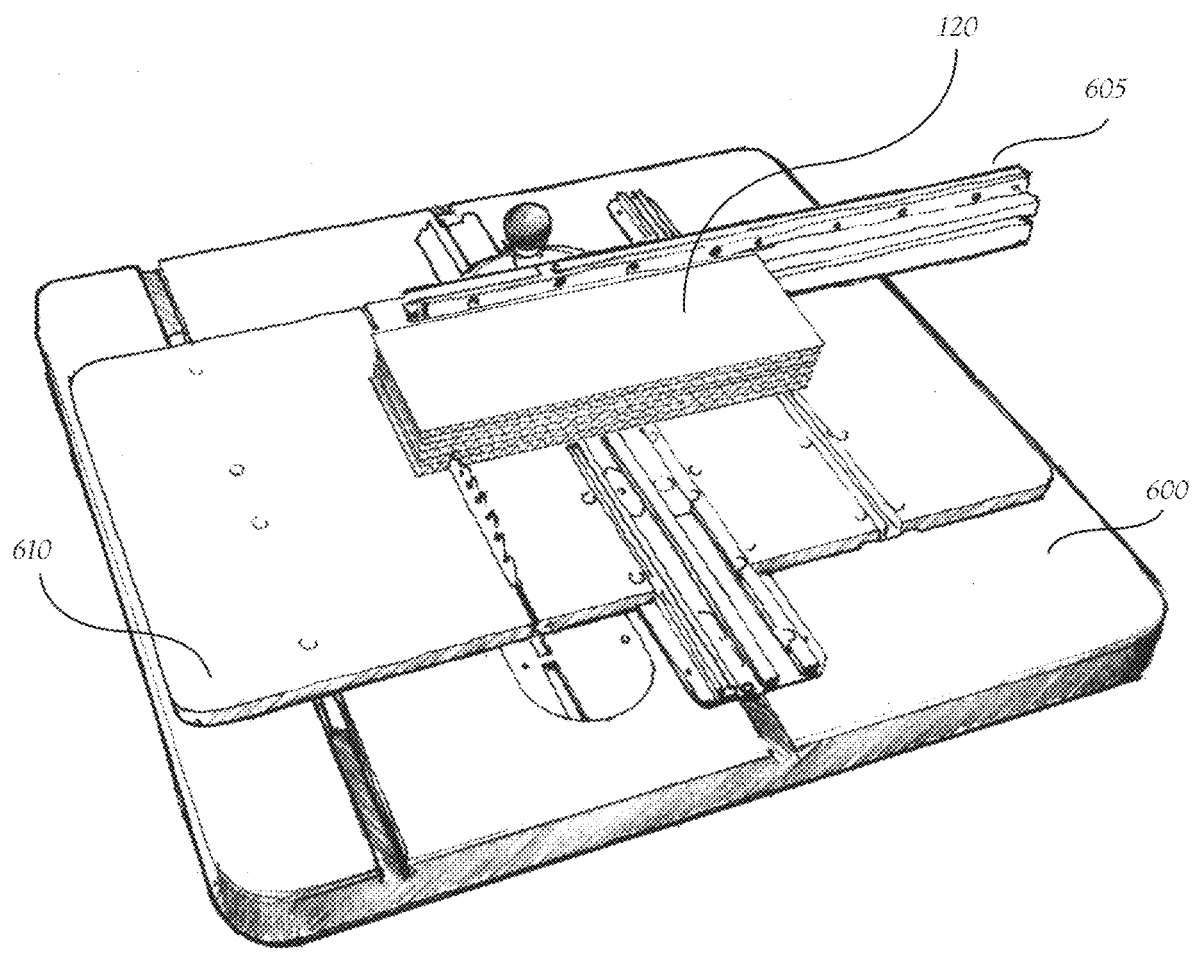
Figure 6B:
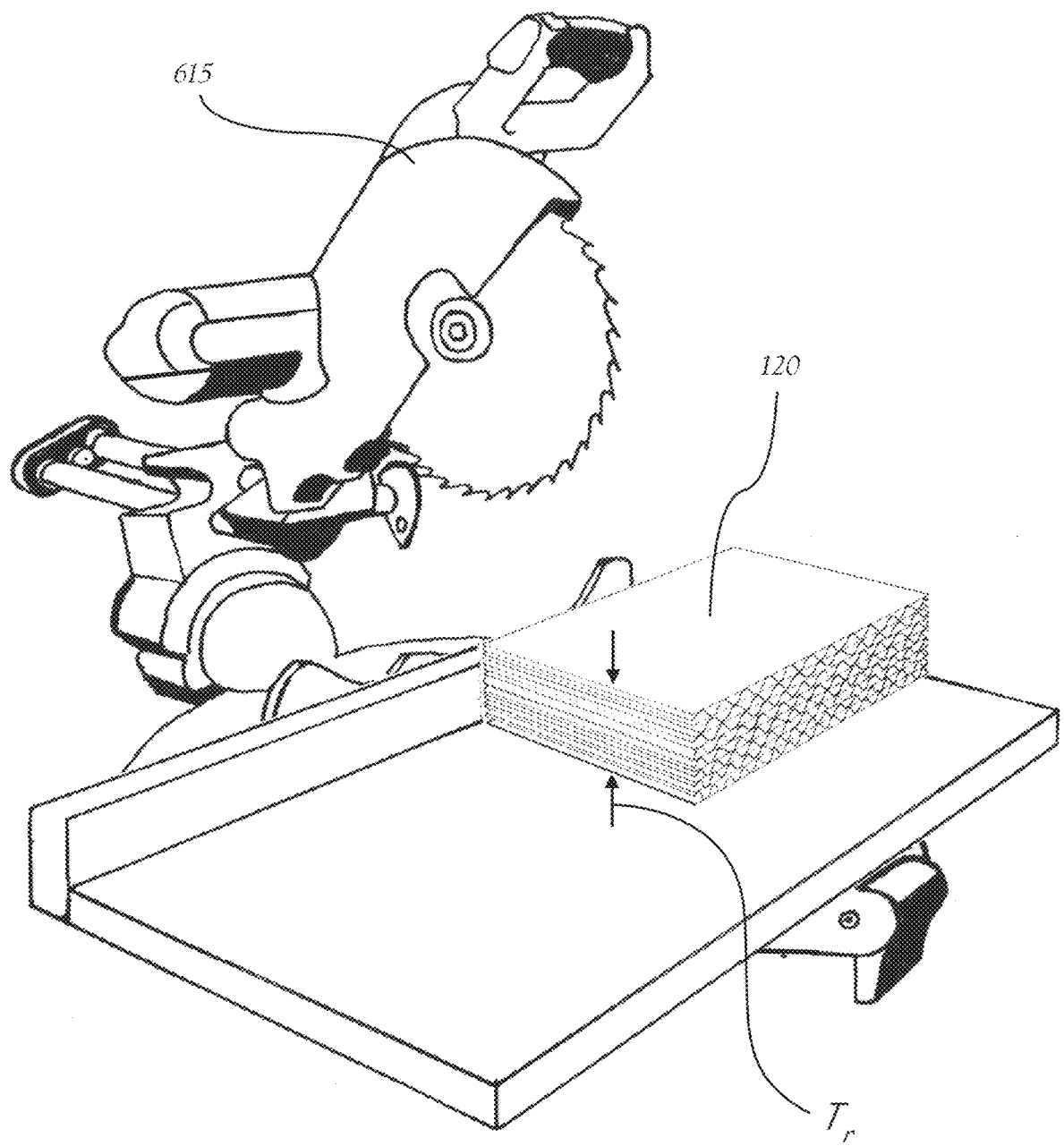
Figure 7:
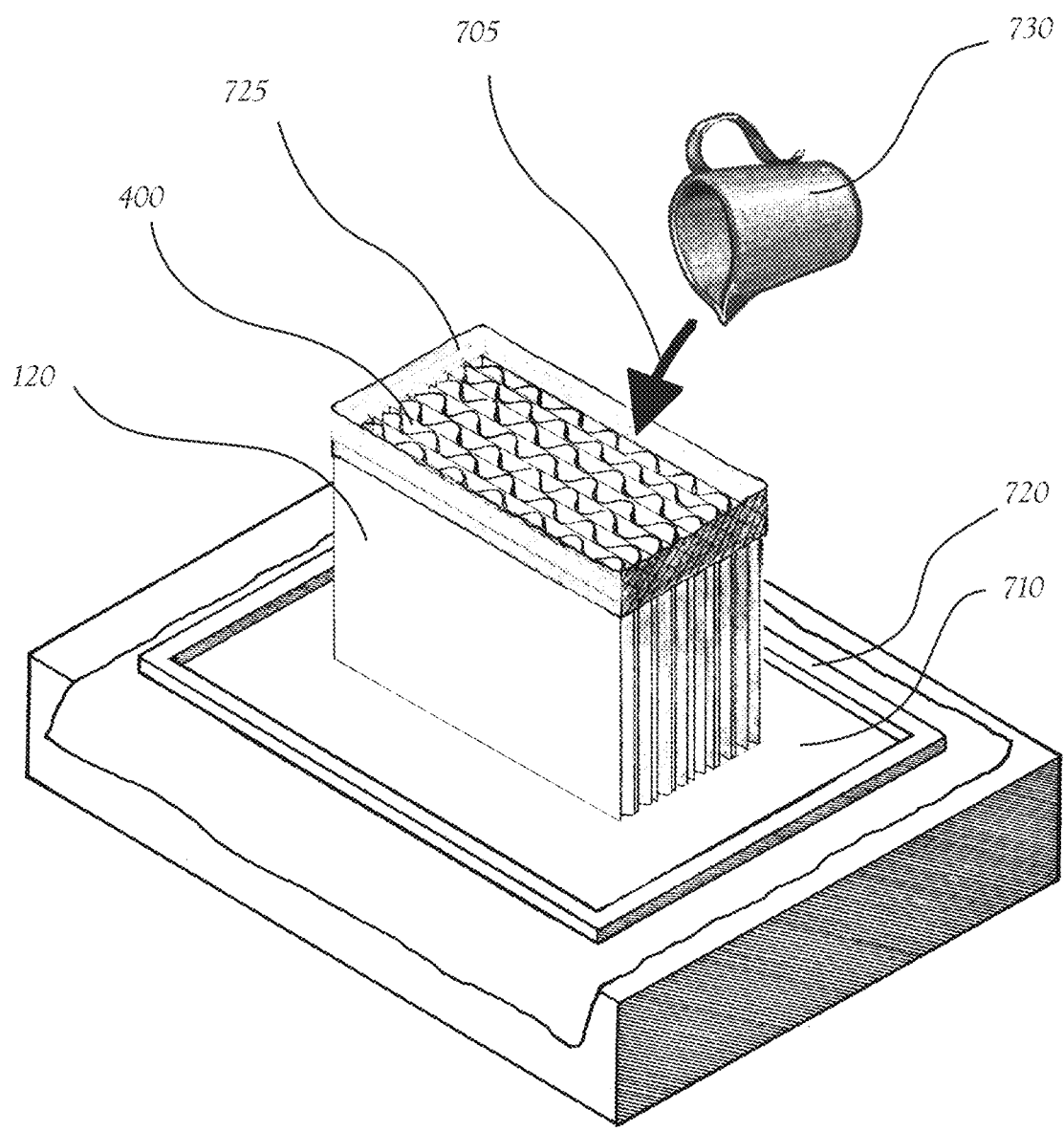
Figure 8A:
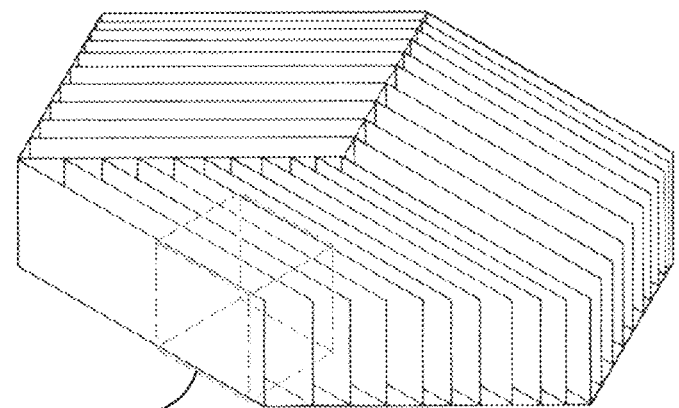
Figure 8B:
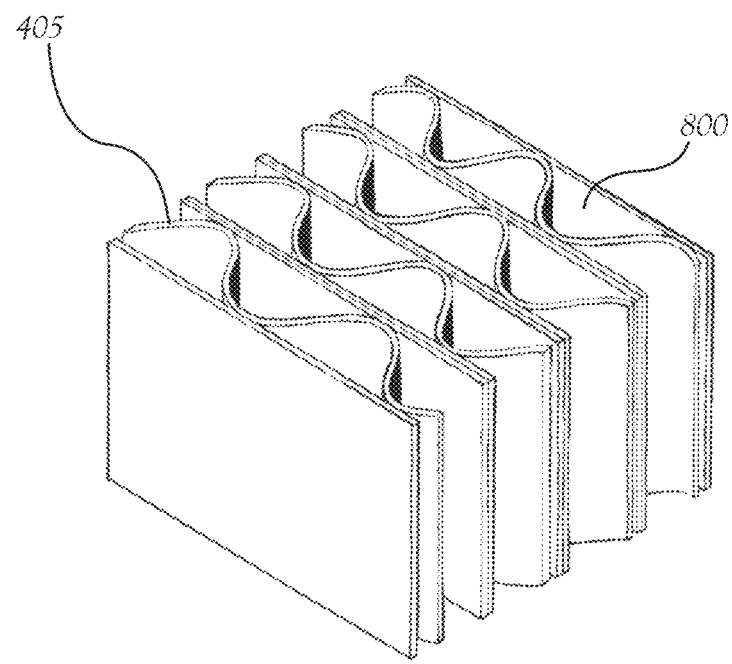
Figure 9:
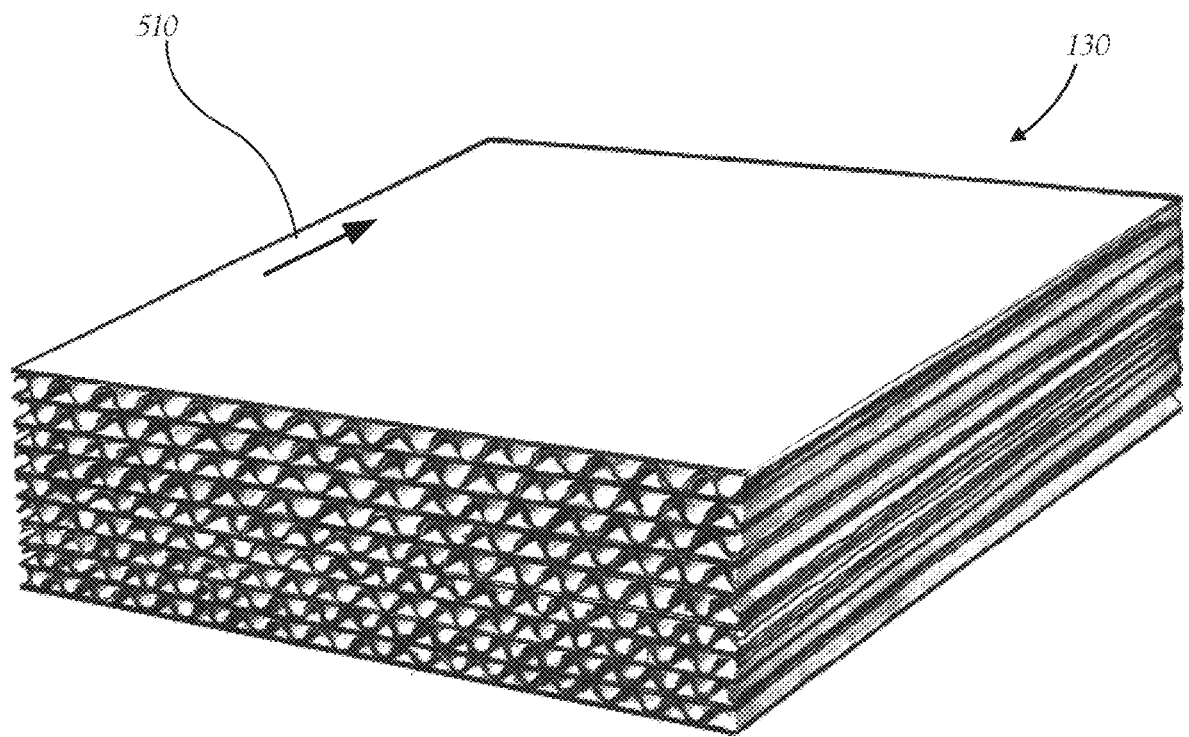
Figure 10A:
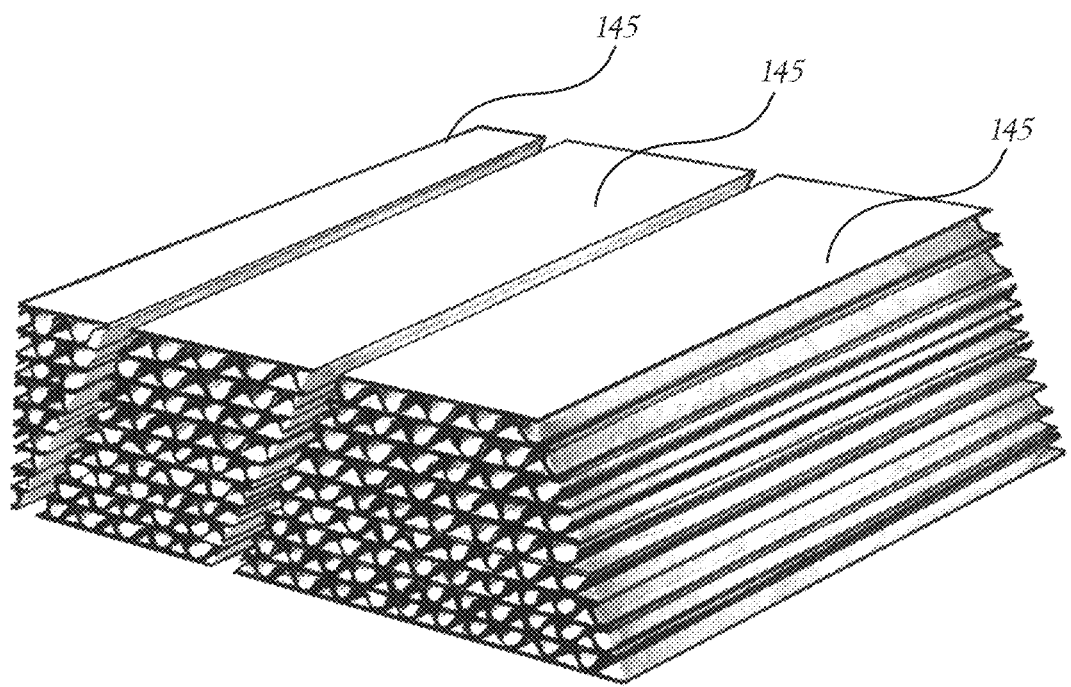
Figure 10B:
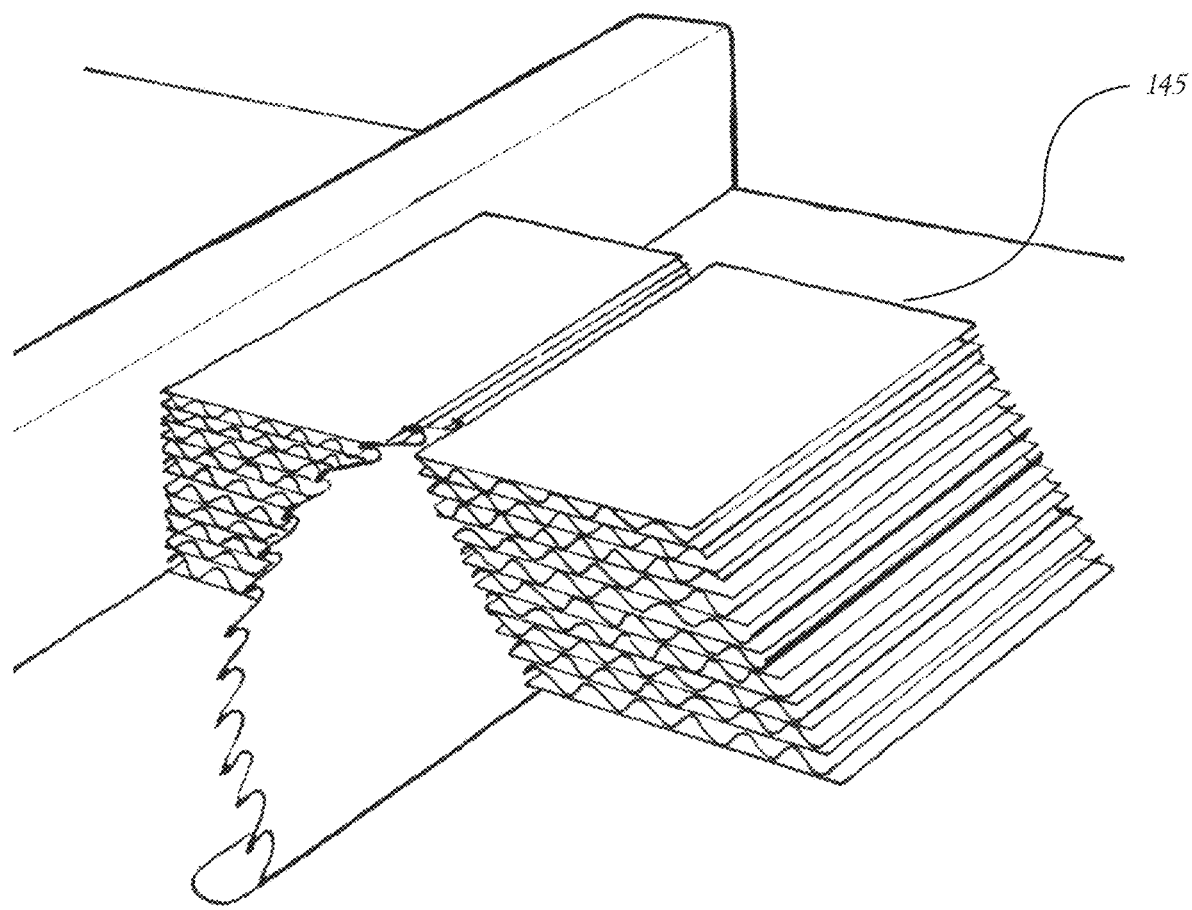
Figure 10C:
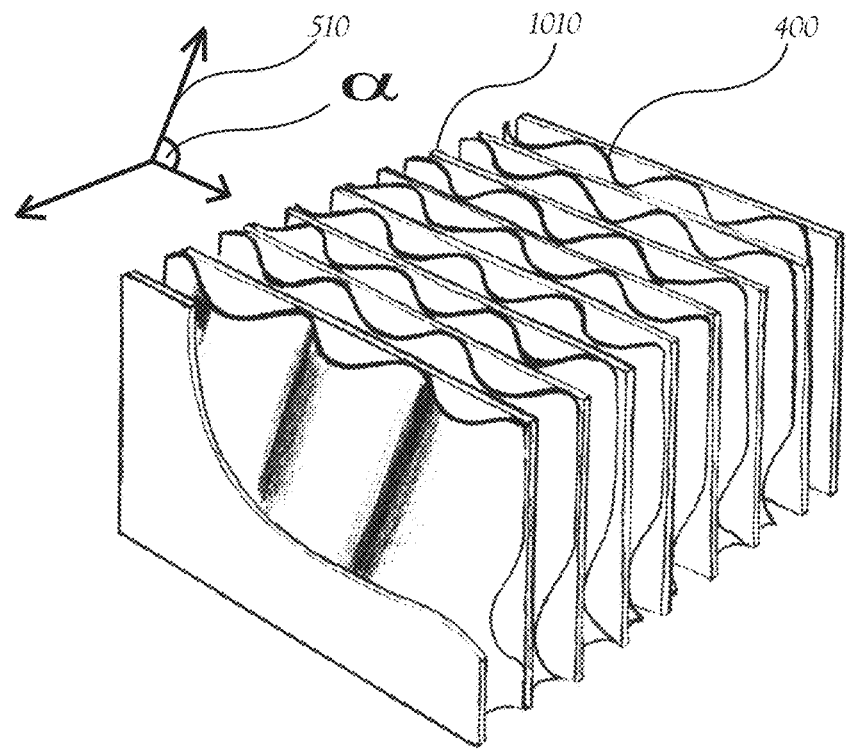
Figure 10D:
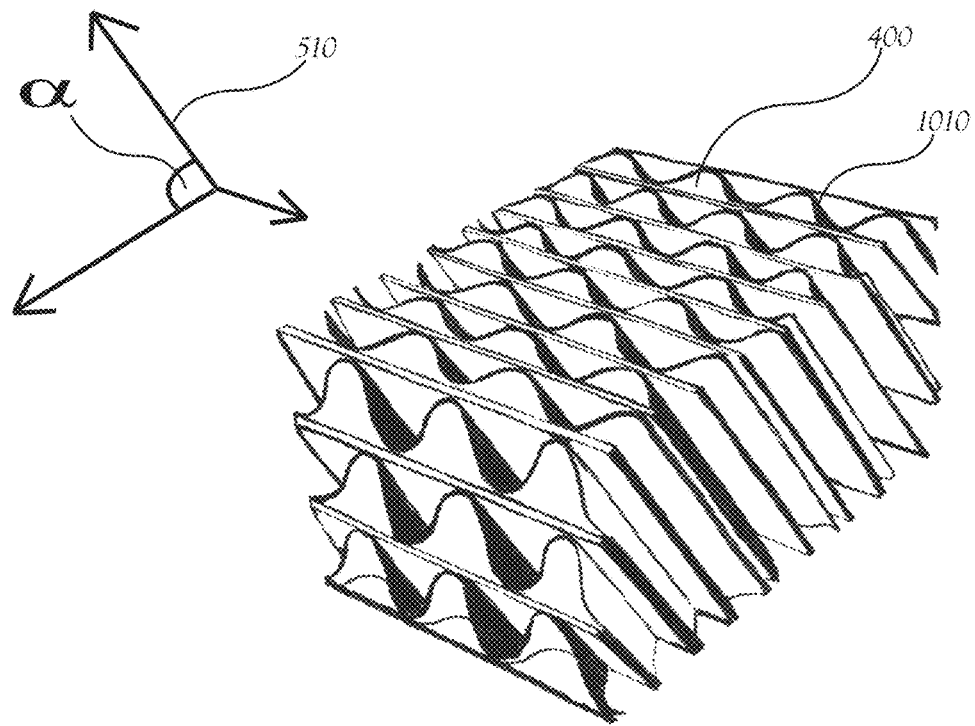
Figure 11A:
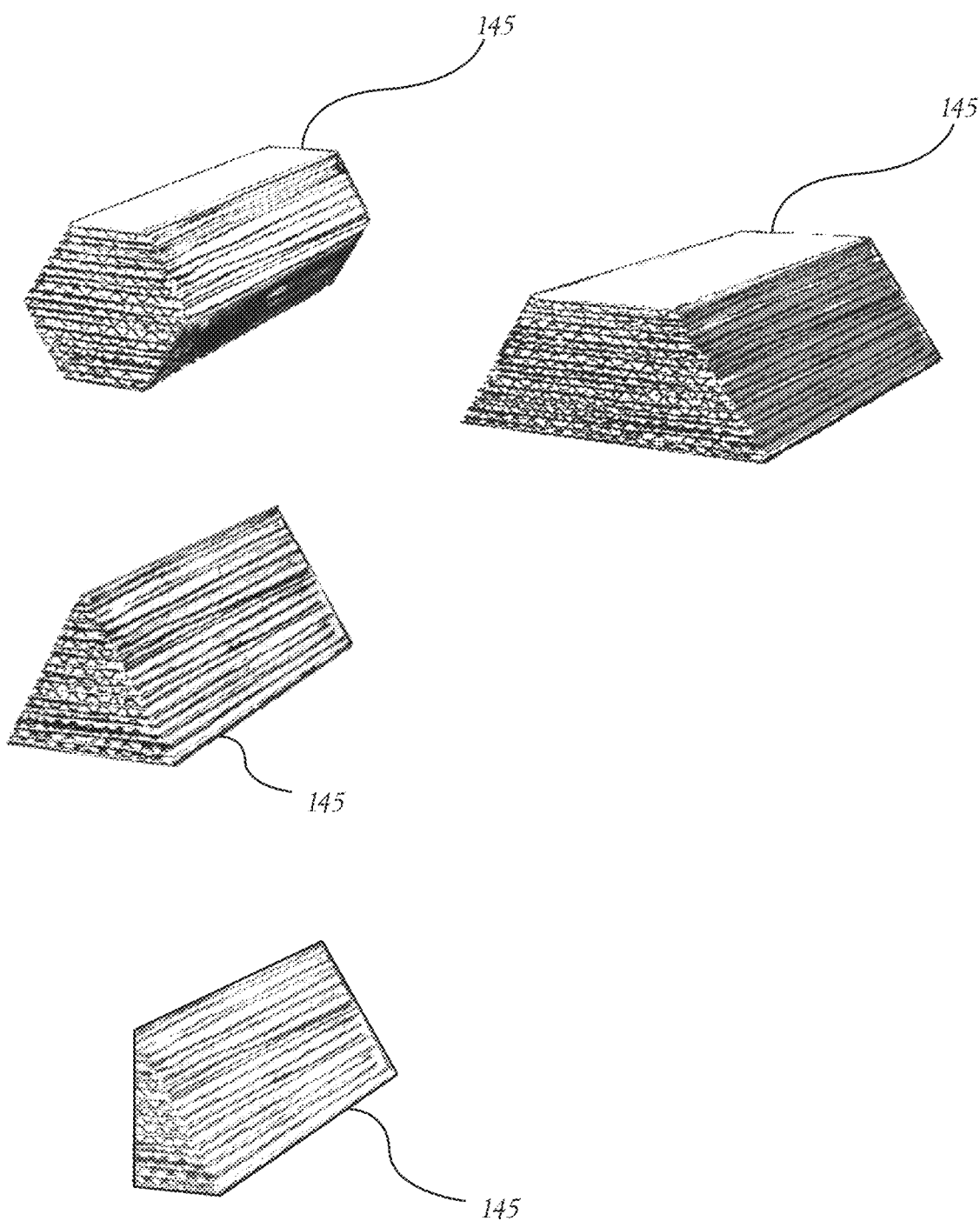
Figure 11B:
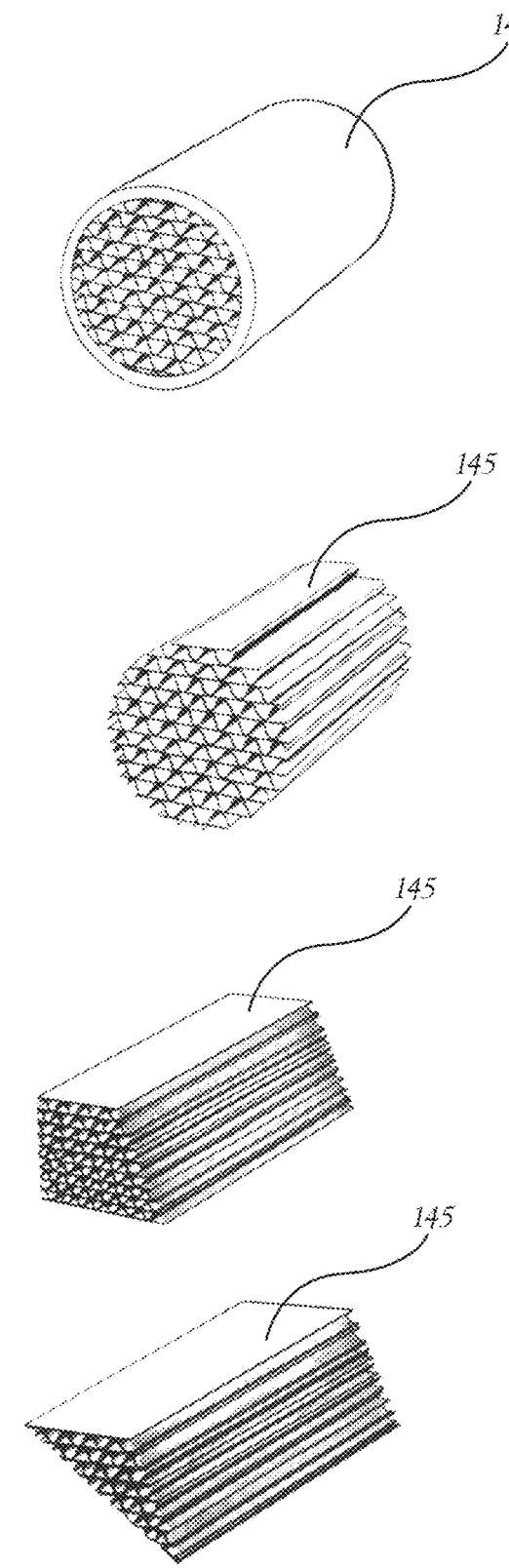
Figure 12A:
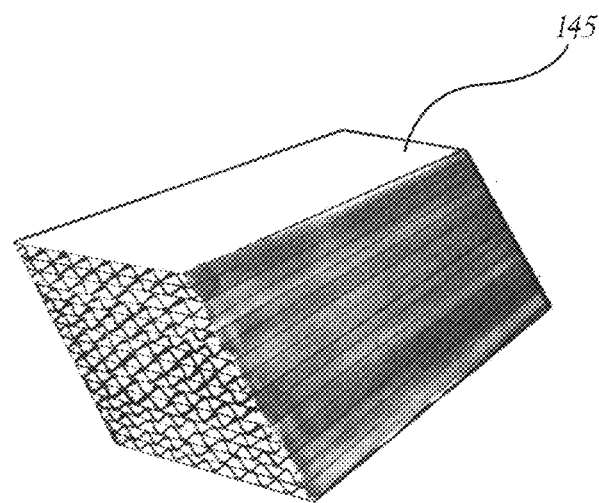
Figure 12B:
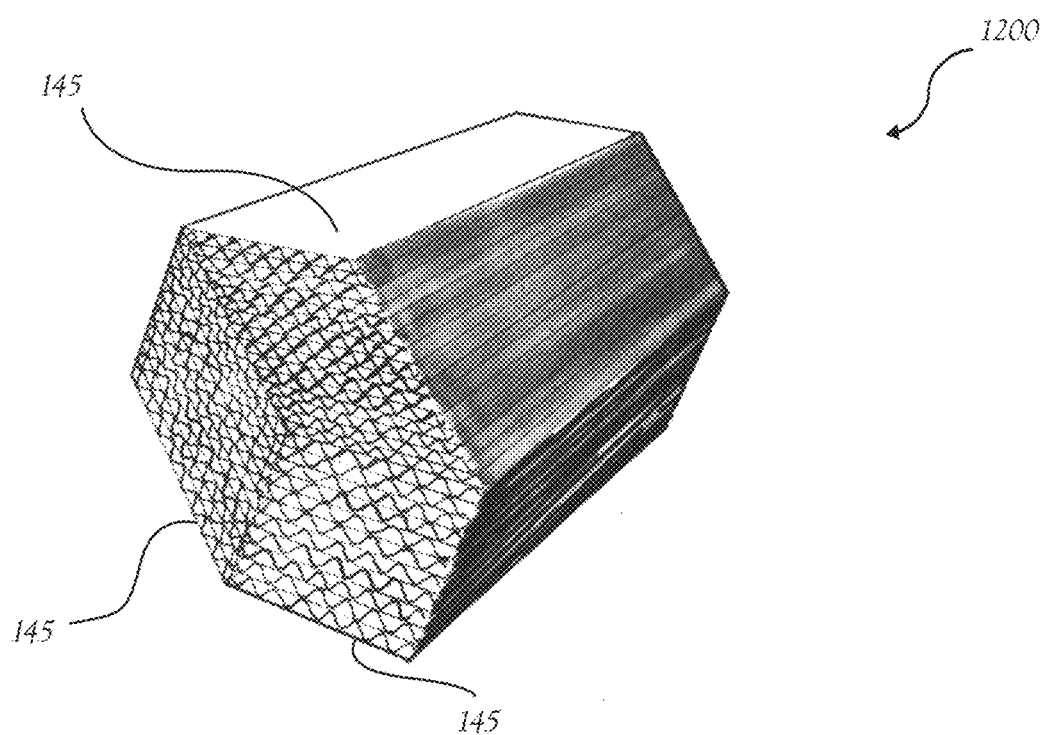
Figure 12F:
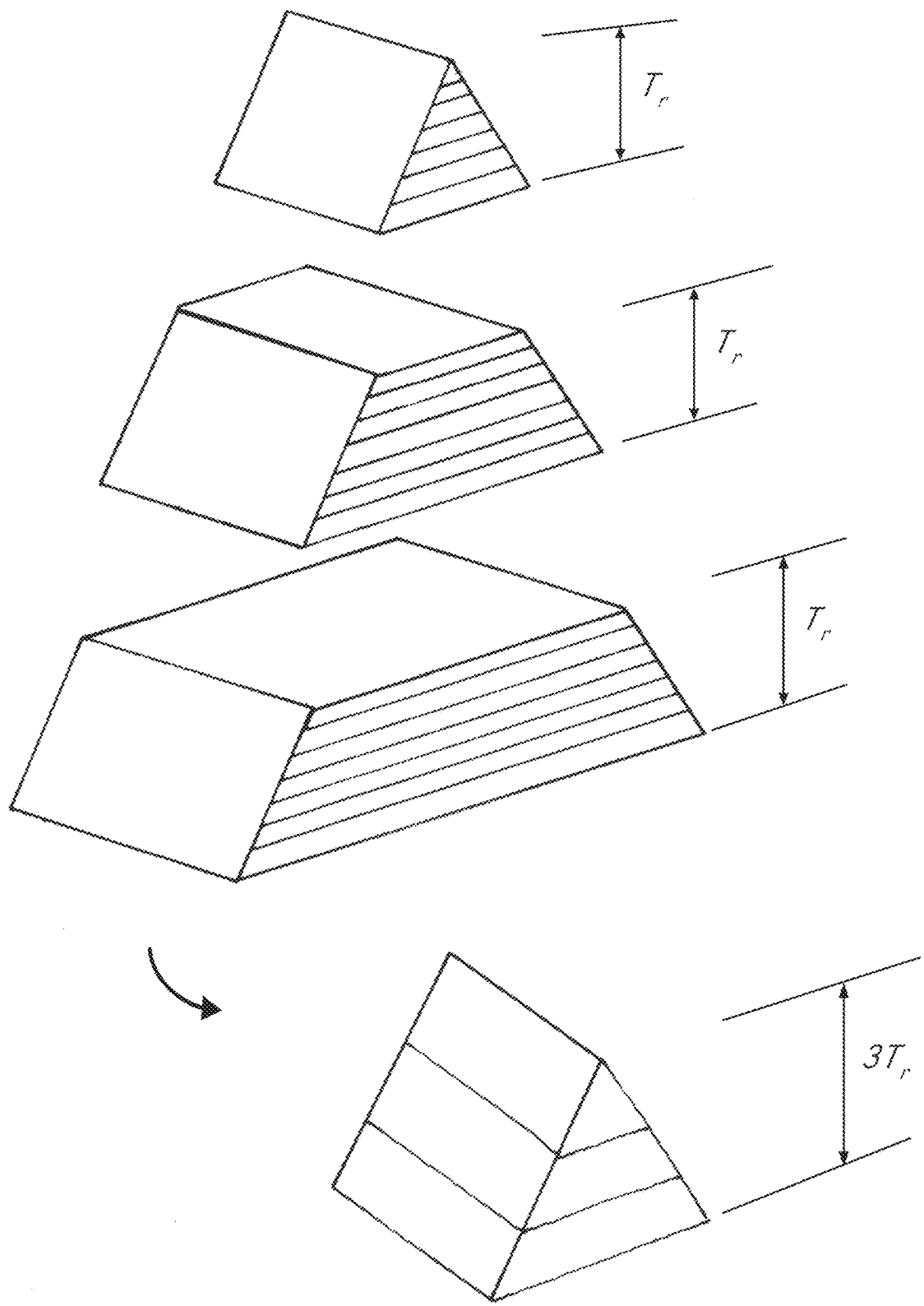
Figure 13:
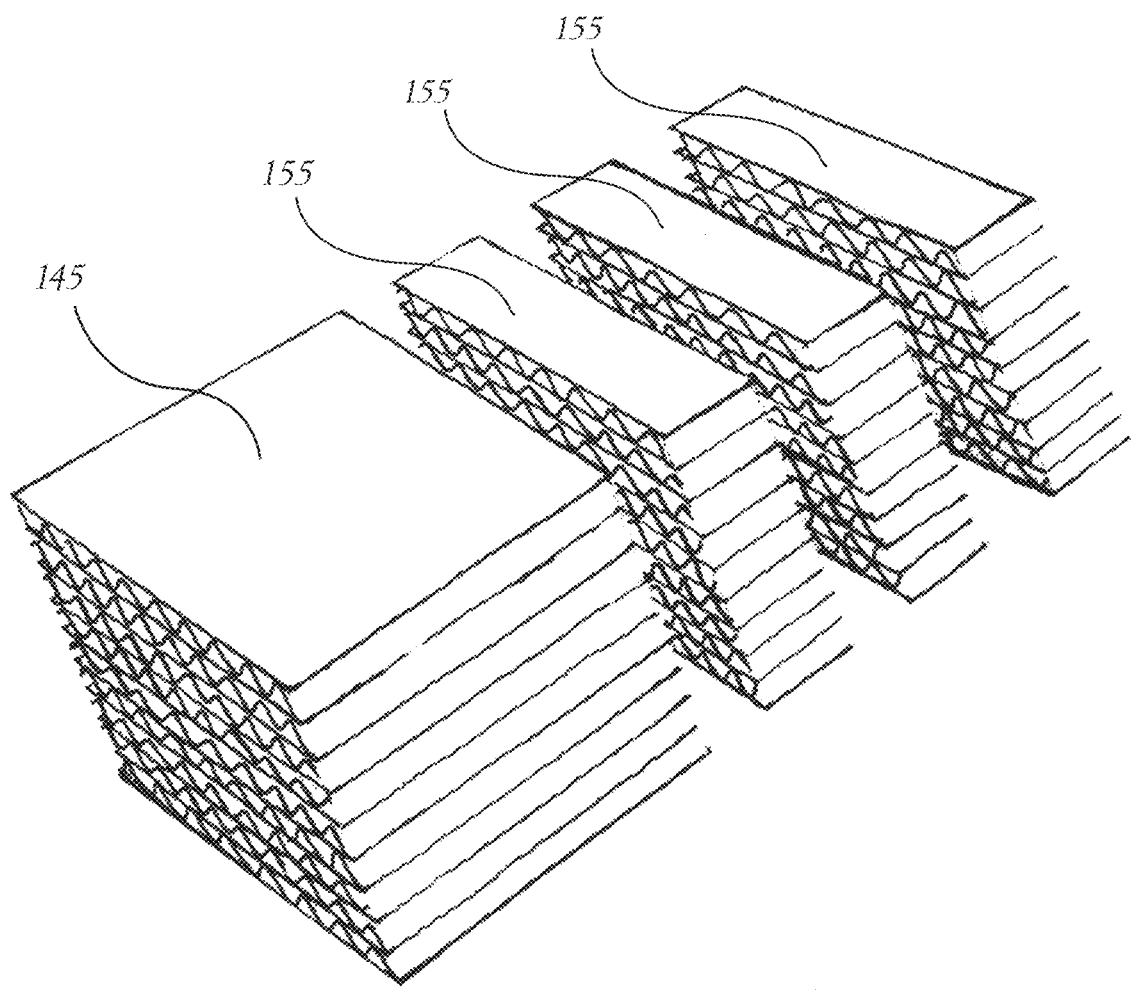
Figure 14A:
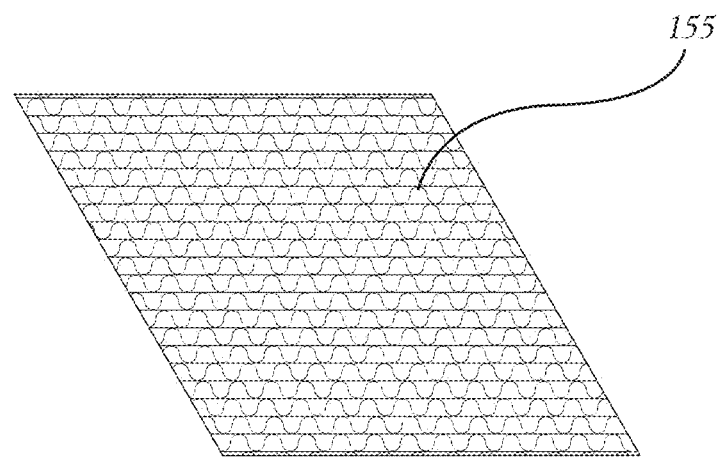
Figure 14B:
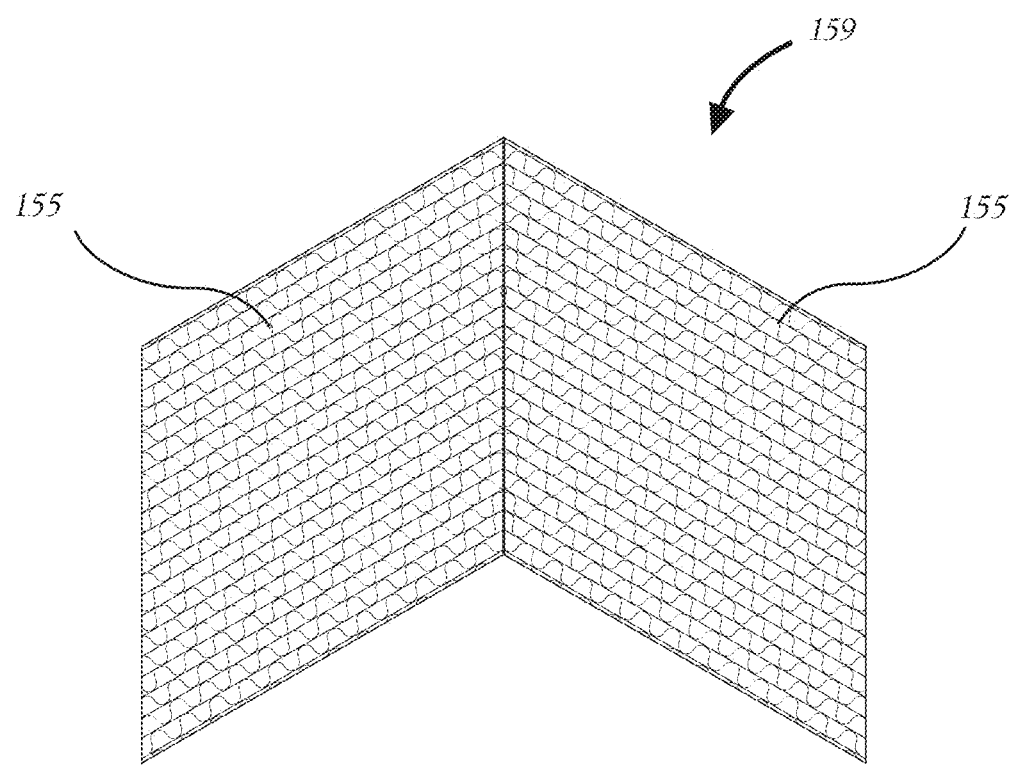
Figure 15A:
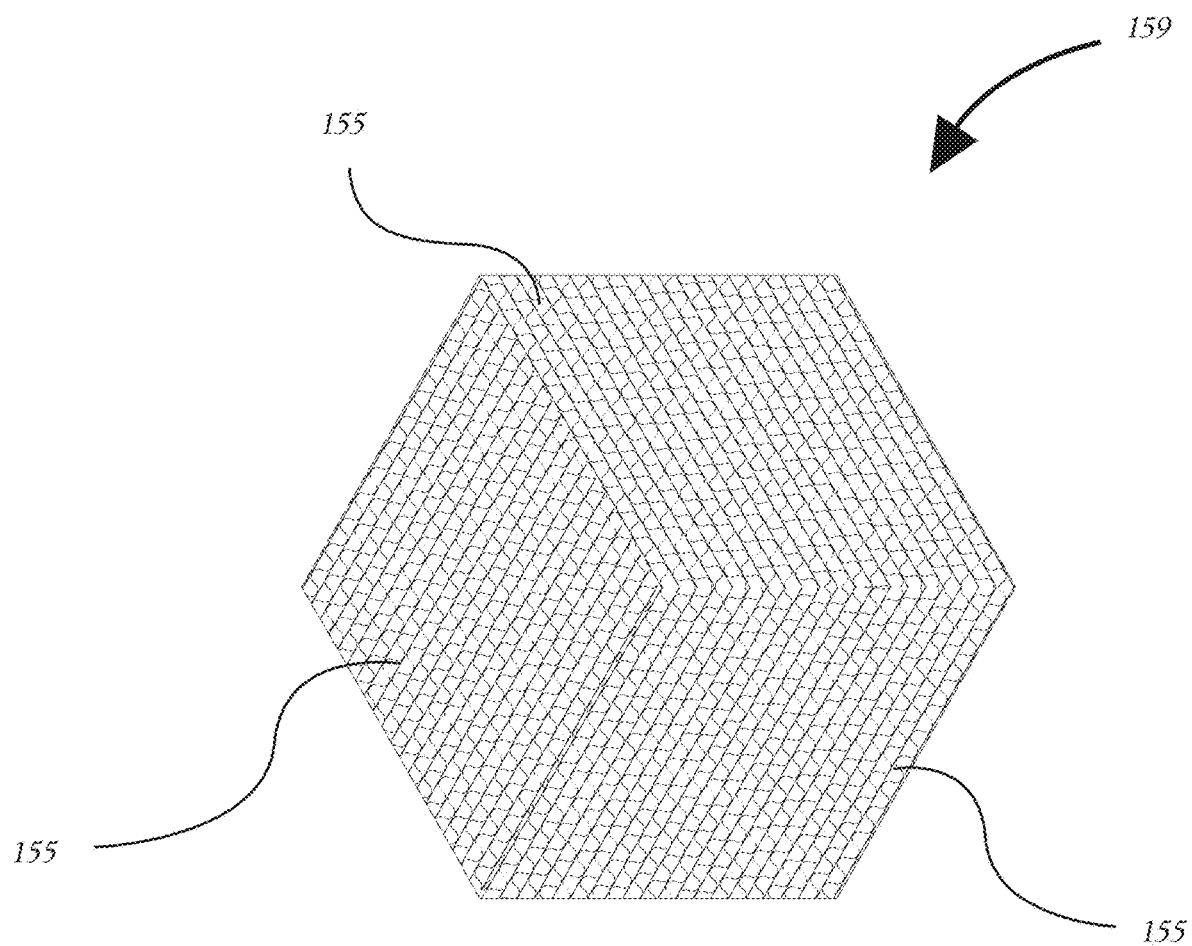
Figure 15B:
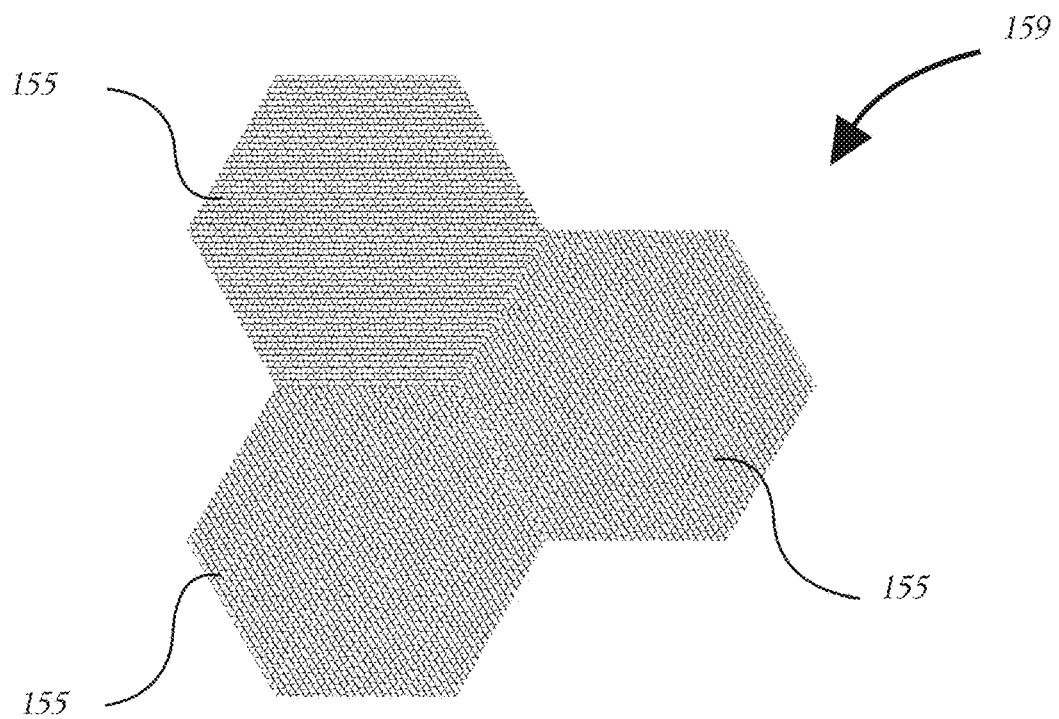
Figure 15C:
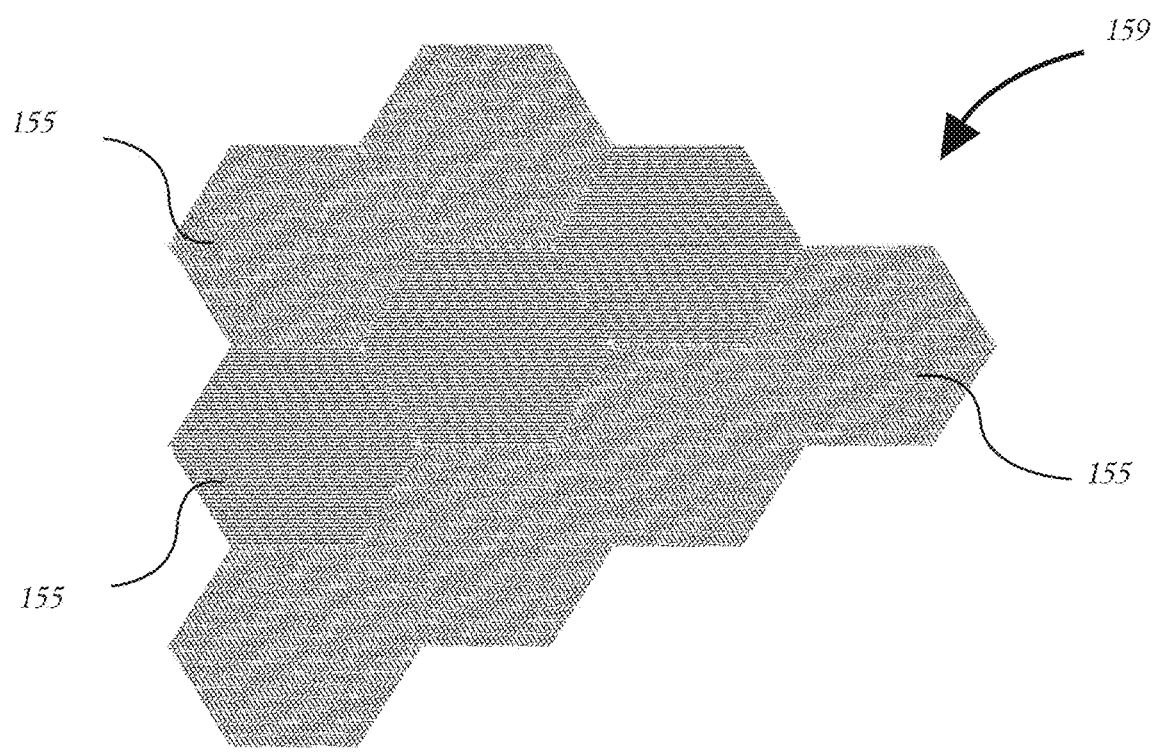
Figure 16A:
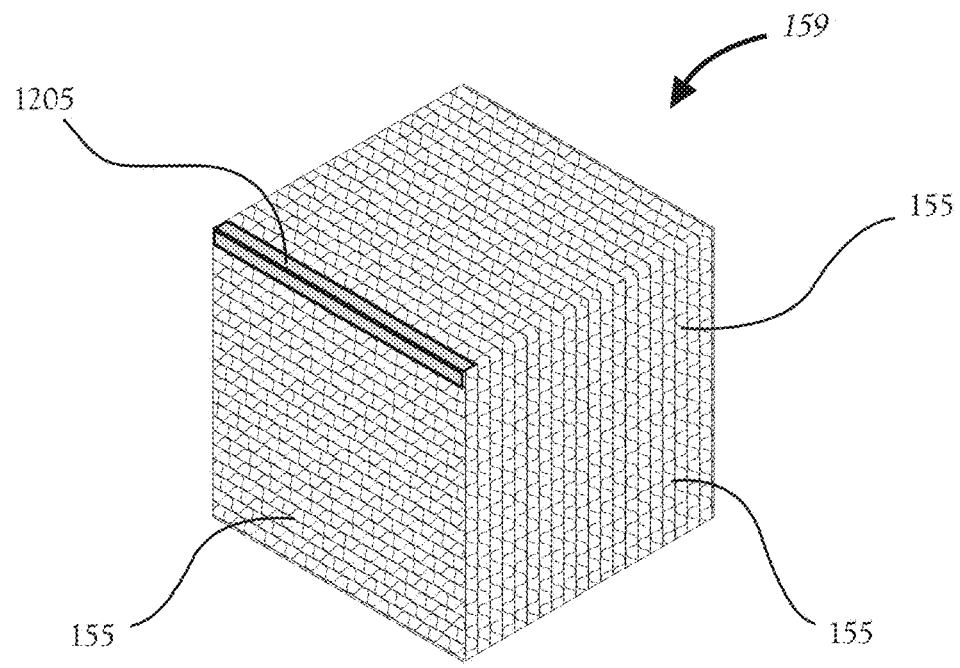
Figure 16B:
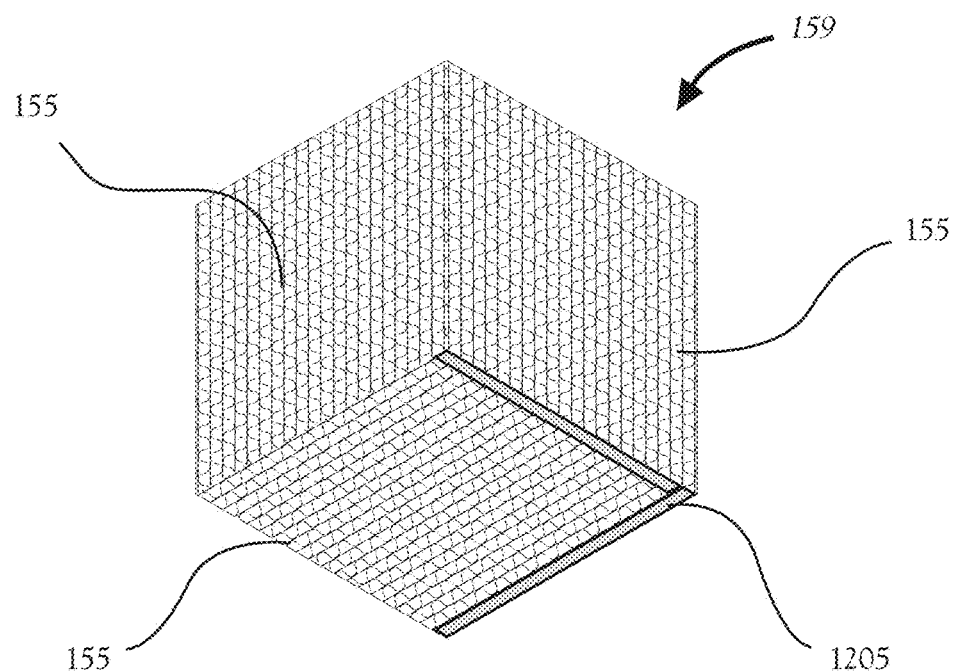
Figure 17A:
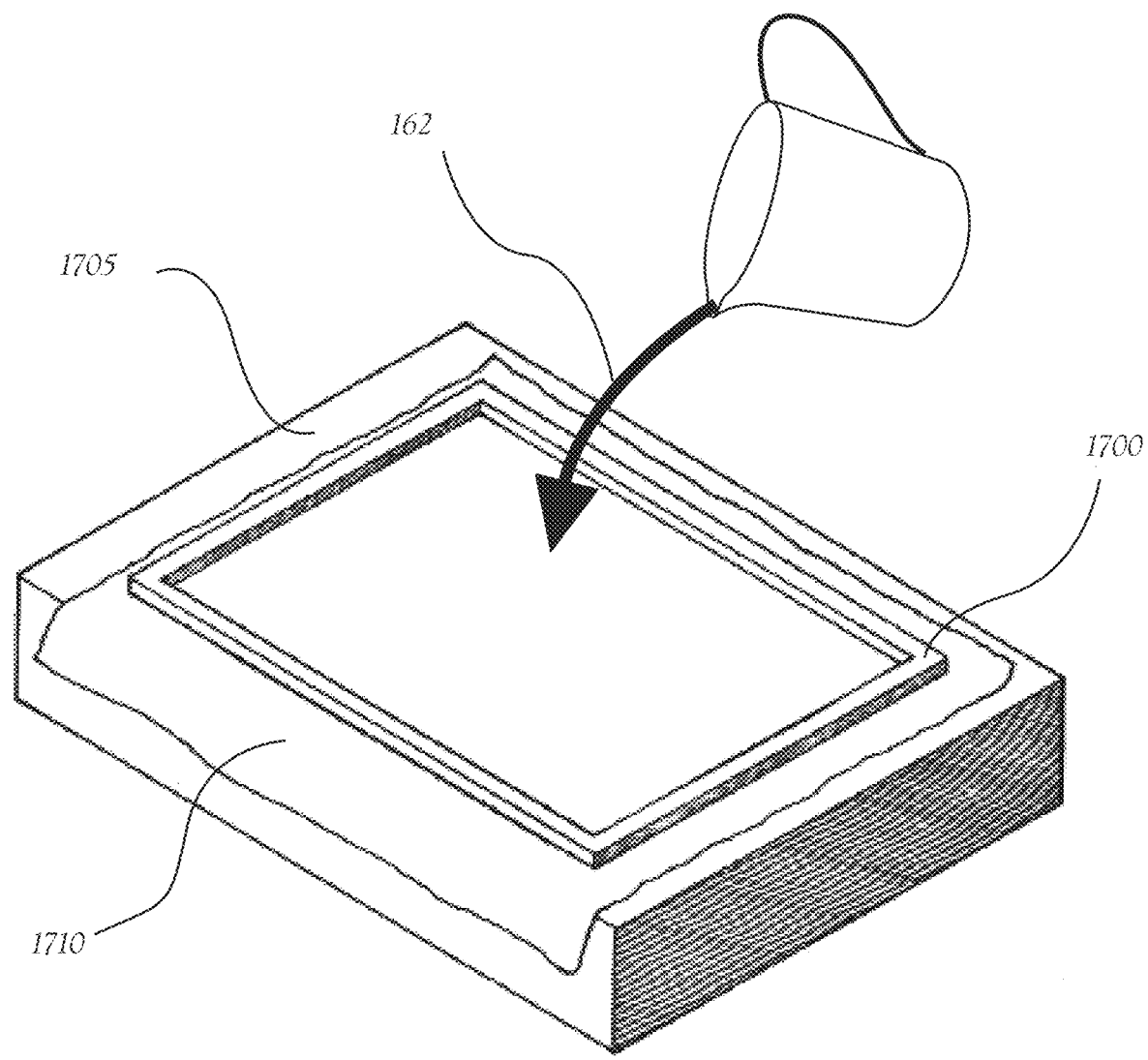
Figure 17B:
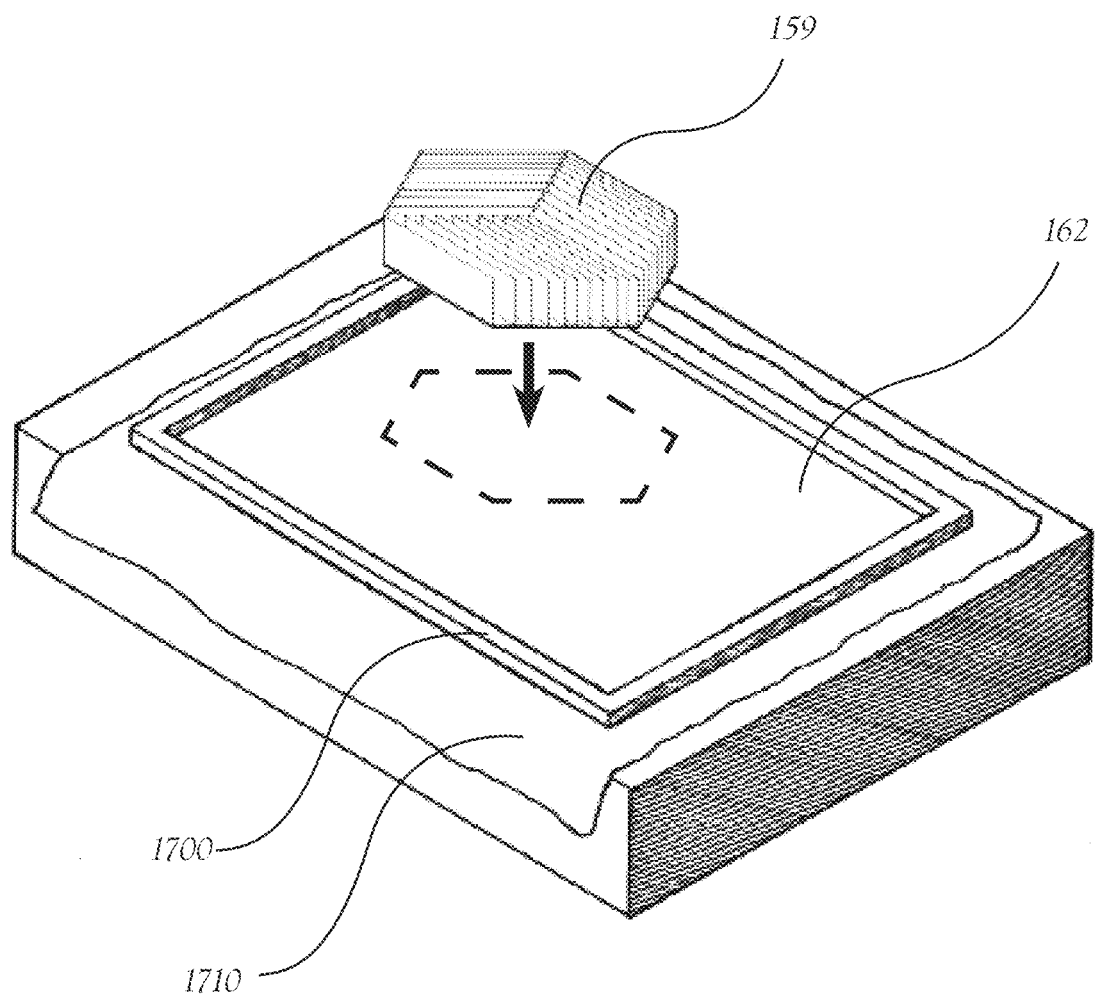
Figure 18B:
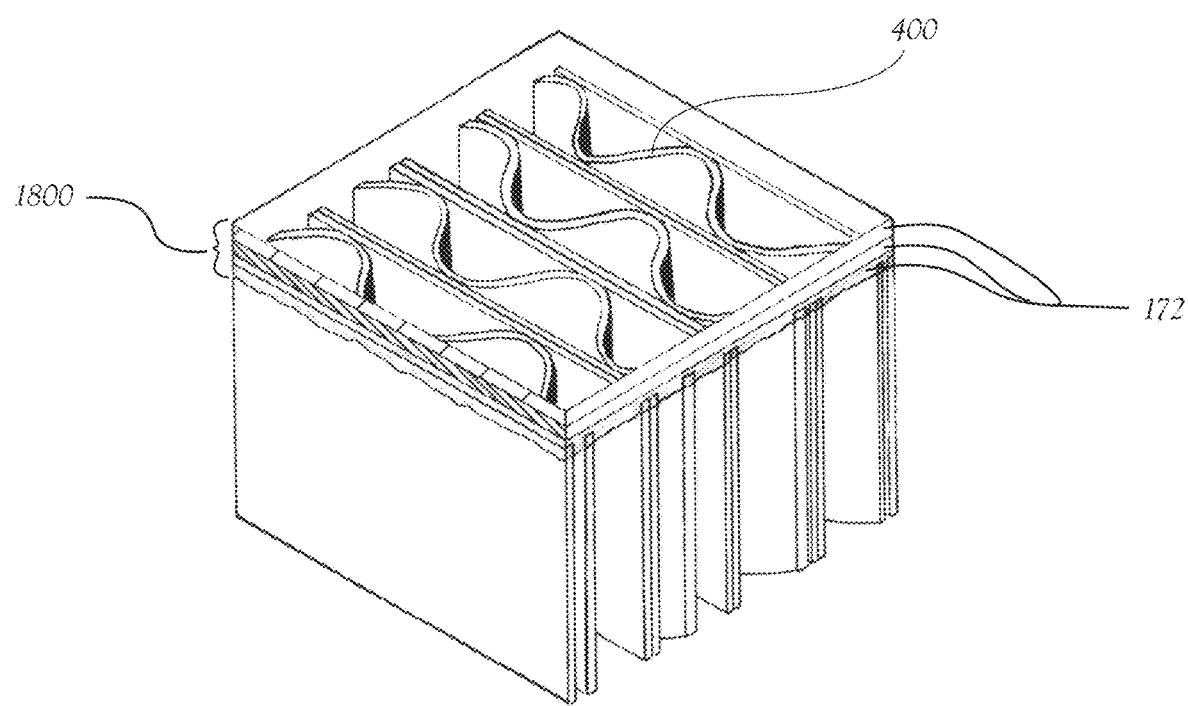
Figure 18C:
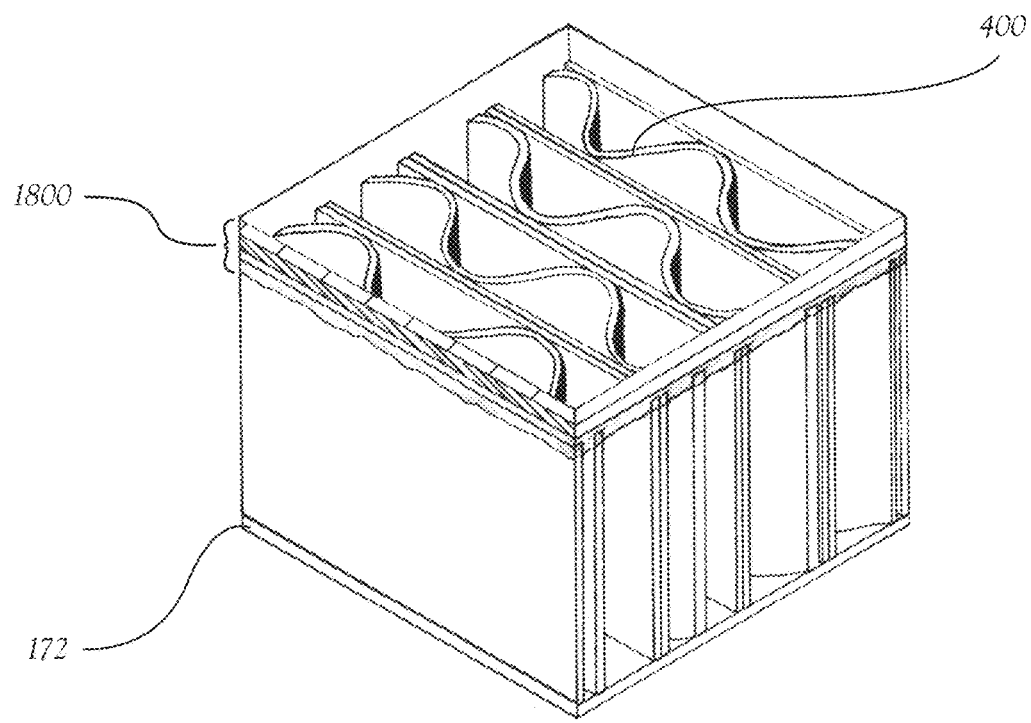
Figure 18D:
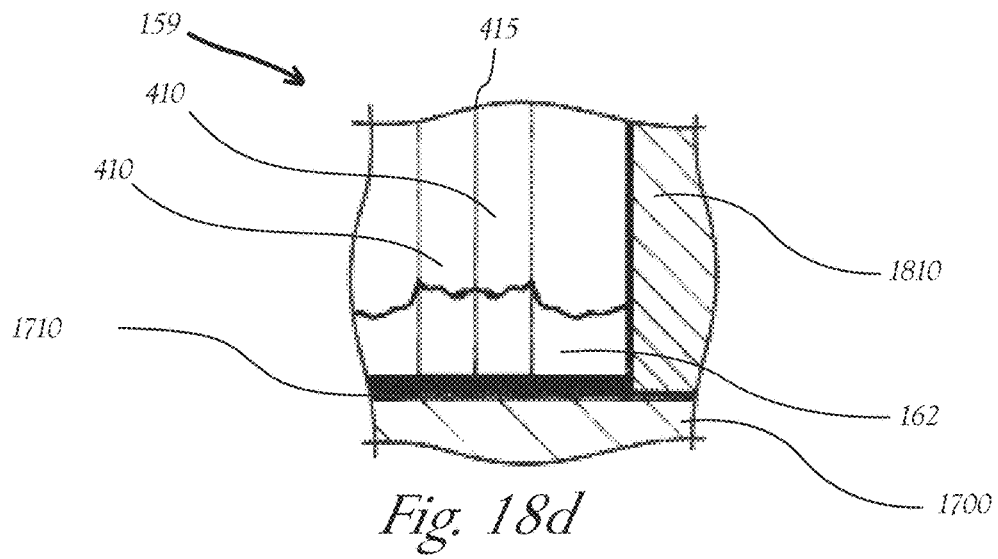
Figure 18E:
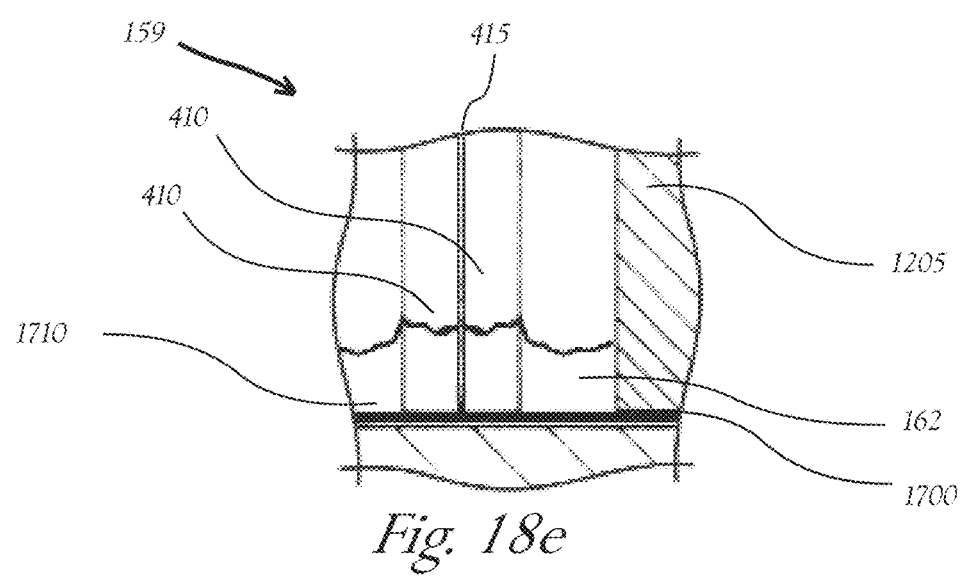
Figure 18F:
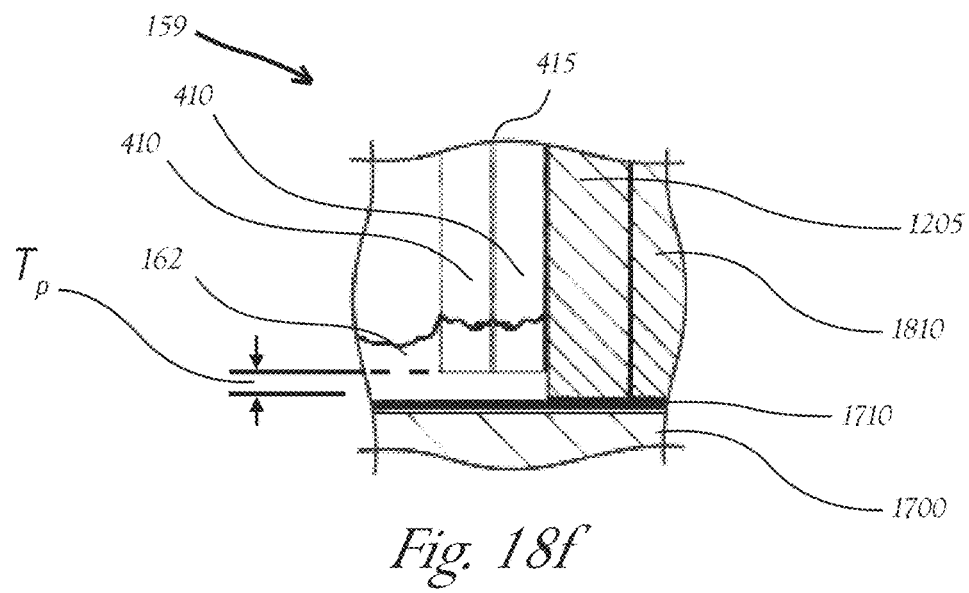
Figure 19B:
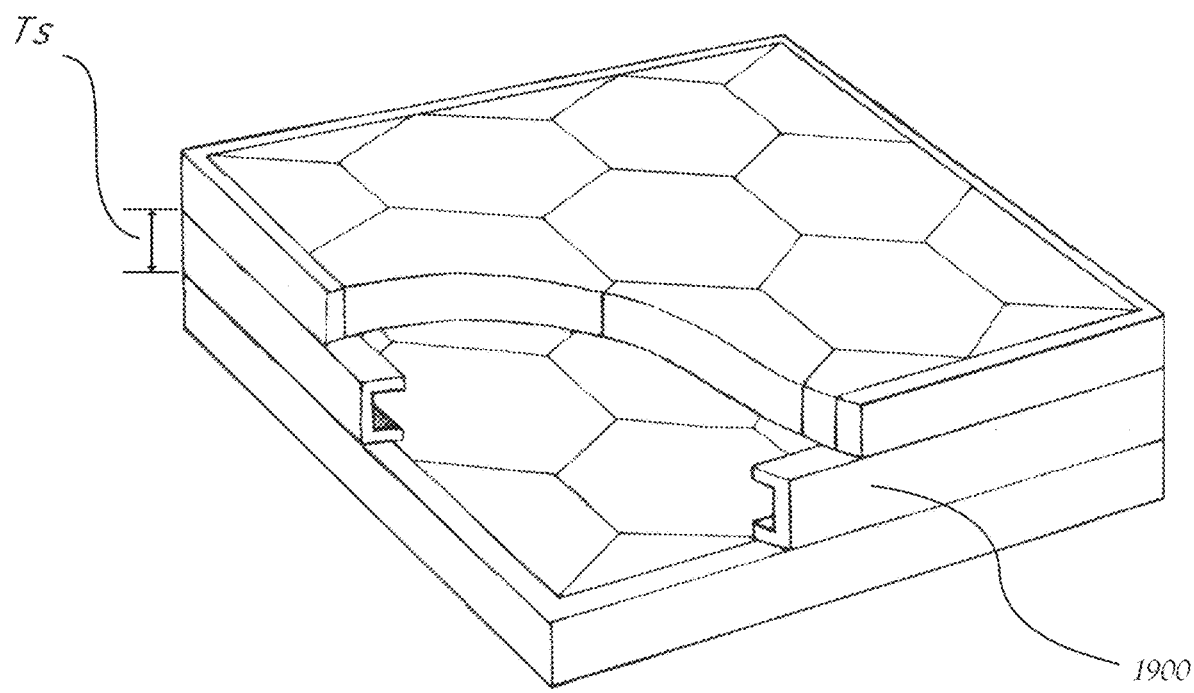
Figure 20A:
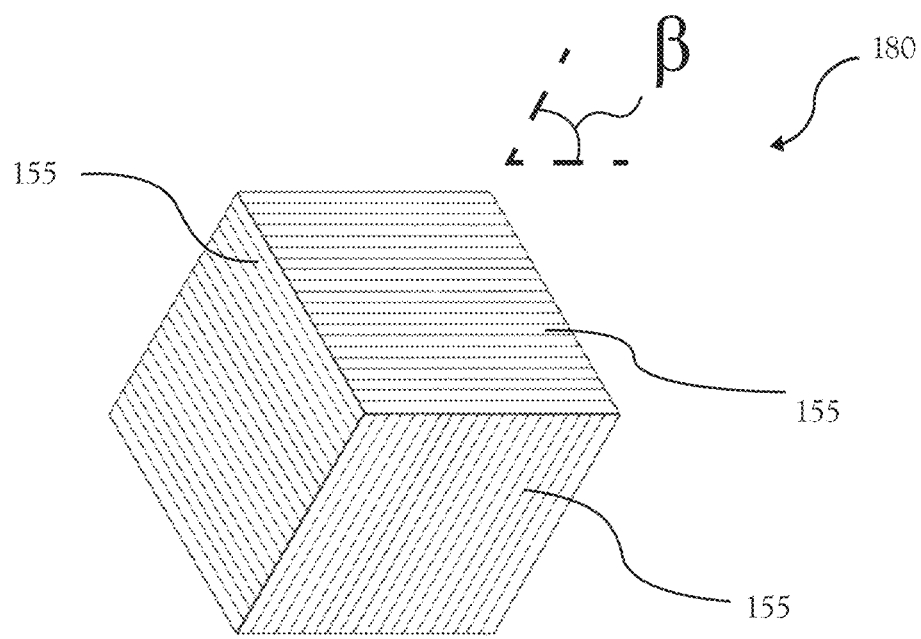
Figure 20B:
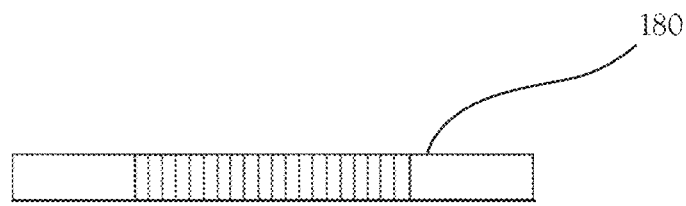
Figure 20C:
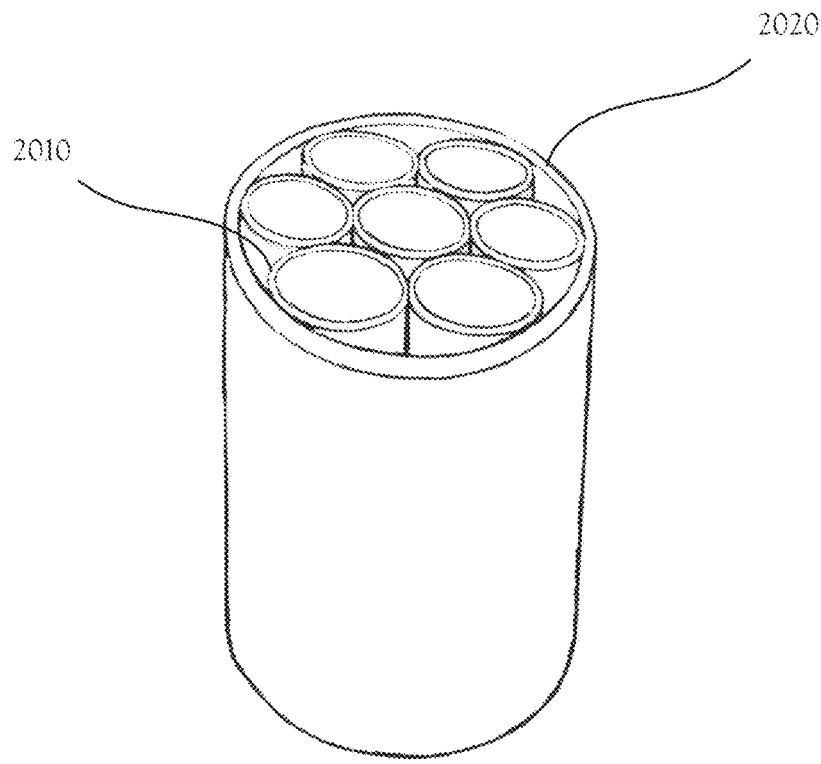
Figure 20D:
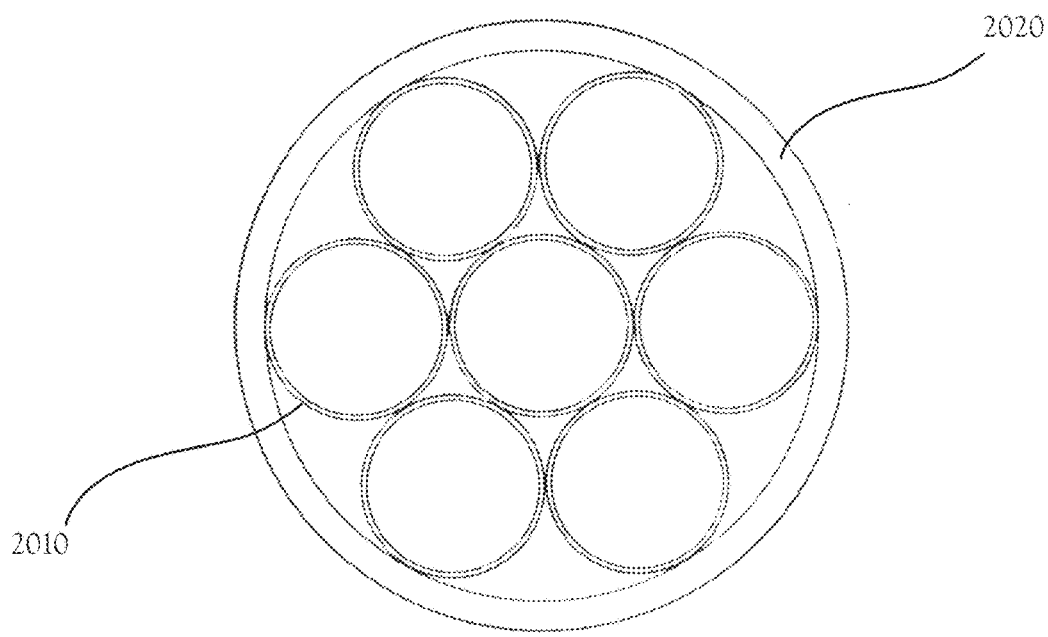
Figure 21A:
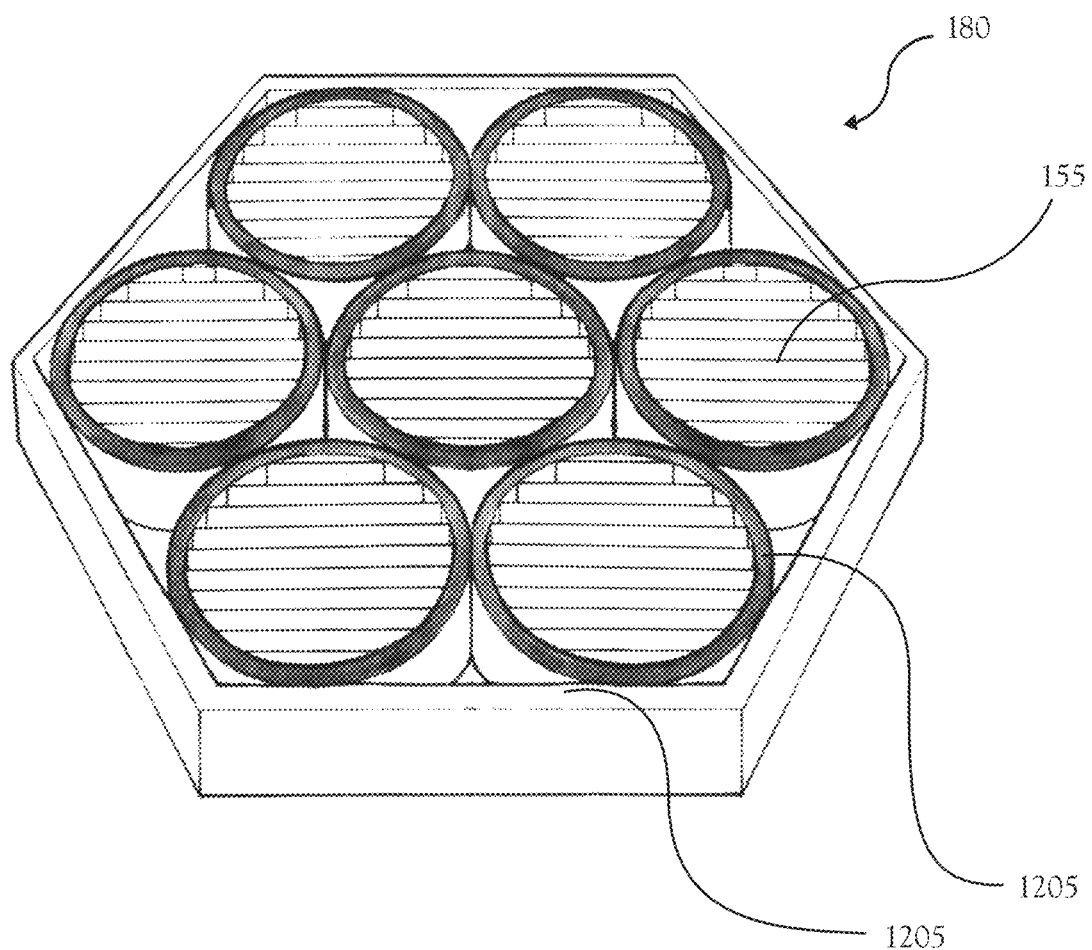
Figure 21B:
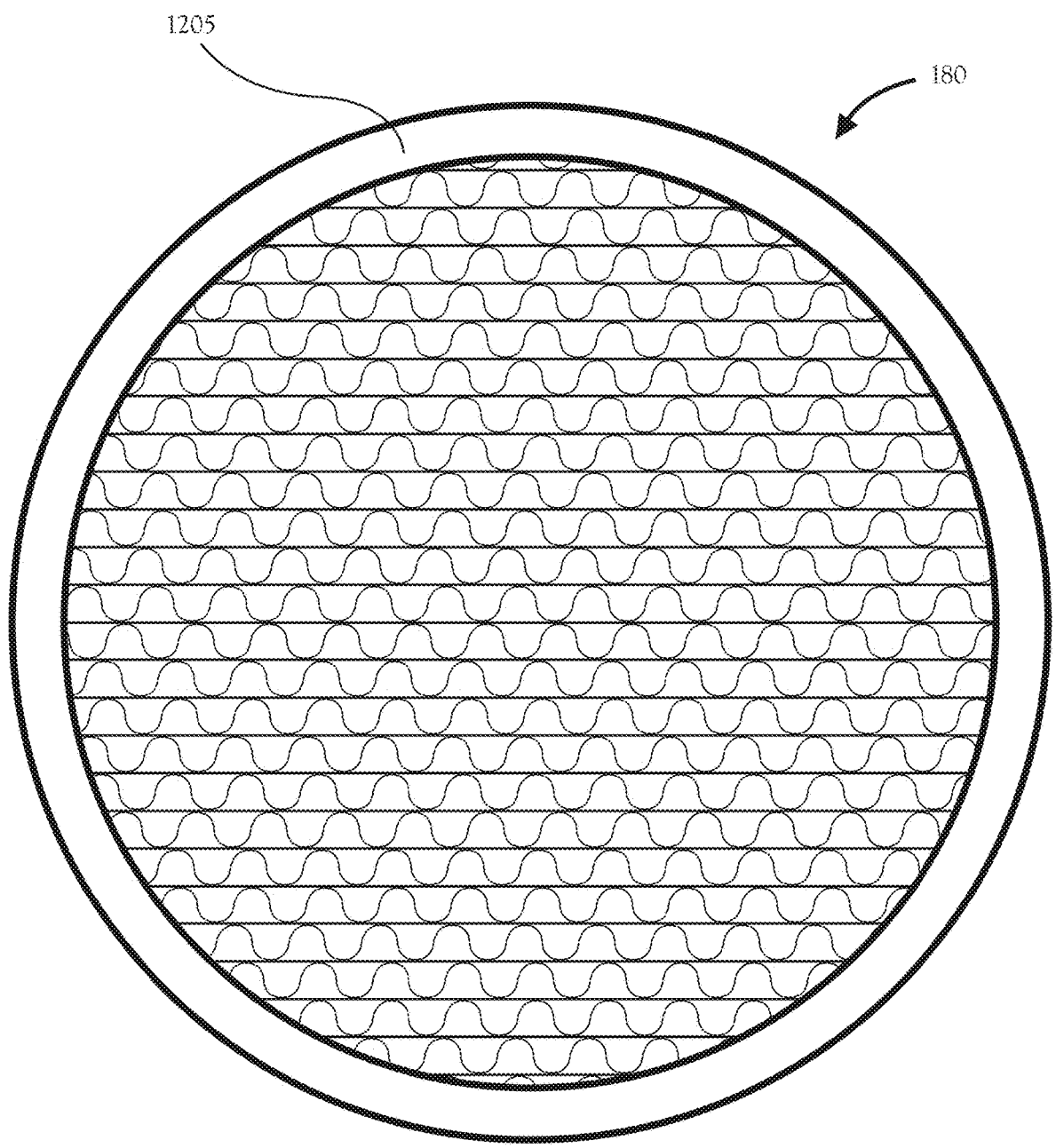
Figure 22A:
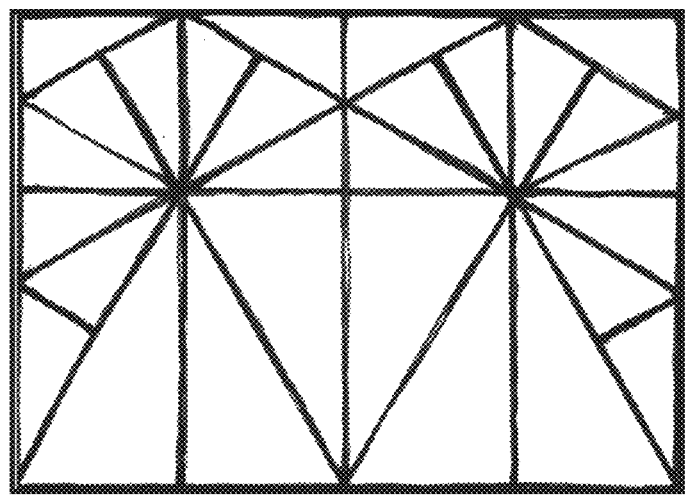
Figure 22B:
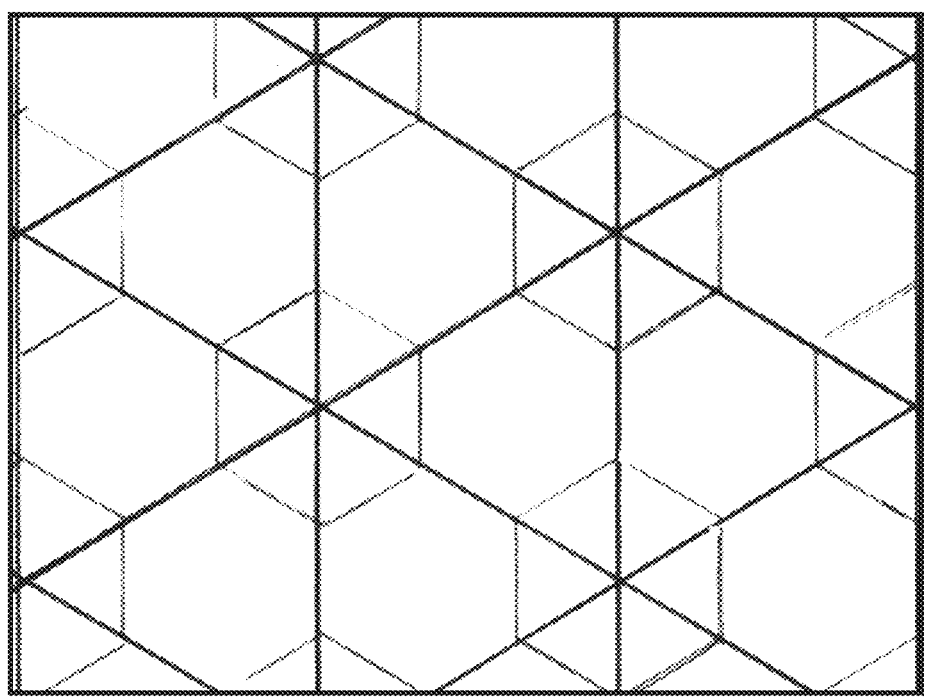
Figure 22C:
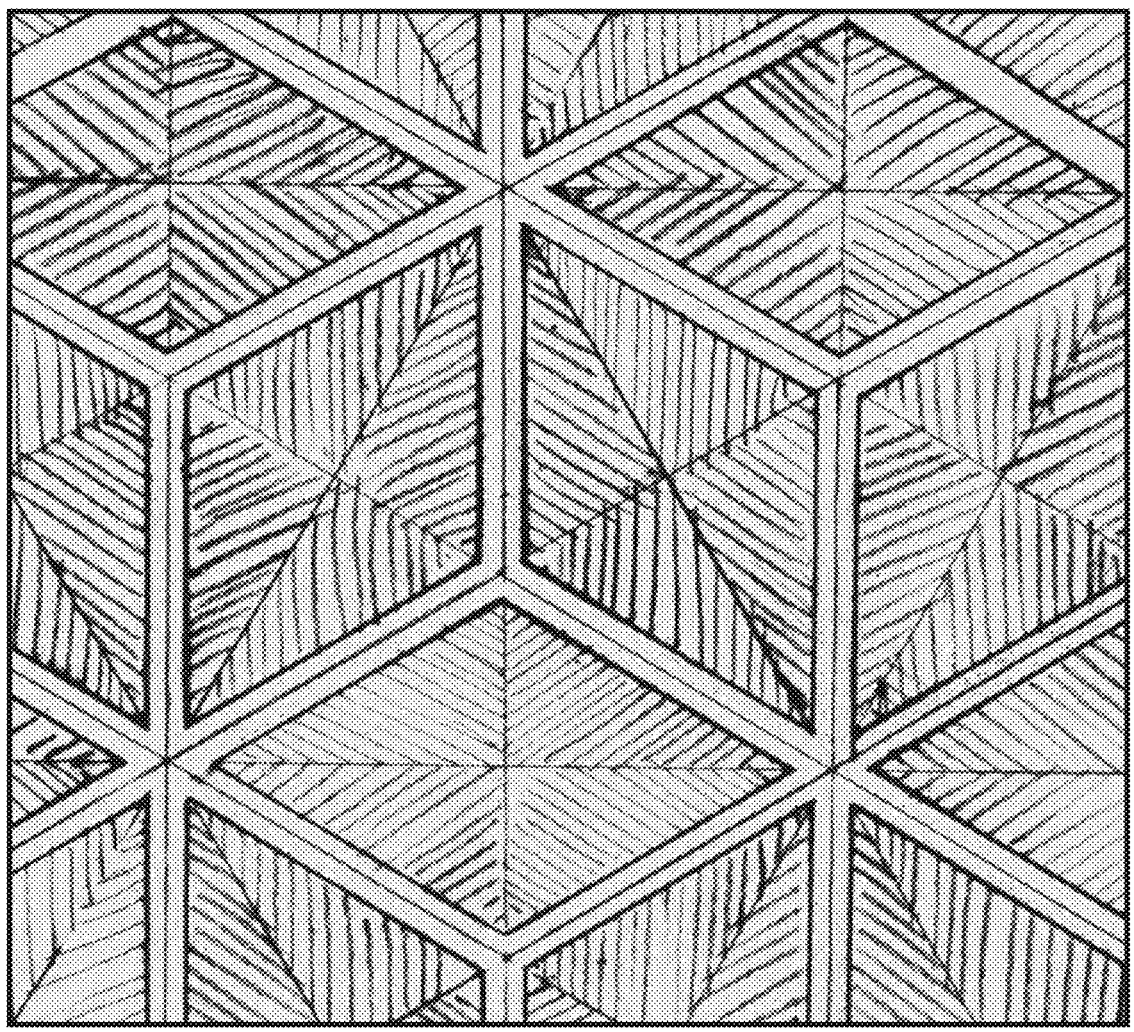
Figure 23A:
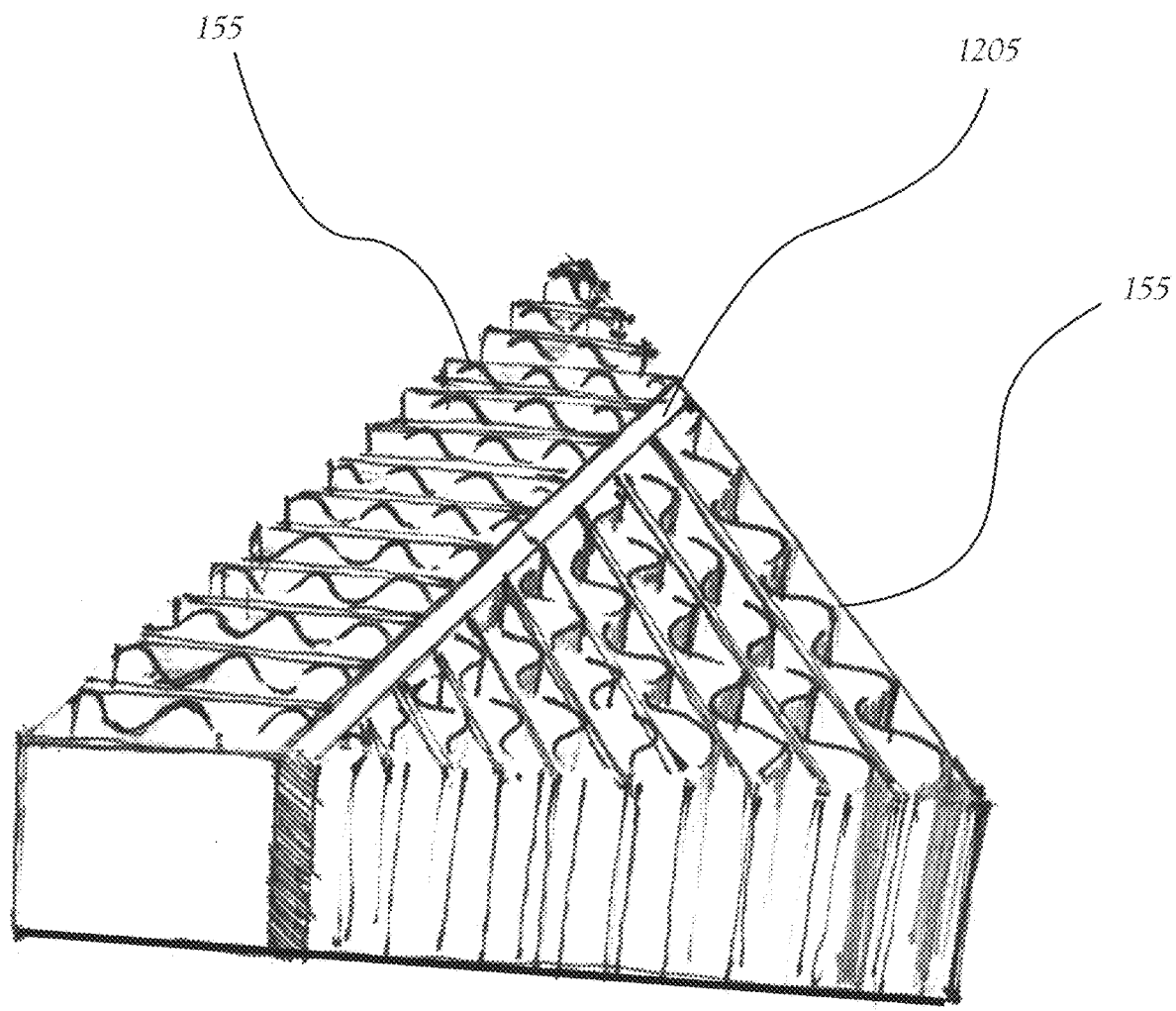
Figure 23B:
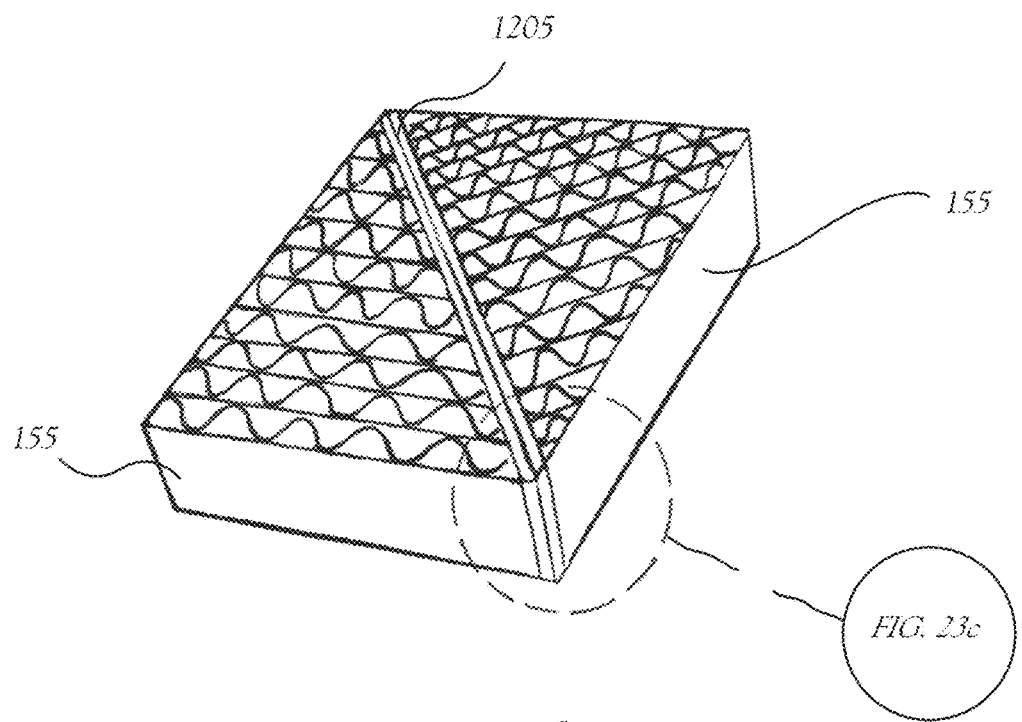
Figure 23C:
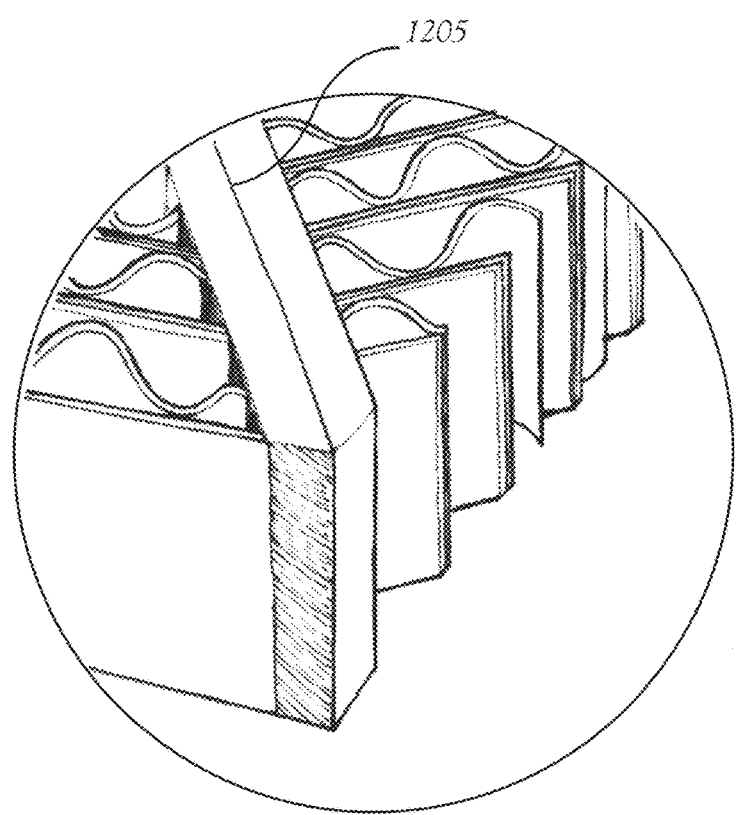
Figure 23D:
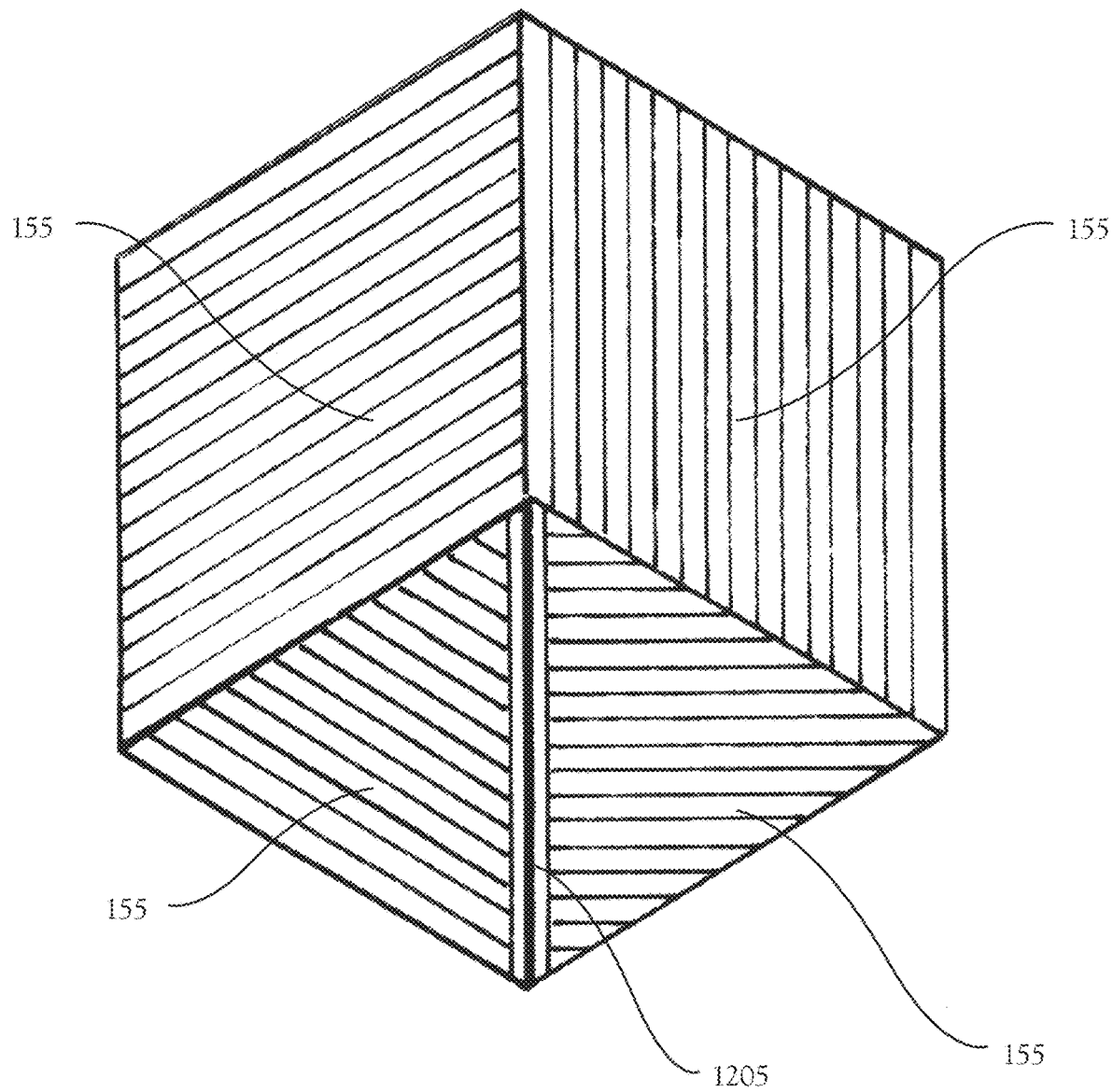
Figure 23F:
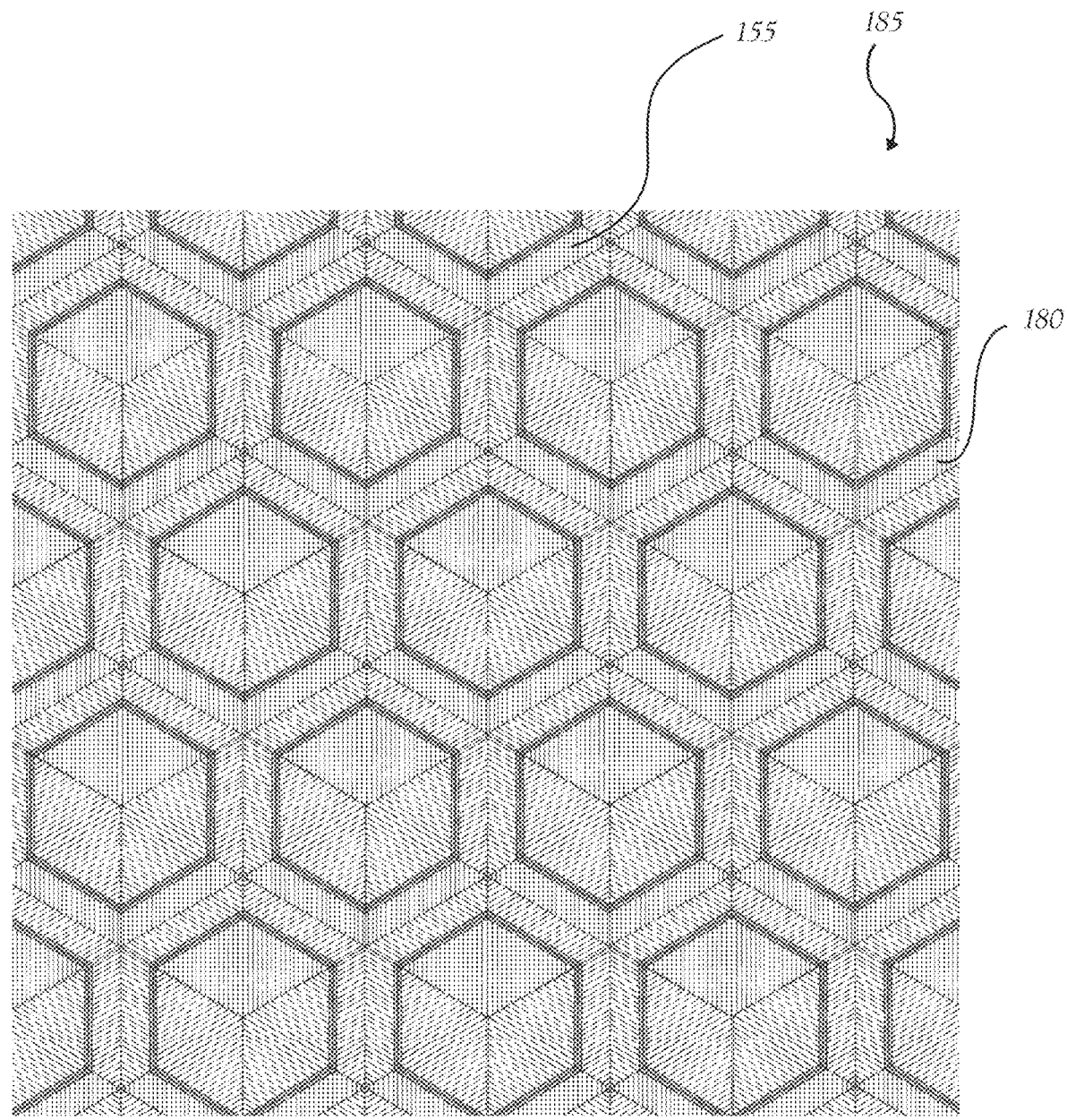
Figure 23G:
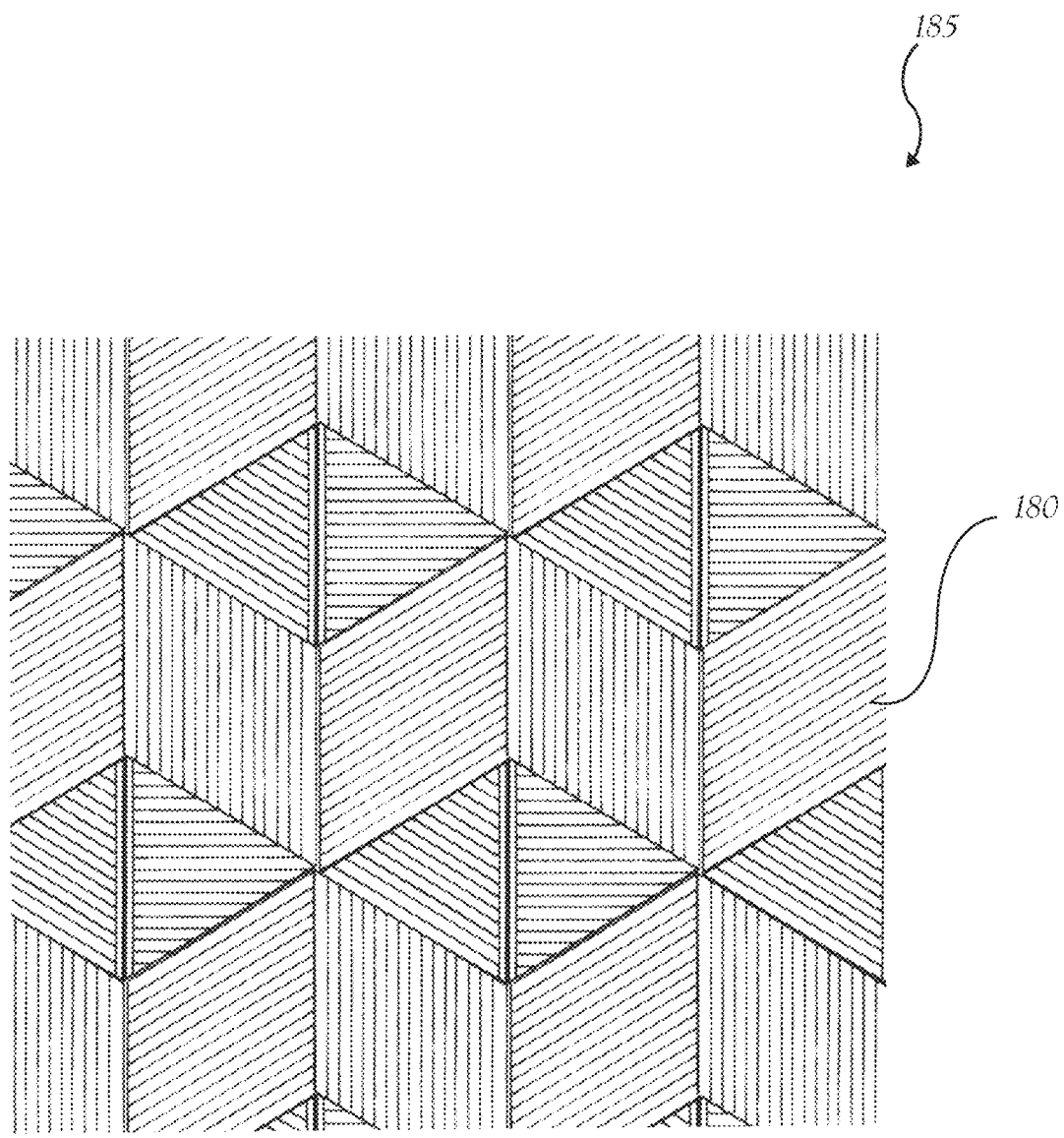
Figure 24:
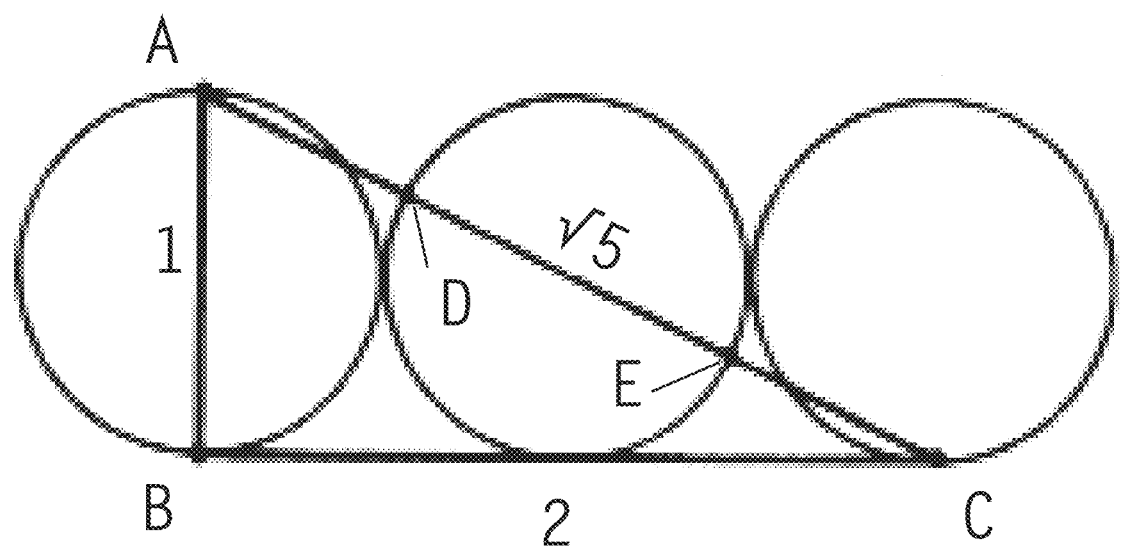
Figure 25A:
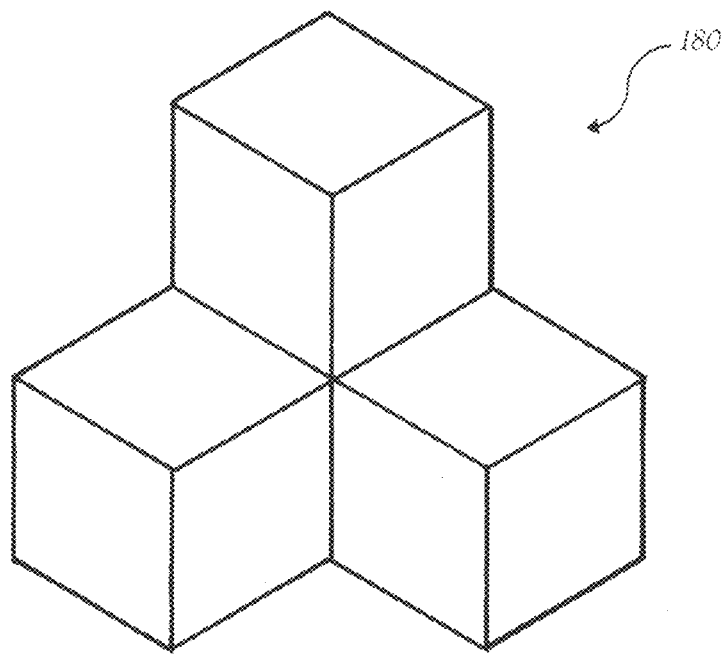
Figure 25B:
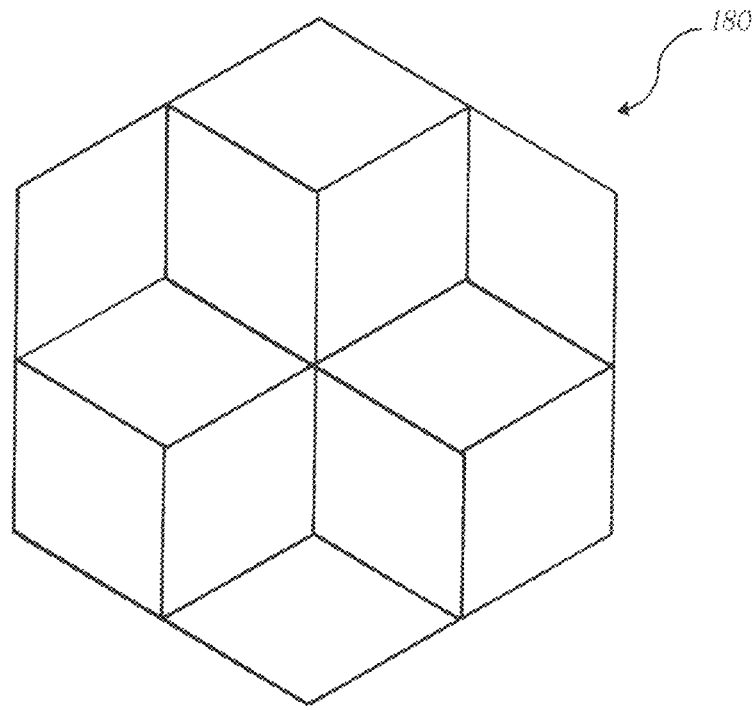
Figure 25C:
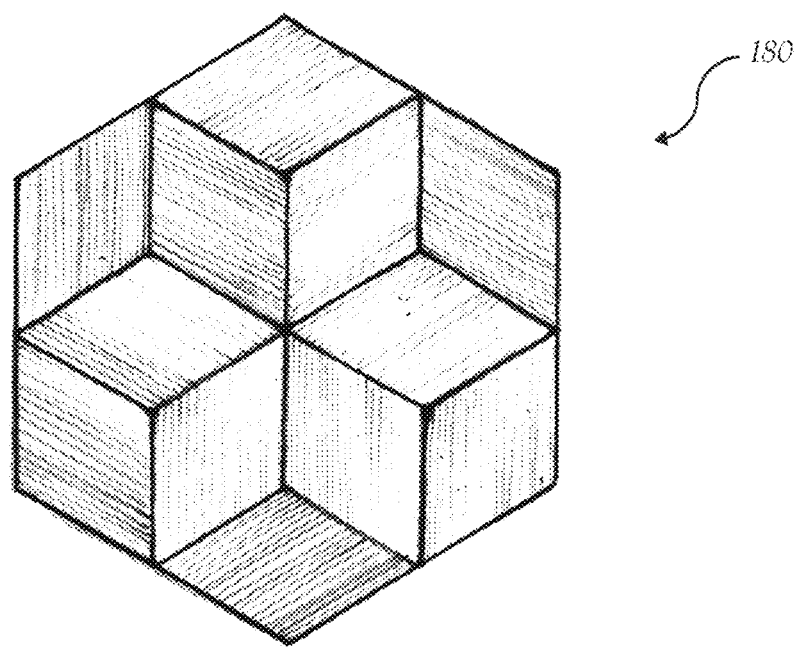
Figure 25D:
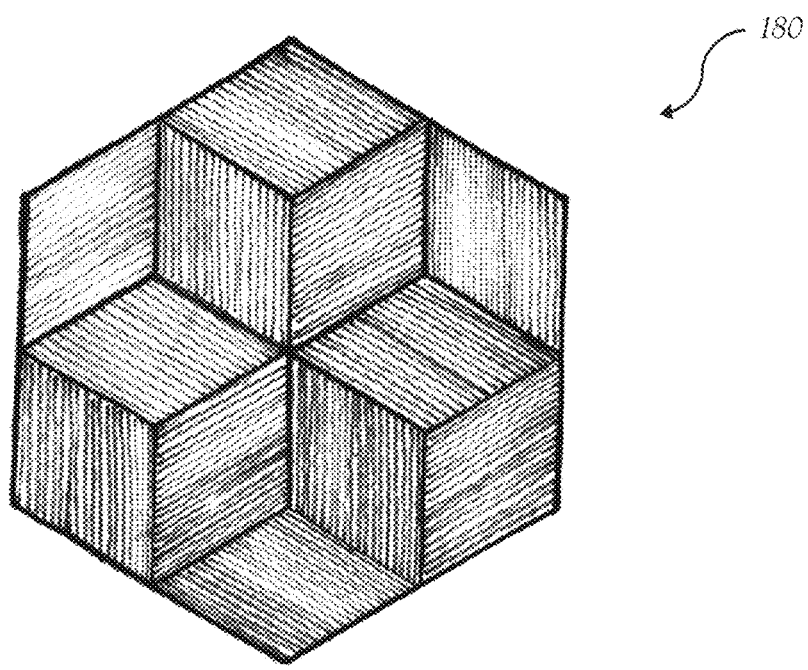
Figure 25F:
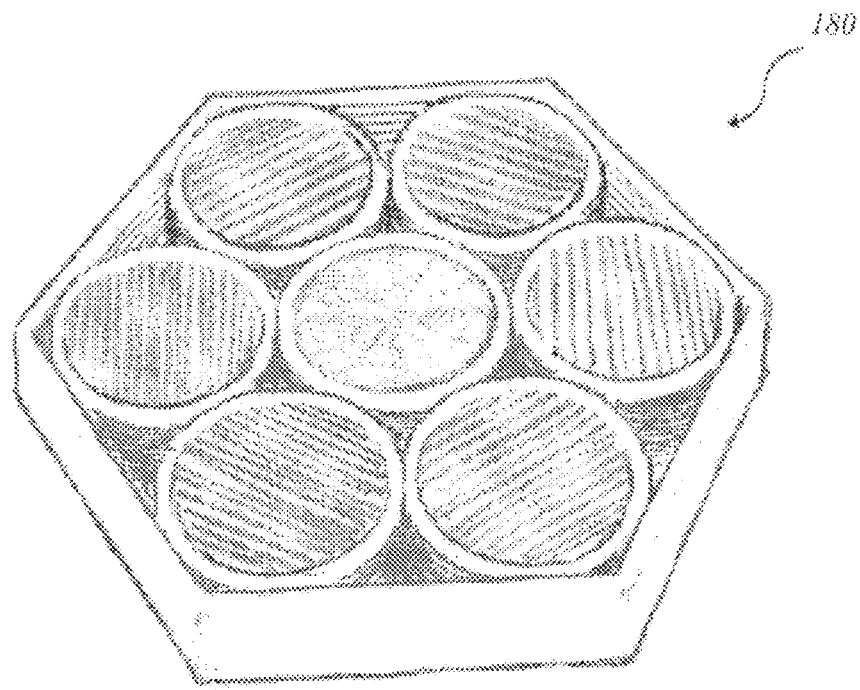
Figure 25G:
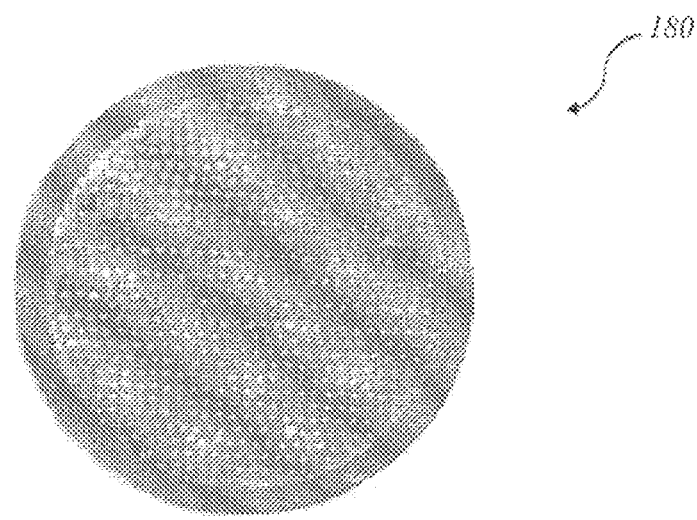
Figure 26A:
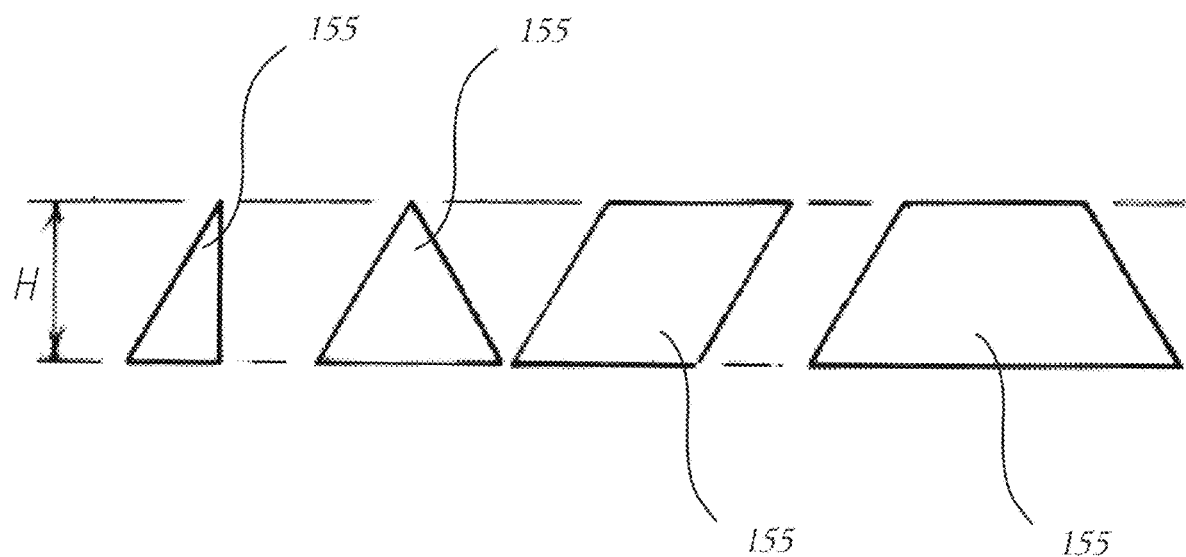
Figure 26B:
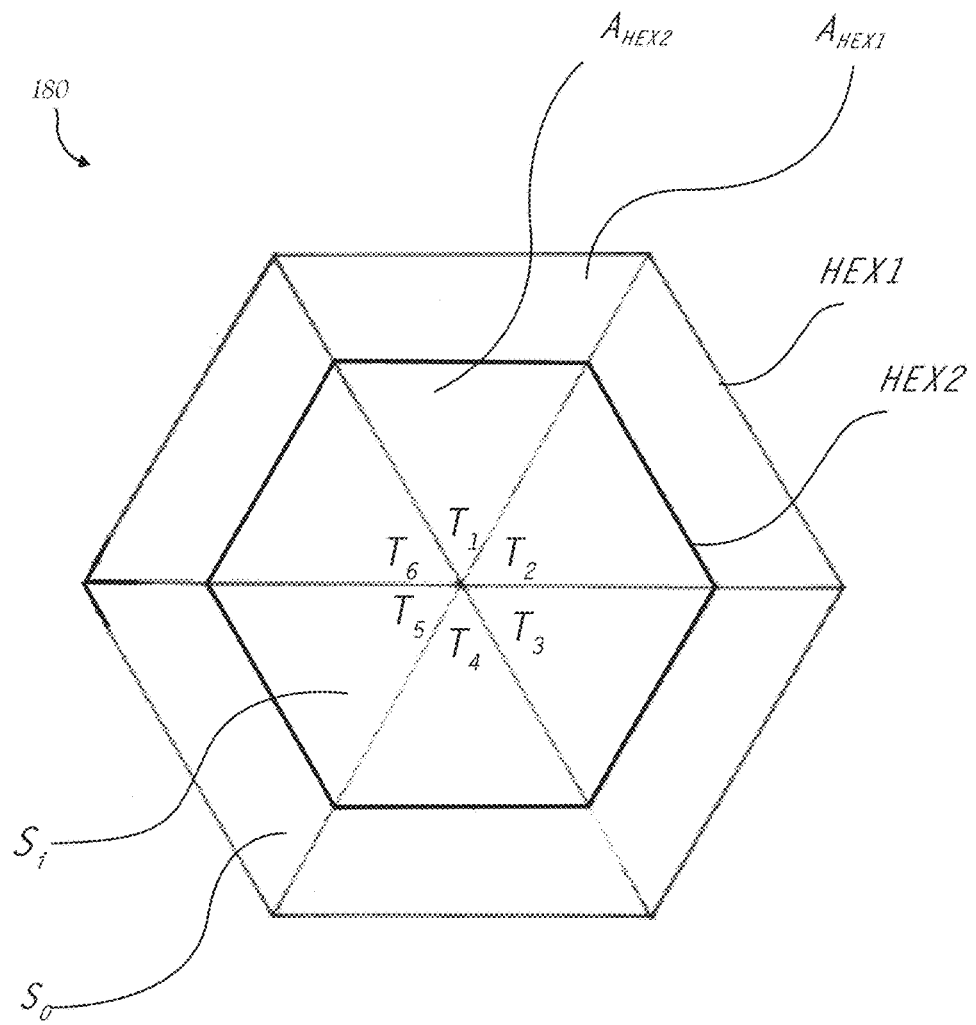
Figure 26C:
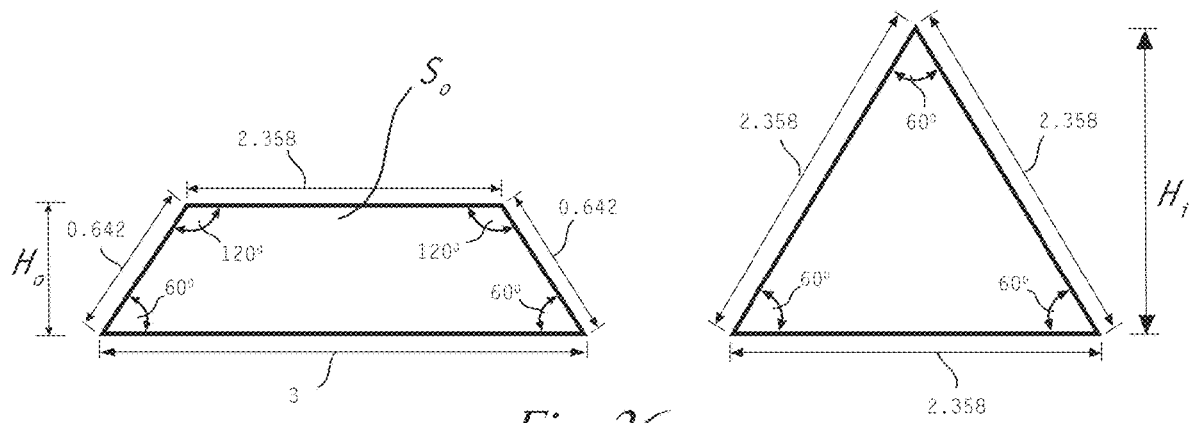
Figure 27A:
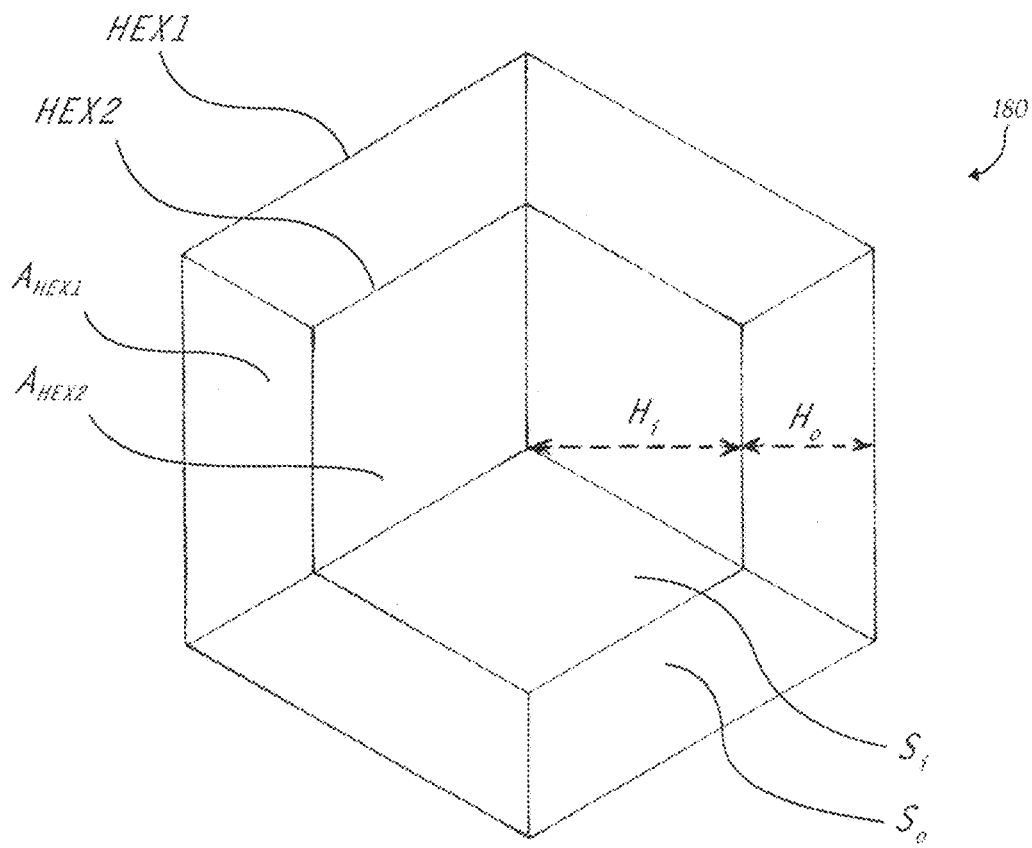
Figure 27B:
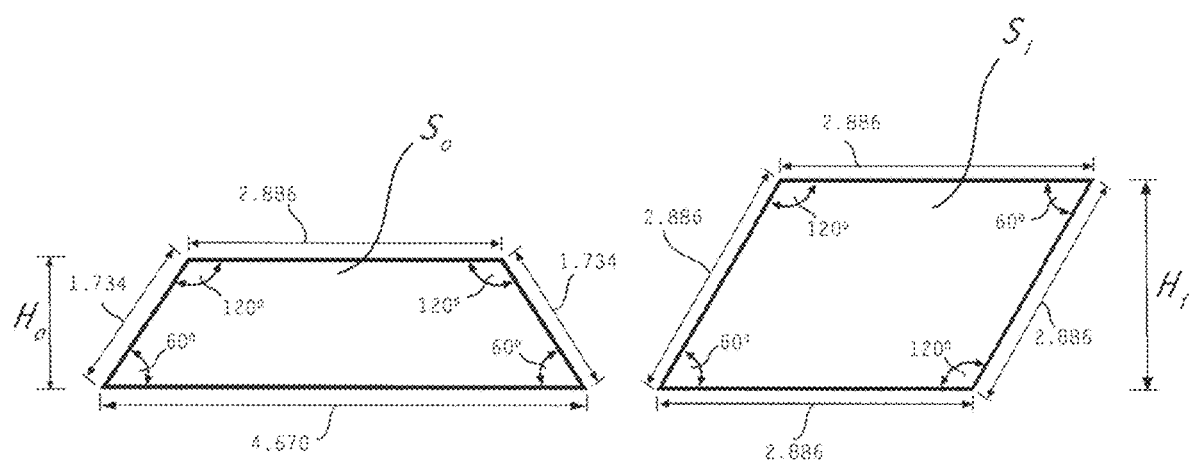
Figure 28A:
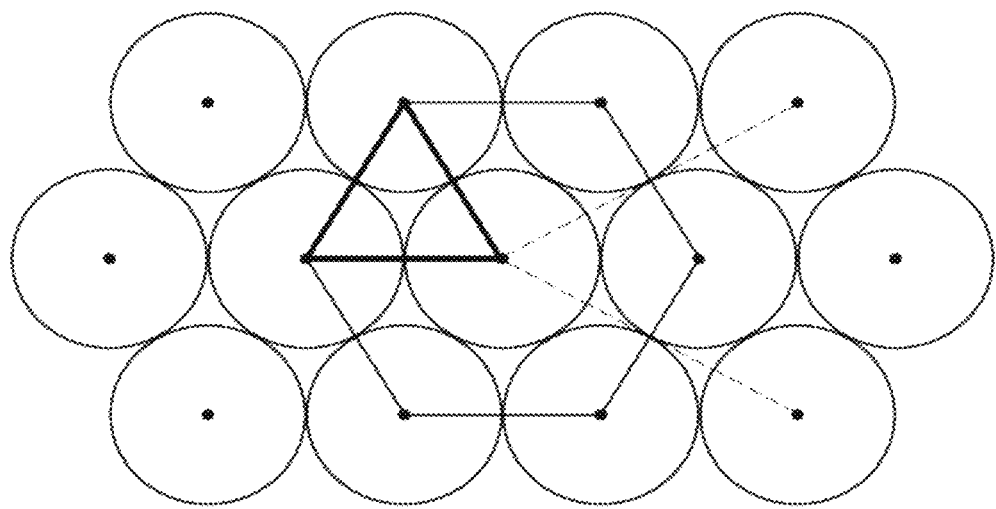
Figure 28B:
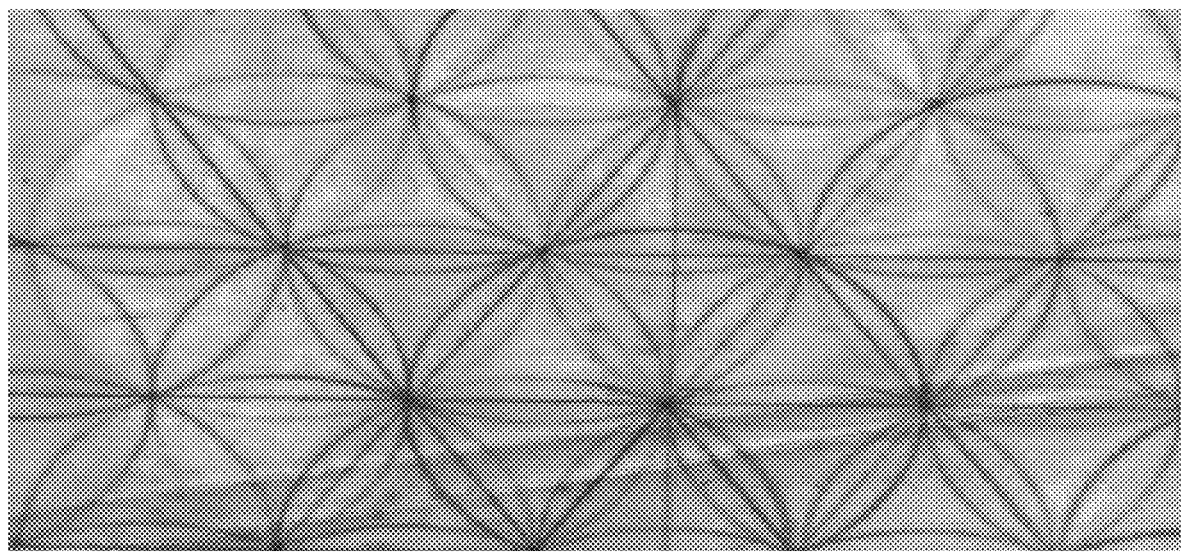

4b depicting cardboard pieces with varying mismatched flute patterns stacked together;

FIG. 4c is a schematic detailed view of a rough block in accordance with an embodiment of the invention;

FIGS. 5a-5b are schematic perspective and side views illustrating the steps of stacking and adhering cardboard together to form a rough block in accordance with an embodiment of the invention;

FIG. 5c is a schematic perspective view of a rough block, prior to trimming, in accordance with an embodiment of the invention;

FIG. 6a is a schematic perspective view of a side of a rough block being trimmed with a miter slide on a table saw in accordance with an embodiment of the invention;

FIG. 6b is a schematic perspective view of a working block being trimmed and squared with a miter saw, commonly known as a chop saw, in accordance with an embodiment of the invention;

FIG. 7 is a schematic perspective view illustrating the saturation of a rough block with an impregnating agent in accordance with an embodiment of the invention;

FIG. 8a is a schematic perspective view of a tile in which space defined by the flutes is filled, in accordance with an embodiment of the invention;

FIG. 8b is a schematic detailed perspective view of the sectional cut depicted in the tile of FIG. 8a, in accordance with an embodiment of the invention;

FIG. 9 is a schematic perspective view of a working block in accordance with an embodiment of the invention;

FIG. 10a is a schematic perspective view of the cutting or segmenting of a working block into finished blocks in accordance with an embodiment of the invention;

FIG. 10b is a schematic perspective view of a working block being cut or segmented into a rhombus-shaped finished block in accordance with an embodiment of the invention;

FIGS. 10c and 10d are perspective views of finished blocks having flute directions that are not perpendicular to a face of the block, in accordance with an embodiment of the invention;

FIG. 11a depicts schematic perspective views of finished blocks having different cross-sectional shapes related at least in part to an equilateral triangle in accordance with an embodiment of the invention;

FIG. 11b depicts schematic perspective views of finished blocks having different cross-sectional shapes in accordance with an embodiment of the invention;

FIG. 12a is a schematic perspective view of a rhombus-shaped finished block that may be sliced into a tile component or may be joined together with two other small structures to form a combination finished block in accordance with an embodiment of the invention;

FIG. 12b is a schematic perspective view of a hexagon-shaped combination finished block composed of three rhombi-shaped finished blocks in accordance with an embodiment of the invention;

FIG. 12c-12d are schematic perspective views of finished blocks, each having a rigidifying component disposed on a face in accordance with an embodiment of the invention;

FIG. 12e is a schematic perspective view of a composite finished block including a rigidifying component disposed between two finished block components in accordance with an embodiment of the invention;

FIG. 12f is a schematic perspective view of three blocks being stacked together to form a single, larger block, in accordance with an embodiment of the invention;

FIG. 13 is a schematic perspective view of a finished block being sliced up into tile components in accordance with an embodiment of the invention;

FIGS. 14a-14b, 15a-15c, and 16a-16b are photographs of different corrugated components that may be created in accordance with embodiments of the invention;

FIG. 17a is a schematic perspective view illustrating the step of pouring of a coating material into a mold in accordance with an embodiment of the invention;

FIG. 17b is a schematic perspective view illustrating the process of forming an outer layer component by placing a corrugated component into a mold for plasticizing in accordance with an embodiment of the invention;

FIG. 18a1 is a schematic perspective view of an equilateral triangle-shaped tile including a rigidifying component and a singular multilayer outer layer component in accordance with an embodiment of the invention;

FIG. 18a2 is a schematic detailed perspective view of the sectional cut depicted in the tile of FIG. 18a1, in accordance with an embodiment of the invention;

FIG. 18b is a detailed perspective view of a tile having one multi-layered outer layer component in accordance with an embodiment of the invention;

FIG. 18c is a detailed perspective view of a tile having two multi-layered outer layer components in accordance with an embodiment of the invention;

FIGS. 18d-18f depict detailed cross-sectional views of a corrugated component during the creation of the outer layer component in accordance with an embodiment of the invention;

FIG. 19a1 is a schematic perspective view of a tile defined by two layers of corrugated components in accordance with an embodiment of the invention;

FIG. 19a2 is a schematic detailed perspective view of the rectangular section depicted in the tile of FIG. 19a1, in accordance with an embodiment of the invention;

FIG. 19b is a schematic partially cutaway perspective view of a tile defined by two layers of corrugated components separated from one another with an inner-tile spacer in accordance with an embodiment of the invention;

FIGS. 20a-20b are plan and side views of a translucent tile defined by three rhombi-shaped tile components in accordance with an embodiment of the invention;

FIG. 20c is a schematic perspective view of tubular materials placed inside a larger tube, in accordance with an embodiment of the invention;

FIG. 20d is a schematic top view of a circular tile including tubular materials, in accordance with an embodiment of the invention;

FIG. 21a is a schematic perspective view of a hexagonal tile including seven circular tile components, in accordance with an embodiment of the invention;

FIG. 21b is a schematic plan view of a circular tile or tile component, in accordance with an embodiment of the invention;

FIG. 22a is a schematic plan view of a rectangular tile defined by nested 30-60-90 triangles in accordance with an embodiment of the invention;

FIG. 22b is a schematic plan view of a surface covered by tiles having two nested shapes—equilateral triangles and equilateral hexagons—in accordance with an embodiment of the invention;

FIG. 22c is a schematic plan view of a surface covered with equilateral triangle-shaped tiles in accordance with an embodiment of the invention;

FIG. 23a is a schematic perspective view of a cross-section of a tile component, shaped as an equilateral triangle, with a rigidifying structure incorporated within its corrugated structure in accordance with an embodiment of the invention;

FIGS. 23b and 23c are schematic perspective and enlarged detailed views of a rhombi-shaped tile defined by two equilateral triangle-shaped tile components, each one including a rigidifying component in accordance with an embodiment of the invention;

FIG. 23d is a schematic plan view of a translucent tile defined by four tile components, two rhombi and two triangle-shaped tile components in accordance with an embodiment of the invention;

FIG. 23e1 is a schematic perspective view of an equilateral triangle-shaped corrugated component being placed into a mold, with the borders of the mold not being removed, but rather being used as a rigidifying component of the tile, in accordance with an embodiment of the invention;

FIG. 23e2 is a schematic perspective view of an equilateral triangle-shaped tile including the corrugated component and rigidifying component of FIG. 23e1, in accordance with an embodiment of the invention;

FIG. 23f is a schematic plan view of a surface covered with hexagon-shaped motif tiles incorporating the tile components of FIG. 23a in accordance with an embodiment of the invention;

FIG. 23g is a schematic plan view of a surface covered with the hexagon-shaped tiles of FIG. 23d in accordance with an embodiment of the invention;

FIG. 24 is a graph illustrating the geometric relationship between any three identical circles abutting one another with vertices disposed along a common line;

FIG. 25a is a schematic plan view of a hexagonal tile motif defined by nine equilateral rhombi-shaped tile components in accordance with an embodiment of the invention;

FIG. 25b is a schematic plan view of a hexagon-shaped tile motif defined by twelve equilateral rhombi-shaped tile components in accordance with an embodiment of the invention;

FIG. 25c-25d are plan views illustrating some alternative patterns that may be created by varying the orientation of the flutes in the tile motif illustrated in FIG. 25b, in accordance with an embodiment of the invention;

FIG. 25e1 is a plan view illustrating an alternative pattern that may be created by varying the orientation of the flutes in the tile motif illustrated in FIG. 25b, in accordance with an embodiment of the invention;

FIG. 25e2 is a cross-sectional view through section A-A of the tile of FIG. 25e1, in accordance with an embodiment of the invention;

FIG. 25f is a schematic perspective view of another hexagonal tile having seven circular tile components, in accordance with an embodiment of the invention;

FIG. 25g is a schematic plan view of a circular tile or tile component, in accordance with an embodiment of the invention;

FIG. 26a is a diagram showing height H in several different tile component shapes that may be used to cover a surface with hexagons;

FIG. 26b is a schematic plan view of a hexagon-shaped motif including two sets of tile components that have surfaces areas related by the Golden Ratio, $\Phi$;

FIG. 26c is a diagram showing the geometry of finished blocks that may be used to define the tile components shown in FIG. 26b;

FIG. 27a is a schematic plan view of a hexagon formed from two sets of tile components in which a ratio of a height Hi of an inner component to a height Ho of an outer component is the Golden Ratio, $\Phi$;

FIG. 27b is a diagram showing the geometry of finished blocks that may be used to define the tile components shown in FIG. 27a;

FIG. 28a is a diagram illustrating the relationship between the Golden Ratio, $\Phi$, and a surface covered with abutting circles; and FIG. 28b is a diagram illustrating circles that overlap to form hexagons.

DETAILED DESCRIPTION

As used herein, "epoxy" means any of various thermosetting copolymers that form tight cross-linked polymer structures characterized by toughness, strong adhesion, and low shrinkage. An epoxy is typically formed from a reaction of an epoxide resin with a polyamine hardener.

As used herein, an "epoxy resin" is a resin consisting of monomers or short chain polymers with an epoxide group, i.e., a three-membered oxide ring, at either end. In an uncured stage, epoxy resins are polymers with a low degree of polymerization. They may be thermosetting resins that cross-link to form a three-dimensional nonmelting matrix. A curing agent (hardener) is generally used to achieve the proper degree of polymerization.

As used herein. "glass transition temperature" means the temperature at which an amorphous polymer, upon heating, transitions from a glass to a rubbery form.

A method of manufacture according to an embodiment of the invention is illustrated in the accompanying figures. Referring to FIG. 1, a flow chart of a manufacturing process 100 includes processing cardboard to create a composite translucent material suitable for a variety of uses. A number of steps are performed to form a corrugated component, followed by the performance of steps to form a translucent corrugated tile having an outer layer component. Schematic diagrams illustrating the steps of the process of FIG. 1 are shown in FIG. 2.

Referring to FIG. 1, the process 100 is used to manufacture a translucent building material out of corrugated cardboard or fiberboard in accordance with an embodiment of the invention. The process 100 includes the steps of providing a plurality of corrugated cardboard pieces (step 105) and sorting the cardboard by its thickness, color, size, and/or flute pattern (step 110). The sorted cardboard may be held together with, e.g., an adhesive, and the cardboard may be trimmed (step 115) to form a raw generally consistently-shaped material, i.e., a rough block 120. The thickness of the rough block 120 may be dictated by downstream processing equipment, such as milling or cutting equipment, dimensional limitations. The process 100 may include saturating (step 125) the rough block 120 with an impregnating agent, such as a penetrating sealer, to form a working block 130. A desired geometric shape may be determined (step 135), and the working block 130 may be milled along exterior dimensions and/or cut (step 140) to form a finished block 145 with the desired geometric shape. The finished block 145 may then be sliced (step 150) at a predetermined angle to the direction of the flutes of the cardboard pieces into slices, typically having a consistent thickness to create a plurality of substantially identical tile components 155. At least a portion of the tile components 155 may be adhered together (step 157) to define a corrugated component 159. A mold may be provided (step 160) and a coating material 162, for example, a thin layer (e.g., 3 mm) of two-part epoxy, may be poured into the mold (step 165). The corrugated components 159 may be placed in the coating material 162 disposed in the mold (step 170) to create an outer layer component 172 on the corrugated components 159 and secure them together. In one embodiment, the outer layer component 172 may include one or more layers of one or more coating materials 162. The outer layer component 172 may also include materials other than coating material 162 and cardboard. Such materials may be transparent or translucent and adhered between or on top of the one or more layers of coating material 162. Once the coating material 162 has cured, the corrugated components 159 may be removed from the mold and excess coating material 162 may be trimmed (step 175) from the corrugated components 159 to form a translucent building material, e.g., a translucent corrugated tile 180. Multiple translucent corrugated tiles 180 may be produced in this manner and, by using a suitable tailored geometry, tiles 180 may be used in various nested patterns to cover at least a portion of a surface 185 of any shape or size. The surface 185 may be, for example, a floor, a wall, a roof, a lighting installation, an architectural construction element, an architectural aesthetic element, and/or a solar panel.

In another embodiment, some tiles 180 may have several layers of corrugate.

Figure 3:
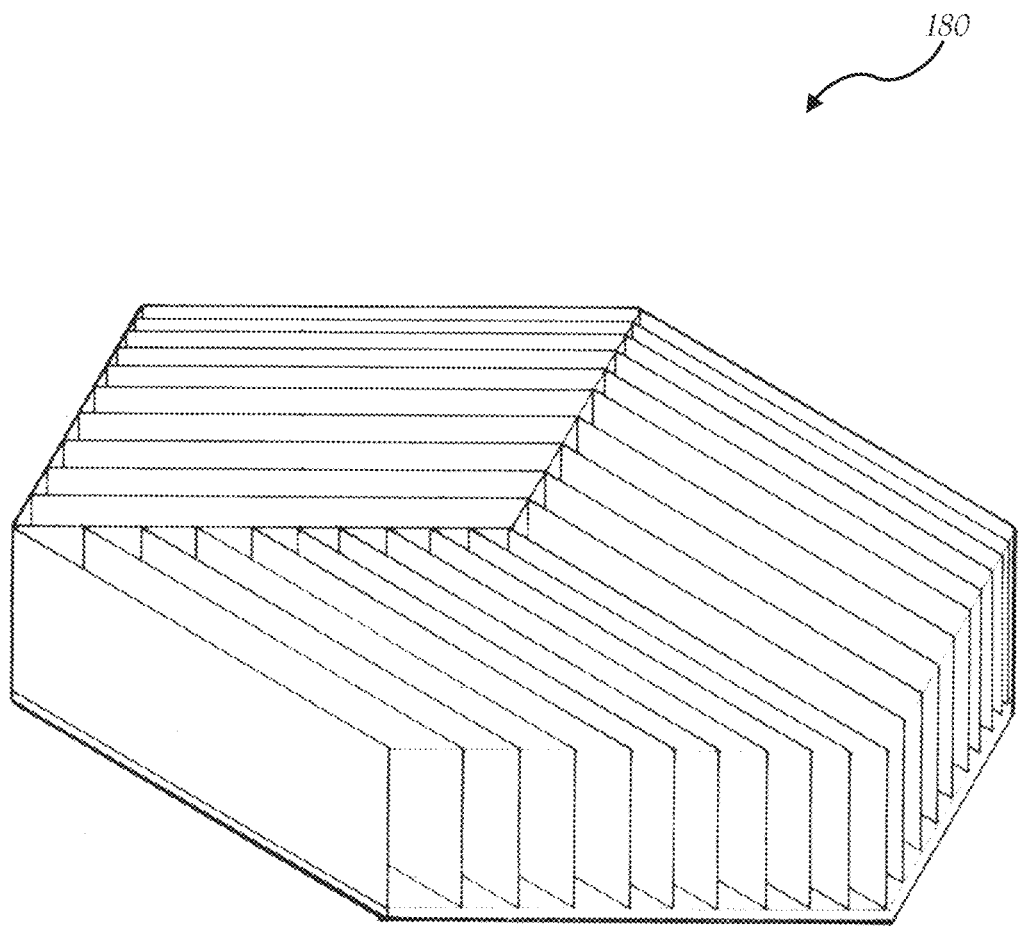
FIG. 3 is a schematic perspective view of a translucent, hexagon-shaped tile defined by three rhombi-shaped tile components and one outer-layer component, in accordance with an embodiment of the invention.

The process illustrated in FIG. 1 may be used to form a hexagonally shaped translucent tile 180, as seen in FIG. 3.

The translucent tile 180 contains a pattern of flutes 400, as shown in FIGS. 4a-4c. A piece of corrugated cardboard contains a fluted corrugated sheet 405 and one or two linerboards 410. The fluted corrugated sheet 405 is typically positioned between two linerboards 410, and the shape of the fluted corrugated sheet 405 defines the flutes 400. By varying a thickness $T_c$ of the cardboard pieces, numerous patterns and various light textures may be attained.

Each of the steps will now be discussed in greater detail. The providing step 105 may include gathering cardboard. Generally, any type of cardboard or corrugated material may be used, including old corrugated cardboard. Because old corrugated cardboard is an overly abundant raw material, it may be collected from a number of different sources. The cardboard may be gathered by, e.g., collecting cardboard locally house-to-house, as well as picked up in bulk from local businesses.

The sorting step 110 may include sorting cardboard by, e.g., thickness, color, size, and flute pattern. Preferably, straight and dry pieces are selected. Further separation may include sorting and arranging the corrugated cardboard pieces by piece size and flute direction.

After the cardboard is gathered and sorted, it may be initially trimmed. The trimming may include cutting off the rough edges of the cardboard, as well as removing stitches, flaps, damaged areas, and other irregularities such as packaging tape or other foreign matter, and also cardboard that has been treated with any parrafinated waxes. These irregularities may interfere with the layering process.

Referring to FIGS. 5a-5c, a rough block 120 is defined by holding together and trimming (step 115) a plurality of corrugated cardboard pieces 505 (also referred to herein as "cardboard sheets"). In particular, once the sorting is complete, the cardboard pieces may be stacked face to face with each other, preferably (but not necessarily) with the flutes of each cardboard piece being aligned in a common direction 510. In some embodiments, for example for lighting effects applications, having all flutes oriented in the same direction within a working block 130 may not be preferable. For example, the flutes in adjacent pieces may be oriented at about 30 degrees, about 45 degrees, about 60 degrees, or about 90 degrees to one another. In other embodiments, the flute orientation may alternate from one sheet to the next or vary in a sinusoidal or other pattern from one side of the stack to the other. The flute direction 510 is an important factor in the formation of the translucent material described herein.

The cardboard pieces 505 may be individually cut such that a plurality of pieces have approximately the same dimensions. For example, a first cardboard sheet may be cut to an approximate size of the rough block 120. Then the edges of the first sheet of cardboard may be cut at a desired angle 515 with respect to the direction 510 of the flutes 400. In an embodiment of the invention, the angle is 90°; however, any angle may be used. Additional cardboard pieces 505 may be cut to align with the first sheet of cardboard, and the sheets of cardboard may be held together by any suitable method (e.g., adhesive, mechanical changes or fasteners, etc.).

A rigidifying component may be held next to or adhered to at least one of the plurality of corrugated cardboard pieces. The rigidifying component may be a top or bottom layer, or it may be disposed anywhere in the middle of a stack of cardboard pieces. The rigidifying component may be included to, for example, provide additional strength to the finished product, or facilitate its installation by providing an alternative surface, or it may be used as a design feature for either aesthetic purposes, or to act as a marker in further processing or in use. The rigidifying component may also be used to receive light (e.g., with photovoltaic materials), emit light (e.g., with light emitting diodes or other light sources, such as bioluminescent devices), and/or conduct heat or electricity. The rigidifying component may be formed from various materials other than cardboard, such as metal, plastics, rubber, wood, etc.

Referring to FIGS. 5b and 5c, the corrugated cardboard may be adhered together with an adhesive, i.e., thin layers of adhesive may be applied between sheets of cardboard, i.e., as a layer-to-layer adhesive, to stabilize the stack during further processing. In one preferred embodiment, a cyanoacrylate adhesive is used, e.g., STICK FAST™ Instant CA Adhesive, available from Rockler, based in Medina, Minn. This instant adhesive bonds fibrous cardboard together, allowing the application of thin layers of adhesive. For applications requiring a more flexible corrugated component 159, a different layer-to-layer adhesive may be used to attain a more flexible rough block 120, i.e., an emulsion-based adhesive such as Lineco neutral pH acid-free adhesive available from Lineco, based in Holyoke, Mass. Emulsion-based adhesives may be very slightly diluted with water (e.g., about 3-7%), to facilitate the absorption of the adhesive by the cardboard deep into its fibers and to extend the working time of the adhesive, as well as to allow the creation of a thinner layer of the inter-layer adhesive. Other adhesives may be used, including wood glue, an aliphatic resin such as TITEBOND® II or TITEBOND® III, manufactured by Franklin International in Columbus Ohio. or an all-purpose glue, such as diluted GLUE-ALL®, manufactured by Elmer's Products, Inc., based in Columbus, Ohio.

In an embodiment, reducing the space between adhered cardboard sheets 505 by applying thin consistent layers of the adhesive may allow an impregnating agent that is subsequently added to the rough block 120, as described below, to bond both to the adhesive and to the cardboard, thereby creating a bonding bridge, including the adhesive layer, between the cardboard layers. Applying thin, rather than thick, layers of adhesive may help prevent the formation of air pockets, etc. Such inconsistencies may compromise the integrity of the final surface or the structural integrity of the finished product.

Referring to FIG. 5b, a light clamp 520, e.g., a weight, may be applied every few layers during the stacking of the cardboard pieces 505 to thin out the applied layers of adhesive in the rough block 120, as well as to flatten the cardboard, when necessary. The time interval between the applications of the clamp 520 preferably corresponds to the working time of the adhesive. For example, for an instant adhesive such as STICK FAST™ Instant CA Adhesive, the clamp 520 may be applied after about eight to about 15 seconds of adding cardboard pieces 505 to the stack of cardboard pieces 505. The clamp 520 may be applied to the stack for at least about 30 seconds. For a slower drying adhesive, such as a Lineco neutral pH acid-free adhesive, the clamp 520 may be applied after about four to about five minutes of adding cardboard pieces 505 to the stack of cardboard pieces 505. The clamp 520 may be applied for about 30 to about 60 minutes. Once the rough block 120 has been formed, it may be desirable to allow the adhesive to cure for at least about 12 hours before the rough block 120 is further processed.

The light clamp 520 may be, for example, a flat and heavy material, such as a thick piece of glass or a piece of metal. Preferably, the clamp is large enough to cover the entire rough block 120. In one embodiment, the rough block 120 is formed upon a level surface 525 to help evenly distribute the pressure created by the clamp 520, thereby facilitating the formation of a rough block 120 having approximate but consistent dimensions with uniform layers. In another embodiment, one or more weights may be placed on top of the clamp to provide sufficient clamping pressure. Excessive weight may crush or damage the materials.

Regardless of the type of adhesive that is applied, the adhesive is preferably applied layer by layer. The adhesive may be applied by, e.g., squeezing a tube of adhesive by hand, preferably in a systematic pattern. Other methods for adhesive application include spraying the adhesive, applying the adhesive directly from a glue bottle, rolling the adhesive onto the cardboard, or brushing the adhesive onto the cardboard. In a high volume production environment, adhesive may be applied in the form of a mist. Preferably, the adhesive used in the layering process to form the rough block 120 is selected so that it does not interfere with the subsequent saturation step 125.

The size of the cardboard pieces, i.e., length and width, that are used to form the rough block 120 may have a wide range, limited primarily by the available work space and/or storage space, e.g., volume capacity of the manufacturing facility. Thus, very small pieces, e.g., length and width of less than 1" or very large pieces, e.g., length and width of greater than 5 yards, may be used. Rough blocks 120 may be sized to improve process control, and to enhance the efficiency of the manufacturing process. Clamping large pieces, such as 5 yard×5 yard pieces, requires handling a clamp of appropriate dimensions, making process control more challenging. For example, rough blocks 120 may be mass-produced by slicing cardboard into the longest possible strips, e.g., 3 feet, 4 feet, or 6 feet, depending on the application, and then slicing the long rough blocks 120 into individual smaller rough blocks 120. Alternatively or additionally one or more layers may include a plurality of discrete pieces of corrugated cardboard in a predetermined or random pattern.

Referring to FIGS. 6a and 6b, the rough block 120 may be trimmed with a table saw 600 using a miter slide 605 on a table 610 along trimming lines. In some embodiments, a miter saw 615 may be used to trim the rough block 120. Referring also to FIG. 6b, the edges of the rough block 120 may be trimmed such that all sides of the rough block 120 form right angles with each other. The rough block 120 may be trimmed with a miter saw 615, commonly known as a chop saw. A suitable miter saw is a 12 inch compound miter saw, model number MS 1250LZ, manufactured by Ridgid, a division of Emerson based in St. Louis, Mo. The process of trimming all sides of the rough block 120 at 90° in relation to each adjacent surface of the block may also be referred to as "squaring" the block. If the rough block 120 is not squared-off properly, slicing up the finished block 145 into consistently sized tile components 155 (discussed below) may be difficult.

A thickness $T_r$ of the rough block, as referred to herein, is defined by the height of stacked layers of cardboard and corresponds to a height (H) of tile components 155 that are eventually made from the rough block 120 (see below). A maximum practical thickness of the rough block 120 is determined by the limitations of the equipment that is to be used to trim the rough block 120 into a finished block. A rough block 120 that is too thick to be cut by the equipment has a thickness $T_r$ that exceeds the maximum practical thickness that may be cut with that equipment. On the other hand, a rough block 120 having a thickness $T_r$ that is less than the maximum practical thickness may, in addition to being easier to cut, be desirable for aesthetic or structural reasons.

In an embodiment, a 10" JET® table saw 600 manufactured by Walter Meier Manufacturing Americas, based in LaVergne. Tenn., may be used; the use of this particular saw limits the thickness $T_r$ of the rough blocks 120 to a maximum of about 3.5", i.e., the distance that the blade extends above the table top. Further, if the miter slide 605 is utilized, the blade of the table saw 600 may cut a thickness of only about 3" because the thickness of the miter slide carriage may be about 0.5", thereby reducing the amount of the blade that is exposed. However, by mechanizing the process and using more powerful and industrial-sized equipment, thicker rough blocks 120 may be trimmed. The miter slide 605 may be used with the table saw 600 to accommodate cutting of blocks with smaller dimensions or to gain maximum consistency during the cross cutting, or slicing, of the blocks. A suitable miter slide 605 is, e.g., INCRA Miter Express, manufactured by Taylor Design Group, based in Dallas, Tex. The rough block 120 being trimmed and squared on a miter saw 615 may be seen in FIG. 6b.

Without the miter slide 605, the table saw 600 is typically used for cutting in a direction parallel to the flutes 400. The miter slide 605 facilitates cutting across the flutes 400. Cutting across the flutes may be necessary or desirable when, for example, slicing a finished block 145 into tile components 155 or forming a finished block 145 with a flute direction 510 that is not perpendicular to one of the faces of the block. Proper accessories for the equipment are preferably utilized.

Choosing appropriate equipment for the machining of the rough block 120 may take into account safety considerations. If the rough block 120 is long, it may be cut on the table saw 600 without using the miter slide 605. If the dimensions of the rough block 120 are short, then for the sake of safety, the miter slide 605 or miter saw 615 may be preferred for cutting the rough block 120 into an appropriate geometric shape. The miter saw 615 may be preferred when trimming or squaring blocks that are so short that trimming with the table saw 600 may be cumbersome. For example a RIDGID® miter saw may be capable of mitering 4"×8"

beams. Accordingly, this means that it is capable of trimming and squaring rough blocks 120 that are 8" cubes, although more than one cut may be required to achieve cubes of this size. The miter slide 605 clamps the rough block 120 to the carriage of the slide 605 as it is run through the table saw 600. By clamping the rough block 120 to the carriage, the slide 605 prevents kick-back on the table saw 600 and thereby may increase safety. The use of the miter slide 605 may provide other benefits, e.g., helping to achieve machining consistency, especially when many precision cuts have to be made. It is also important for the table saw 600 to be electrically grounded, as cutting of the rough blocks 120 may create excess static electricity, which is preferably taken into consideration in high volume production.

Referring to FIG. 7, during the saturating step 125, the rough block 120 is saturated with an impregnating agent 705. As used herein, "saturate" means to impregnate with an impregnating agent the fluted corrugated sheets 405 and the linerboards 410 of the corrugated cardboard. The rough block 120 may preferably be stood upright on a protective layer 710 disposed on a level surface with the flutes 400 having a direction 510 aligned with vertical, i.e., approximately perpendicular to the level surface. The protective layer 710 is preferably formed from an inert material that does not adhere to the impregnating agent 705, e.g., a thin sheet of lexon glass, or any other material with a waxy surface. If a mold is formed from a material to which cardboard/impregnating agent may stick, e.g. metal, spraying the mold with an appropriate release agent, e.g., silicone spray, may help ensure that the rough block 120 may be easily extracted from the mold. In one preferred embodiment, GRAFIX® clear acetate, 0.005" thickness, may be used. The use of an inert material helps ensure that the working block 130 may be easily removed from the level surface after the impregnating agent 705 has cured. A border 720 may be disposed on the protective layer to help prevent run-off of excess impregnating agent 705. The border 720 may be, e.g., a frame made from any material having a sufficient thickness to contain the spreading of excess impregnating agent 705.

An adhesive tape 725 may be wrapped around the rough block 120 to reduce run-off of the impregnating agent 705 and to reduce any clean-up that may be required. A suitable adhesive tape 725 may be, for example, a clear polyurethane tape, e.g., SCOTCH® clear packaging tape manufactured by 3M, based in St. Paul, Minn., or a painter's masking tape such as SCOTCH-BLUE™ painter's tape manufactured by 3M.

The impregnating agent 705 may be introduced into the flutes 400 of the rough block 120 to fully saturate the rough block 120. The saturation of the rough block 120 may be achieved by various methods. For example, the impregnating agent 705 may be poured from a container 730 into the rough block 120 at atmospheric pressure, using gravity as the force to propel the impregnating agent through the rough block 120. The saturation step 125 may use pressure, in addition to gravity, to force the impregnating agent 705 down through the flutes 400. Pressure may be applied by blowing air from a compressor via a hose into the flutes 400, forcing the impregnating agent 705 therethrough. The use of vacuum, e.g., partial vacuum, typically accelerates the saturation process. Thus, after the impregnating agent 705 is introduced into the flutes 400 at a first end of the rough block 120, a vacuum may be applied to the flutes 400 at an opposing end of the rough block 120 to help draw the impregnating agent 705 through the rough block 120. Saturation may be improved by, e.g., diluting the impregnating agent 705 to reduce its viscosity and facilitate its flow and wetting of the cardboard. To ensure adequate saturation, it may be desirable to (i) introduce an abundant amount of impregnating agent 705 and (ii) force excess impregnating agent out of the rough block 120 with pressure and/or vacuum. In another embodiment, the impregnating agent 705 may be introduced by dipping the rough block 120 into a bath of impregnating agent 705 and rotating the rough block 120, as needed, to saturate the entire block. Centrifugal processes may also be used.

A suitable impregnating agent 705 is a penetrating sealer that is a three-dimensional polymer capable of bonding with a coating material 162, as discussed below. Preferably, the impregnating agent 705 is mold-resistant, has a low viscosity, is not flammable, and is a three-dimensional polymer network with step growth possibilities. A three-dimensional polymer network with step growth possibilities allows for the outer layer component 172 (discussed below) to adhere without machining or otherwise preparing the surface of a corrugated component 159 (discussed below), while creating a covalent bond between the corrugated and outer layer components 172. The viscosity of the impregnating agent 705 may be a limiting factor in the practical length of the rough block 120 that may be used. In particular, the impregnating agent 705 preferably fully saturates the rough block 120, and is able to travel at least halfway through the rough block 120 from opposing sides. In some embodiments, a desired viscosity of the impregnating agent 705 may be attained by the use of pressure and/or vacuum, i.e., a thixotropic fluid, may be desired, to enable saturation of rough blocks 120 with various dimensions with the same impregnating agent 705.

In some embodiments, a suitable impregnating agent 705 may be a two-part epoxy including a bisphenol A/epichlorohydrin-based epoxy resin and an aliphatic amine adduct hardener, such as 103-LVX EPO-STEEL epoxy low viscosity epoxy resin and part 2 hardener, manufactured by FASCO Unlimited of Hialeah, Fla. The material safety data sheet (MSDS) for this two-part epoxy is hereby incorporated by reference in its entirety. The hardener for this epoxy is an aliphatic amine adduct. This two-part epoxy may be thinned with acetone to achieve very low viscosity, thereby ensuring good saturation. It may also be flash cured by raising the surrounding temperature to, e.g., 120° F. Flash curing may increase the time-efficiency of a production process by accelerating the rate of curing.

Another suitable two-part epoxy that may be used as an impregnating agent 705 includes a first part that is an epoxy resin including bisphenol A/epicholorohydrin resin and aliphatic and aromatic glycidl ethers, such as ENVIROTEX LITE Resin, and a second part that is a hardener, e.g., a clear epoxy hardener containing nonyl phenol, n-aminoethylpiperzine, and polyoxyalkyleneamines, such as ENVIROTEX LITE Hardener, both manufactured by Environmental Technology, Inc., based in Fields Landing. Calif. This material allows for the formation of relatively more flexible corrugated components 159. The MSDSs for this two-part epoxy are hereby incorporated by reference in their entireties. The ENVIROTEX LITE system is preferably used in non-structural interior applications, such as lights or architectural aesthetic detailing, because, in contrast to various other two-part epoxy systems, the ENVIROTEX LITE system may react with water.

Yet another suitable two-part epoxy that may be used as a impregnating agent 705 is the WEST SYSTEM® 105™ Epoxy Resin (including bisphenol-A type epoxy resin, benzyl alcohol, bisphenol-F type epoxy resin and ethylene glycol monobutyl ether) in combination with a less viscous hardener to penetrate the corrugated component 159, such as WEST SYSTEM® 205™ Fast Hardener [polyethylenepolyamine, reaction products of TETA with phenol/formaldehyde, triethylenetetramine (TETA), hydroxybenzene, reaction products of TETA and propylene oxide, and tetrathylenepentamine (TEPA)] or the WEST SYSTEM® 209™ Extra Slow Hardener (TOFA, reaction product with TEPA, polycycloaliphatic amine, polyoxypropylenediamine, isophorone diamine, 4,4'-methylenebiscyclohexane, tetraethylenepentamine, benzene-1,3-dimethanamine, and modified amine) manufactured by West System Inc., Bay City Mich. The MSDSs for these materials are hereby incorporated by reference in their entireties.

In use, the two parts of two-part epoxies are mixed together and applied to the rough block 120. In addition to two-part epoxies, other suitable impregnating agents 705 include, for example, a penetrating sealer such as polyaspartic polyurea, silicates, siliconates, plant-based resins, and combinations thereof. An example of a polyaspartic polyurea is Corian® commercial solid surface, available from DuPont Surfaces, Wilmington, Del. Suitable penetrating sealers (e.g., silicates or siliconates) are typically rigid, water-tight with low water permeability, and heat resistant.

Polyaspartics are based on the reaction of an aliphatic polyisocyanate and a polyaspartic ester, which is an aliphatic diamine. Polyaspartics are also two-part systems, but typically have much quicker reaction times than two-part epoxies; their application, therefore, may require special spray equipment.

Various two-part epoxies were tested as impregnating agents 705, with most of them providing a similar final outcome in terms of degree of impregnation and adherence to a coating material 162. The differences in properties were mostly in terms of cost, toxicity, working time, and pliability after the curing has occurred.

The combination of even pouring and a level surface helps allow for even absorption of the impregnating agent by the rough block 120. Depending on the size of the rough block 120, the saturation step 125 may be repeated until the rough block 120 is sufficiently saturated, i.e., the impregnating agent may be applied multiple times to the rough block 120 to achieve proper epoxination. Preferably, the rough block 120 is fully saturated by the impregnating agent throughout, with no voids anywhere in the rough block 120 or air pockets, e.g., between cardboard layers. As used herein, full saturation means that substantially all of the cardboard, i.e., all of the flutes 400 and linerboards 410 in the rough block 120 are saturated with the impregnating agent, but the spaces defined by the flutes 400 are not filled. In the case of oversaturation, the spaces defined by the flutes may be at least partially filled. This oversaturation may compromise the consistency of the tiles 180 as well as interfere with the slicing of the finished block 145 into tiles 180 and tile components 155 (discussed below).

In some embodiments, extra impregnating agent that accumulates near the bottom of the rough block may be used to form an outer layer component (described below). For example, when excess impregnating agent is added during the saturation step, it may tend to pool up near the bottom of the cardboard materials. Once this layer of extra impregnating agent dries or cures, it forms an outer layer on the cardboard. In this way, the impregnating agent may be used to both saturate the cardboard and create the outer layer component.

During the saturation step 125, portions of the rough block 120 saturated by the impregnating agent typically become darker than surrounding, non-saturated areas. Discoloration of the working block 130 by the impregnating agent enables one to determine the degree of saturation.

For example, if lighter, non-saturated areas are visible, additional impregnating agent may be added until the rough block 120 is uniformly darker and fully saturated. Prior to the introduction of the impregnating agent, rough blocks 120 typically have a generally uniform color.

Once the rough block 120 has been saturated with the impregnating agent 705 and squared on all sides, it may be referred to as the working block 130. The desired level of saturation may vary depending on the intended application. Over-saturation occurs when spaces defined by the flutes 400 get fully or partially filled with excess impregnating agent. Over-saturation is generally avoided, as cutting cured epoxy may dull cutting tool blades, especially ones designed primarily for wood cutting. Alternatively, a specialized blade designed for cutting hard laminates and plastics may be used with the table saw 600. For example, a 10" coated solid surface blade, manufactured by Freud in Italy, may be used. Another suitable blade is Freud LU94M010 10-Inch 80 Tooth MTCG Plexiglass and Plastic Cutting Saw Blade with ⅝-inch arbor. These are specialty blades that may be used when cutting epoxinated blocks and/or tiles 180 that have an outer layer component 172 made from, for example, hardened epoxy and/or plexiglass. These fine-toothed blades are also suitable for cutting cardboard, even if it is not epoxinated, because the blades are designed to cut off little pieces as the blades go through the material, thereby helping prevent cardboard from being shredded.

In some embodiments, it may be desirable to fill partially or fully spaces 800 defined by the fluted sheet 405. Referring to FIG. 8, a diagram illustrating a detailed view of a tile component 155 with spaces 800 between the fluted sheet 405 and liner boards filled with an expanding polymer may be seen. This may be achieved by, e.g., using an impregnating agent 705 that is an expanding polymer, such as BAYSEAL™ OC open-cell spray polyurethane foam insulation or BAYSEAL™ CC closed-cell spray polyurethane foam insulation, manufactured by Bayer Material Science AG, based in Leverkusen, Germany. This product is typically used as a green, VOC-free, non-flammable wall insulation. Due to the relatively quick set times of these products, it may be desirable to apply these products using a method other than spraying. For example, a first component of an expanding polymer product may be applied by dipping a working block into a bath of the first component while maintaining the flute direction 510 approximately perpendicular to the surface of the bath. A second component of the expanding polymer product may then be poured into the spaces 800 from the top of the block. When the first and second components of the expanding polymer product combine with one another, the product expands through the block to fill the spaces 800 between the fluted sheet 405 and liner boards. Once the spaces 800 are filled, then the corrugated structure attains greater rigidity, with potentially lower translucency.

During the saturation step 125, the sponge-like absorbent qualities of cardboard are utilized. Because of the extremely high permeance values of the corrugated cardboard component, absorption of an appropriate impregnating agent creates a continuous bond on a molecular level. Such bond may also be referred to as a covalent bond.

Referring to FIG. 9, an exemplary working block 130 is illustrated in detail. Typically, a working block 130 includes a number of cardboard pieces of the same size, saturated by an impregnating agent. The flutes in the cardboard extend from one face to an opposing face and are typically aligned in the same direction 510. In this embodiment, each face of the working block 130 is parallel to an opposing face, and perpendicular to all adjacent sides of the working block 130. Light may travel through flutes connecting opposing end faces.

Referring to FIGS. 10a and 10b, a working block 130 may be cut 140 by, e.g., using a combination of a miter saw and a table saw to form finished blocks 145 having appropriate geometric shapes for the intended application. Tile components 155 (see below) may subsequently be prepared from the finished block 145 with dimensions and thickness of any desired size. A possible cutting schedule of a working block 130 may be seen in FIG. 10a, in which finished blocks 145 having cross-sections in the shape of a triangle, a rhombus, and a trapezoid are formed from a single working block 130. The embodiment in FIG. 10b shows a working block 130 being cut into a rhombus and a remainder shape, but any number of different shapes may be derived from a single working block 130.

Referring to FIGS. 10c and 10d, a surface 1010 of the finished block 145 is intersected by the flutes 400. The flute direction 510 and the surface 1010 of the finished block 145 define an angle α. When the flutes 400 are perpendicular to the surface 1010, the angle α is 90 degrees. When the flutes 400 are not perpendicular to the surface 1010, the angle α is less than 90 degrees. The magnitude of the angle α may be determined at one or more cutting and trimming steps within the process 100. For example, the angle α may be defined by trimming one or more cardboard sheets at a desired angle with respect to the flute direction 510 prior to holding and trimming (step 115) the sheets to form the rough block 120. In another embodiment, the angle α may be defined by trimming (step 115) a stack of cardboard sheets at a desired angle to form the rough block 120. In a further embodiment, the angle α may be defined by milling or cutting (step 140) the working block 130 at a desired angle to form the finished block 145.

As shown in FIGS. 11a, 11b, 12a, and 12b, the working block 130 may be milled and/or cut 135 into finished blocks 145 having appropriate prismatic, contoured, or other geometric shapes for the intended application. FIGS. 11a and 11b show a variety of shapes that may be derived from a working block 130, including finished blocks 145 having cross-sections in the shape of a triangle, a square, a rectangle, a pentagon, a hexagon and a circle. FIG. 12a shows a schematic diagram of a rhombus shaped finished block 145.

Referring to FIG. 12b, it may be desirable to adhere two or more finished blocks 145 together before they are sliced (step 150) into tile components 155. The block formed by adhering two or more finished blocks 145 together may be referred to as a finished combo-block 1200. In some embodiments, a finished combo-block 1200 may undergo additional saturation (step 125) with impregnating agent 705. It may be preferable to use the same impregnating agent 705 as was used to saturate the individual working blocks in order to achieve complete saturation. In other embodiments, it may be preferable to use a different impregnating agent 705 to, for example, create desirable textures or patterns within a translucent tile 180. The adhesive used to form the finished combo-block 1200 from the finished blocks 145 may be, for example, a cyanoacrylate adhesive, such as STICK FAST™ Instant CA Adhesive (available from Rockler, Medina, Minn.), or SUPER 77® spray adhesive (manufactured by 3M).

Referring to FIGS. 12c and 12d, finished blocks 145 may include a rigidifying component 1205 disposed upon a face. The rigidifying component 1205 may be, for example, part of the mold 1700. Referring to FIG. 12e, a composite finished block 1210 may include the rigidifying component 1205 disposed between two finished block 145 components. The rigidifying component 1205 is generally a sheet or a portion therof made of a material that is stiffer than corrugated cardboard, such as plastic, carbon fiber, wood, metal, glass, and/or non-corrugated cardboard. Use of the rigidifying component 1205 may therefore improve the structural rigidity of the finished block 145, tile component 155, and/or tile 180.

Referring to FIG. 12f, finished blocks 145 that are thicker than the maximum practical thickness (i.e., the thickness that may be cut with available machining equipment) may, in effect, be created by stacking two or more blocks together. These stacked arrangements allow larger tile components 155 to be created during the slicing step 150. Larger rough blocks 120 and/or larger working blocks 130 may also be created by stacking blocks in this manner, for example to create a block having a thickness of $3T_r$ from three blocks each with a thickness of $T_r$.

Referring to FIG. 13, a finished block 145 is sliced (step 150) at a predetermined angle to the direction of the flutes into slices having a consistent thickness to define a plurality of uniform tile components 155. The finished block 145 may be sliced into tile components 155 of the same or different thicknesses.

In another embodiment, the tile components 155 are produced directly from the working block 130 rather than from the finished block 145. For example, depending upon the shapes and sizes of the cardboard pieces used to form the working block 130, it may not be necessary to machine the working block 130 into a finished block 145 before it is sliced into the tile components 155. Specifically, if the working block 130 is formed from pieces of cardboard having the same or otherwise desired dimensions, further machining before the tile components 155 are created may not be necessary. With this approach, the working block 130 may be processed into tile components 155 using the same methods described herein for the finished block 145. In some embodiments, depending upon the materials and equipment used, this approach may be more efficient. In other embodiments, however, the tile components 155 may be of better quality (e.g., have more precisely defined edges) when they are produced from the finished block 145 rather than from the working block 130.

Improper expoxination of the rough block 120 may become apparent during the slicing (step 150) of the finished block 145 into tile components 155, e.g., a blade may not cut an underepoxinated finished block 145, but rather rip the cardboard of the finished block 145, creating a rough cut and partially blocking spaces defined by the flutes. When this occurs, the slicing may preferably be temporarily interrupted and the saturation 120 step repeated with the underepoxinated finished block 145. Once the finished block 145 has cured, the slicing into tile components 155 may resume. Clean cuts and sharp edges defined by the flutes may be preferable in some embodiments, since a clean cut intersecting the flutes leaves the flutes fully open, improving their visual appearance for various applications. Having open spaces 800 between the flutes 400 also allows for complete filling of these spaces 800, which may be preferred in some embodiments.

The corrugated component 159 may be produced by arranging one or more tile components 155 in a desired geometry and holding them together along respective abutting edges. A plurality of tile components 155 may be adhered together with, e.g., a cyanoacrylate adhesive such as STICK FAST™ Instant CA adhesive, available from Rockier, based in Medina, Minn., to form a corrugated component 159 having a geometric pattern. In some embodiments, the corrugated component 159 may include a single tile component 155.

One or more tile components 155 may have one or more sides covered with the outer layer component 172. Referring to FIGS. 17a and 17b, the outer layer component 172 may be created as follows. The step in which the outer layer component 172 is created may be referred to as "texturization" of the tile component 155. The texturization of the tile component 155 turns the somewhat pliable delicate material of the tile component 155 into a rigid translucent sealed tile 175. A mold 1700 may be set up on a level surface 1705 to serve as a receptacle for the coating material 162. The mold 1700 may be covered by a protective layer 1710 composed of, e.g., LEXAN® or a material with similar qualities, i.e., having a waxy surface, to facilitate easy removal of the tile component 155 from the mold 1700. The level surface 1705 is preferred for this step because of the self-leveling characteristics of the coating material 162.

At least a portion of the corrugated component 159 is placed into the coating material 162 in the mold 1700. The coating material 162 may be cured to create the outer layer component 172 having a texture of the mold 1700. The corrugated component 159, with the cured coating material 162, may be removed from the mold, and the excess coating material 162 may be removed to create a translucent tile 180.

The coating material 162 may cure by, for example, polymerization, and the outer layer component 172 may be a cross-linked polymer. Curing may be accelerated by flash curing, e.g., exposing the coating material 162 to heat. For example, the corrugated component 159 and coating material 162 may be heated together to about 125° F. in an oven. Flash curing is preferably used with coating materials that cure by condensation polymerization, e.g., 103-LVX EPO-STEEL epoxy resin.

Proper placement of the corrugated material in the mold 1700 is relevant. For example, it may be desirable to place a light clamp or weight on top of the corrugated component 159 for the duration of the cure. The weight may facilitate the penetration of the coating material 162 into the corrugated component 159 so that the outer layer component 172 extends into interior portions of the corrugated component 159. The weight may also prevent the corrugated component 159 from warping due to, for example, humidity. A warped corrugated component 159 may be unusable as a building material, but may be suitable for other aesthetic purposes.

This texturization process may be repeated on the same face to form a tile 180 with a multi-layered outer component 1800. A detailed view of a tile 180 with a multi-layer outer component may be seen in FIGS. 18a-18c. This process may be repeated on an opposite face of the same tile 180 to form a second outer layer component 172'. A detailed view of a tile 180 with two outer-layer components may be seen in FIG. 18c. In one embodiment, a layer of air or other insulating material is placed between two outer layer components to increase the thermal resistance of the tile 180. Similarly, a solar panel may be placed between two outer layer components.

FIGS. 18d-18f depict detailed cross-sectional views of the corrugated component 159 during the creation of the outer layer component 172. The protective layer 1710 prevents the corrugated component 159 from adhering to the mold 1700. The protective layer 1710 is positioned between the corrugated component 159 and the mold 1700.

Referring to FIG. 18d, the protective layer 1710 may be positioned between the corrugated component 159 and a side wall 1810 of the mold 1700. The protective layer 1710 prevents the coating material 162 from adhering the corrugated component 159 to the mold side wall 1810. The mold side wall 1810 may be made of, for example, any rigid material, such as carbon fiber, wood, cardboard, metal, and/or glass. In the depicted embodiment, the coating material 162 penetrates into interior portions of the corrugated component 159.

In other embodiments, the coating material 162 is used to attach the mold 1700 and/or mold side wall 1810 to the corrugated component 159. This may be achieved, for example, by removing the protective layer 1710 so that the corrugated component 159 is placed directly onto the mold 1700. Without the protective layer 1710, the coating material 162 is able to reach the mold and, depending on the mold materials used, may adhere the mold 1700 to the corrugated component 159. Molds 1700 made of, for example, glass, plastic, quartz, and/or photovoltaic materials may be attached to the corrugated component 159 in this manner. After the mold 1700 has been attached, it may be cut or trimmed to a desired shape and size using, for example, a glass cutter or a water pressure saw. In a similar embodiment, the mold 1700 may be attached to the working block 130 with the impregnating agent 705 during the saturation step 125.

Referring to FIGS. 18e and 18f, the rigidifying component 1205 may be adhered to the corrugated component 159 before, during, or after the creation of the outer layer component 172. Referring to FIG. 18e, during the creation of the outer layer component 172, in some embodiments, the rigidifying component 1205 and the corrugated component 159 may be adhered together with an adhesive and then placed into the coating material 162 together. In some embodiments, the coating material 162 may act alone as an adhesive between the rigidifying component 1205 and the corrugated component 159. Referring to FIG. 18f, the rigidifying component 1205 may be adhered to the corrugated component 159 such that the rigidifying component 1205 protrudes a distance $T_p$ from the surface of the corrugated component 159. Thus, the resulting thickness of the outer layer component 172 above the corrugated component 159 is approximately $T_p$.

Referring still to FIG. 18f, in some embodiments, the corrugated component 159 and the rigidifying component 1205 may be placed next to the mold side wall 1810. The mold side wall 1810, which may or may not become part of the tile 180, may help contain the coating material 162 during the creation of the outer layer component 172. Referring to FIG. 18e, in one embodiment, the mold side wall 1810 is adhered to the corrugated component 159, with an adhesive and/or with the coating material 162, and becomes a rigidifying component 1205 in the tile 180. In another embodiment, the mold side wall 1810 is not adhered to the corrugated component 159 and the mold side wall 1810 and corrugated component 159 are separated after the outer layer component 172 has been formed.

Referring to FIG. 19a, in some other embodiments, two layers of corrugated components 159 may be laminated to one another face-to-face to define a translucent tile 180. This allows a surface 185 to be covered with a multi-layered corrugated structure. The two layers of corrugated components 159 may be adhered together after the outer layer component 172 has been formed on each corrugated component 159. The outer layer component 172 provides a uniform surface area suitable for proper adhesion of the two layers. In various embodiments, the two layers of corrugated components 159 may or may not have matching geometric patterns and/or flute patterns.

Forming a tile 180 with multiple corrugated layers may provide additional strength and may enable multidimensional control of light flow through the tile 180. For example, a varying flute direction within the layers of the tile 180 may achieve a desired path for the light to flow through the tile 180. In an exemplary embodiment, a roof, window, or wall tile may prevent the passage of light from one source or direction and allow the passage of light from another source or direction.

Other methods may be used to achieve a multi-layered structure of the tile 180. In some embodiments, an inter-tile spacer 1900 defines a cavity between the two surfaces of two corrugated components 159. A detailed view of a translucent tile 180 defined by two layers of corrugated components 159 separated by the inner-tile spacer 1900 may be seen in FIG. 19b. The depth of the cavity may vary with the thickness TS of the inter-tile spacer 1900. The hollow space created by the spacer may be used for a specific function, e.g., for the insertion of a light source, a photovoltaic component, a fluid or gas, etc. The inter-tile spacer 1900 may be made of any material that provides the desired mechanical properties for the particular application. For example, the inter-tile spacer 1900 may be made of carbon fiber, wood, metal, glass, and/or cardboard. The inter-tile spacer 1900 may also be made of materials that provide a desired conductivity for the transfer of heat and/or electricity between the two corrugated components 159. For example, the inter-tile spacer 1900 may be made of a conductive material, such as metal, so that heat and/or electricity may easily flow between the two corrugated components 159. In another embodiment, the inter-tile spacer 1900 fills the space between the two corrugated components 159. Alternatively the inter-tile spacer (1900 and/or the hollow space may provide a thermal or electrical break.

The coating material 162 may be any material that provides a tile surface with desirable characteristics. Examples of characteristics that may be desirable, depending on the application, may be transparency, durability, recyclability, high tensile strength, shear strength, impact resistance, non-slip texture, and/or flexibility. In some embodiments, the coating material 162 is preferably a suitable matrix material for a function-specific additive, e.g., photovoltaic nanopolymers. Some exemplary materials that may be used as coating materials include thermosetting acrylics, thermosetting epoxies, polyamides, photocurable acrylics, polyaspartic polyurea, and combinations thereof.

Thermosetting epoxies may be one-part or two-part epoxies. Typically, the first part of the two-part epoxy is a resin and the second part of the two-part epoxy is a hardener.

In one preferred embodiment, the resin includes or is a bisphenol-A based epoxy resin. The first part of the epoxy may include, in addition, benzyl alcohol, bisphenol-F type epoxy resin, and ethylene glycol monobutyl ether. The hardener of the second part of the two-part epoxy may include a modified polyamine. A suitable modified polyamine may include polyoxypropylenediamine, reaction products of isophorone diamine with phenol/formaldehyde, isophoronediamine, reaction products of benzene-1,3-dimethanamine with hydroxybenzene and formaldehyde, hydroxybenzene, and m-Xylene diamine. A commercially available product in accordance with this embodiment is WEST SYSTEM® 105™ Epoxy Resin in combination with a hardener, such as WEST SYSTEM® 207™ Special Coating Hardener (polyoxypropylenediamine, reaction products of isophorone diamine with phenol/formaldehyde, isophoronediamine, reaction products of benzene-1,3-dimethanamine with hydroxybenzene and formaldehyde, hydroxybenzene, and m-Xylene diamine), manufactured by West System Inc., Bay City Mich.; the MSDSs for these materials are hereby incorporated by reference in their entireties. WEST SYSTEM® 207™ Special Coating Hardener is especially suitable for attaining a strong surface, at least because it has a high shear strength.

Because using a highly pliable epoxy may allow unnecessary movement of the tile surface, especially if the tile surface defines a vertical surface, in moderately hot climates epoxies with low pliability may be preferred, as high temperatures may cause undesirable shifts in the tile surface. Epoxies with low pliability typically have a high percentage of solids and a low percentage of volatile compounds, as the latter contribute to pliability. In a very cold climate, a tile 180 with a relatively more pliable outer layer component 172 may be used, because the tile 180 is unlikely to be exposed to high temperatures and, therefore, the risk of undesirable shifting movement of the tile surface is relatively low. An exemplary epoxy with low pliability is polyaspartic polyurea coating, which is 100% solids with no volatile components.

In another preferred embodiment, the resin includes a bisphenol-A/epichlorohydrin resin, and the first part of the epoxy further includes aliphatic and aromatic glycidyl ethers. The hardener of the second part of the two-part epoxy may be a clear epoxy hardener including nonylphenol, as well as polyoxyalkylencamines and n-aminoethylpiperazine. A commercially available product in accordance with this preferred embodiment is ENVIROTEX LITE—resin and ENVIROTEX LITE—hardener, available from Environmental Technology, Inc., based in Fields Landing. Calif. The MSDSs for these products are hereby incorporated by reference in their entireties.

Suitable polyamides include nylon-6,6 and nylon-6. In another preferred embodiment, the coating material 162 includes a polyamide as well as an additive. The additive may be, for example, a heat stabilizer, a light stabilizer, a lubricant, a plasticizer, a pigment, a nucleating agent, a flame retardant, and/or a reinforcing filler.

In some embodiments, heat stabilizers may be, for example, copper salts, phosphoric acid esters, mercaptobenzothiazole, mercaptobenzimidazole, and/or phenyl-β-naphthyl-amine. Light stabilizers may be carbon black and/or various phenolic materials. Self-lubricating grades of nylon may include lubricants such as molybdenum disulfide (0.2%) and graphite (1%). Plasticizers, such as a blend of o- and p-toluene ethyl sulfonamide, may be used to lower the melting point of the polyamide and to improve toughness and flexibility, especially at low temperatures. Suitable nucleating agents include silica and phosphorous compounds. Flame retardants may include various halogen compounds synergized by zinc oxide or zinc borate and phosphorous compounds. An example of a suitable flame retardant is DISFLAMOLL DPK, i.e., diphenyl cresyl phosphate, manufactured by Bayer AG, based in Leverkusen, Germany. Heat stabilizers may also be suitable for use as impregnating agents.

Reinforcing fillers may be, for example, glass fibers, glass beads, glass powder, and/or quartz.

The thermosetting epoxy may be a laminating epoxy or a surface-coating epoxy. In one embodiment, it may include a base and a converter. The base may include aliphatic polyamine, propoxyethanol, and acetic acid crystalline silica, and the converter may be an epoxy resin that is a reaction product of epichlorohydrin and bisphenol-A, aromatic hydrocarbon, and phenylethane. A material with this composition is DURA-POXY, available from Durall Industrial Flooring, based in Minneapolis, Minn. The MSDS for DURA-POXY is hereby incorporated by reference in its entirety. Dura-Poxy is a surface-coating epoxy that may be applied with a thickness as great as 10 mils. Another thermosetting epoxy may be a two-party epoxy including a waterborne epoxy, e.g., (i) a first part that is a combination of titanium dioxide, polyethylene, and polyamine isopropyl alcohol and (ii) a second part that includes bisphenol A diglycidyl ether resin. An exemplary material with this composition is DURASEAL 2489, a waterborne two-part concrete surface coating epoxy available from Pro-Chem, Inc., based in Alpharetta. Ga. The MSDS for DURASEAL 2489 is hereby incorporated by reference in its entirety. An example of a thermosetting epoxy that is a laminating epoxy is 103-LVX EPO-STEEL epoxy resin.

The coating material 162 may have a high percentage of solids, e.g., up to 100%. A coating material 162 that has a high percentage of solids has a low percentage of volatile organic compounds ("VOCs") and volatile inorganic compounds ("VICs") and, therefore, has a relatively low toxin concentration. An example of a coating material 162 having a high percentage of solids is DURA-POXY Heavy Body manufactured by Durall Industrial Flooring, based in Minneapolis, Minn.

The coating material 162 may include functional materials mixed therein, such as nanoparticles.

The coating material 162 may have a high glass transition temperature $T_g$, e.g., at least 115° C. A material with a high glass transition temperature may provide stability that may be beneficial in the building industry. A material with a $T_g$ of room temperature is a plastic, and a $T_g$ below room temperature is a rubber. A suitable product with sufficiently high $T_g$ may be, for example, a styrene-grafted polyphenelene oxide ("PPO") such as XYRON™, available from Asahi Kasei Chemicals based in Japan, that has a $T_g$ of 208° C.

In some embodiments, the coating material 162 may have a relatively low glass transition temperature, e.g., polysilafluoroalkyleneoligosiloxanes, a class of fluoroelastomers. This material, after crosslinking, has good flexibility at low temperature with a glass transition temperature below −45° C. and good thermooxidative stability, over 250° C. A material with a low glass transition temperature tends to be more flexible at room temperature, a characteristic that may be desirable in certain applications.

The surface texture of the tiles 180 may be controlled by the texture of the protective layer of the mold. The texture of the outer layer component 172 is similar to the texture of the mold in which it is formed. For example using a glossy smooth mold surface such as plexiglass with a glossy shine may give the outer layer component 172—and the respective tile 180—a transparent quality similar to that of glass. On the other hand, using a matt mold surface typically results in a matt outer layer component 172.

The outer layer component 172 may include several different layers. For example, it may include a DURA POXY layer, with a functional layer attached thereto with an appropriate laminating material. The laminating material may be, e.g., 103-LVX EPO-STEEL epoxy resin, a system suitable for laminating a material such as glass, a polyamide thin film, or a photovoltaic layer.

The outer layer component 172 may provide a waterproof layer and may also add structural integrity to the tile 180. In particular, after the coating material 162 has solidified, the outer layer component 172 may provide additional rigidity that may be desirable for various applications. A plurality of outer layer components 172 may be adhered to one another atop the first outer layer component 172. This may be achieved by machining the surface of each outer layer component 172 to prepare it for the bond, e.g., by sanding between coats of coating material. This machining step may be omitted by using step-wise polymers. The surfaces of such polymers may adhere to one another with a covalent bond without requiring machining to enable inter-layer bonding. Other function-specific materials may be adhered between the layers of the outer layer components 172.

Referring to FIGS. 20a-20b, after the outer layer component 172 has solidified, the corrugated component 159 may be removed from the mold 1700. Excess epoxy may be removed by machining or sanding (step 175) to complete the creation of one tile 180.

As depicted in FIG. 20a, the appearance and/or structural performance of the tile 180 may be enhanced by orienting adjacent tile components 155 so that the linerboards 410 of the tile components 155 are not parallel with one another. For example, when the linerboards 410 are parallel, a linerboard angle β between the adjacent tile components 155 is zero degrees. When the linerboards 410 are perpendicular with one another, the linerboard angle β is 90 degrees. In some embodiments, the linerboard angle β is between zero degrees and 90 degrees, between about 15 degrees and about 75 degrees, or between about 30 degrees and about 60 degrees. For example, as depicted in FIG. 20a, when producing a hexagonal tile 180, the linerboard angle β may be about 60 degrees.

In some embodiments, the outer layer component 172 may be formed not from a coating material, but rather by adhering another material to the tile component 155. For example, a piece of glass or thin film may be adhered to the tile component 155 with an appropriate adhesive, such as 103-LVX EPO-STEEL epoxy resin. The thin film may be, for example, a photovoltaic film, a scratch-resistant film, a filter for particular wavelengths, a mesh, e.g., a wire mesh, or other material. A suitable photovoltaic film is Schuco MPE module in the AL series, which may be acquired from Schiico International KG with company headquarters located in Bielefeld, Germany.

When a corrugated component 159 is held up to a light source it may be translucent, particularly when the direction of the flutes is parallel to the direction of light traveling from the light source to the observer. For an inner component to be distinctly visible in relation to the rest of the tile component 155, the inner component, i.e., an inner set of corrugated components 159, may have a different flute texture and/or orientation than the rest of the corrugated pieces defining the tile 180. To differentiate the texture of components within a tile component 155, different techniques may be used. The angle of the flutes within a rough block, responsible for control of the light direction, may have been determined in step 115 as well as cutting step 140. The angle of the flutes of certain pieces may be different with respect to the intended light source, e.g., one may vary the flute direction with respect to the center of the tile component 155, or different flute patterns may be obtained by using, e.g., varying thicknesses of layered corrugate. Varying the flute texture and direction may be done for purely aesthetic reasons, or to perform a specific function, e.g., to accommodate desired light placement and/or gain control of light-flow through space.

In some embodiments, it may be desirable to make the seam or edge between tile components 155 invisible or at least not noticeable. The seam is more likely to be visible when the adjoining edges between tile components are intersected by one or more layers of the cardboard pieces 505 within the tile components 155. In that case, the linerboards 410 between the two tile components 155 may not be aligned, thereby making the transition from one tile component 155 to the adjacent tile component 155 more visible. The seam may be made invisible or nearly invisible, however, by aligning the cardboard pieces 505 within the adjacent tile components 155 and ensuring that the edge between the tile components 155 is defined by one or more linerboards 410. By constructing the seam in this manner, the cardboard pieces 505 within the adjacent tile components 155 form a continuous stack of parallel pieces 505, and the seam may be essentially invisible to the observer.

In another embodiment, translucent tiles 180 may be made without first forming a rough block 120, working block 130, and/or finished block 145. For example, the process may begin by obtaining pieces of corrugated cardboard and cutting them into uniform strips. The uniform strips may be held together to form a surface intersected by the flutes within the strips. The strips may then be saturated with an impregnating agent to form the corrugated component 159. As described above, the corrugated component 159 may then be placed into a mold 1700 and exposed to the coating material 162 to form the outer layer component 172. By producing tiles without first creating the rough block 120, the working block 130, and/or the finished block, the procedure may be more efficient, depending on the equipment and materials used. In another embodiment, rather than saturating the strips and forming the outer layer component during separate steps, the strips may be placed in a mold and the impregnating agent may be used to (i) saturate the strips and (ii) form the outer layer component at the same time. Efficiency may be improved by using a single agent (i.e., the impregnating agent) for these two purposes.

The tile 180 may include an inner hexagon disposed within an outer hexagon. Numerous tile component shapes may be used to achieve the inner and outer hexagons. For example, the inner hexagon may include six triangular tile components 155, and the outer hexagon may include six trapezoidal tile components.

The tile 180 may also include one or more tile components made of materials other than corrugated cardboard. For example, a tile component may be made of ½" thick milky acrylic, and the acrylic tile components may be a pattern-integrated rigidifying component that increases the load bearing capability of the tile 180. In a tile including inner and outer hexagons, the outer hexagon may include six trapezoidal tile components 155 and the inner hexagon may include, for example, two triangular acrylic tile components, one rhomboidal acrylic tile component, and two triangular tile components 155 made of corrugated cardboard. After the components 155 of the inner hexagon and the outer hexagon are connected together to form a corrugated component 159, the corrugated component 159 may be placed in a mold (step 170) to form an outer layer component 172. The outer layer component 172 may be made from, for example, WEST SYSTEM® 105™ Epoxy Resin in combination with a hardener, such as WEST SYSTEM® 207™ Special Coating Hardener. The rigidifying component may not adhere to the outer layer component 172.

In some embodiments, tile components are made of tubular materials, such as plastic drinking straws, plastic or metallic tubing, and/or cardboard tubes. To produce a tile component out of these materials, two or more tubes 2010 are held together, generally with their center axes parallel to one another, to form a rough block. Referring to FIG. 20d, in one embodiment, the tubes 2010 are held together inside larger tubes 2020, such as cardboard tubes used as packaging for posters. Referring to FIG. 20c, as with corrugated cardboard materials, the tubes are then coated and/or saturated with impregnating agent to form a working block, trimmed or cut to form a finished block, and/or sliced to produce the tile components. The tile components may then be arranged with other tile components made of cardboard or other materials and coated with an outer layer component to produce a translucent tile. In one embodiment, a surface is covered with translucent tiles made of tubular materials and translucent tiles made of corrugated cardboard.

When saturating plastic materials, such as plastic tubes, with an impregnating agent, proper adhesion between the impregnating agent and the plastic depends upon the type of agent used, the type of plastic, and the types of additives (e.g., wax) included in the plastic. A suitable impregnating agent for plastic materials may be a two-part epoxy including a bisphenol A/epichlorohydrin-based epoxy resin and an aliphatic amine adduct hardener, such as 103-LVX EPO-STEEL epoxy low viscosity epoxy resin and part 2 hardener, manufactured by FASCO Unlimited of Hialeah. Fla. The two-part epoxy may be thinned with acetone to achieve lower viscosities and/or dissolve the plastic, thereby facilitating adhesion.

The tile 180 may also include a photograph (e.g., of a flower) or other indicia printed on a transparent film. To incorporate the photograph into the tile 180, the photograph may be placed in the bottom of the mold (step 172) during the formation of the outer layer component 172. In one embodiment, the photograph is centered within an outer hexagon. The outer hexagon may be made of six trapezoidal tile components 155 that are adhered together (step 157) before being placed in the mold along with the photograph. Once the coating material has cured inside the mold, the transparent film may be easily removed from the tile 180, leaving the photograph of the flower on an outer surface of the outer layer component 172 of the tile 180. To prevent the image from being scratched, a second outer layer component 172 may be formed on top of the image. After the second outer layer component 172 has been formed, the image is embedded between the two layers of outer-layer component 172. In some embodiments, additional layers of outer layer component 172 and additional layers of images may be added, thereby creating unique and interesting layered visual effects. To obtain acceptable adhesion between the photograph and the outer layer component 172, the coating material 162 may be WEST SYSTEM® 207™ Special Coating Hardener and WEST SYSTEM® 105™ Epoxy Resin.

To achieve consistent translucency in a final translucent material, preferably all the flutes in a tile 180 or tile components 155 face in the same direction with respect to a light source. Alternatively, in some embodiments, flutes in a tile component 155 may be oriented differently with respect to a light source or with respect to other components of the tile 180. In particular, corrugated cardboard is transparent when the direction of the flutes is parallel to the direction of light traveling from the light source to the observer. For an inner component to be distinctly visible in relation to the rest of the tile component 155, the inner component, i.e., an inner set of corrugated components 159, may have a different flute texture and/or orientation than the rest of the corrugated pieces defining the tile 180. To differentiate the texture of components within a tile component 155, different techniques may be used. The angle of the flutes of certain pieces may be different with respect to the intended light source, e.g., one may vary the flute direction with respect to center of the tile component 155, or different flute patterns may be used by using. e.g., varying thicknesses of layered corrugate. Varying the flute texture and direction may be done for purely aesthetic reasons, or to perform a specific function, e.g., to accommodate desired light placement and/or gain control of light-flow through a space.

Referring to FIGS. 21a-21b, the tiles 180, tile components 155, and/or rigidifying components 1205 may be circular, arcuate, curved, etc. Circular tiles 180 or tile components 155 may be produced from the circular finished blocks 145 depicted in Figure lib. To achieve a circular shape, the working blocks 145, tiles 180, and/or tile components 155 may be shaped using, for example, a power sander, such as a belt sander, a band saw, a lathe, and/or a hole cutter. A circular rigidifying component 1205 may be obtained from, for example, a cardboard tube. For example, the rigidifying component 1205 may be obtained by slicing a thin or thick walled cardboard tube used to package carpeting. Alternatively, a band or strip may be wrapped around the tile component core. Referring to FIG. 21a, a hexagonal tile 180 may include six circular tile components 155 surrounding a central circular tile component 155.

Referring to FIGS. 22a-22c, by using a plurality of tiles 180, a virtually limitless number of patterns may be created. In particular, referring to FIG. 22b, a surface 185 may be created with tiles 180 having two shapes: equilateral triangles and equilateral hexagons. Referring to FIG. 22c, a surface 185 may be created with equilateral triangles and structures derived therefrom.

A single corrugated component 159 may be described as being orthotropic, i.e., having different material properties in different orthogonal directions. Corrugated board is typically most rigid in the direction of the flutes, i.e., with force applied directly downward upon the flutes. A tile 180 having only one corrugated component 159 has its load-bearing capability determined by the flute orientation of the corrugated component 159 with respect to stresses applied to the surface. A corrugated component 159 consisting of cardboard only, e.g. without a rigidifying component, is able to withstand more stress, in respect to the surface of the material, when force is applied parallel to, rather than perpendicularly to, the flute orientation. By creating symmetries that alter the flute pattern, a very rigid and sturdy material may be created. This material may be utilized in numerous applications. The more axes of symmetry that are utilized when constructing each tile 180, the more structural load the surface is able to withstand. As a fundamental principle in the art of building, the function and stability of a structure follow its geometry. A preferred geometry provides stability.

Other techniques may be used to improve the structural integrity of individual tiles 180 and, as a result, the surface that they cover. Load-bearing capabilities of the tile 180 may be enhanced by placing a rigidifying component 1205 within the tile 180 during assembly. In particular, referring to FIGS. 23a-23d, a tile component 155 may include a rigidifying component 1205. A rigidifying component 1205 may help enhance the load-bearing capabilities of the tile component 155 in one or all directions of forces acting on a tile component 155. The rigidifying component 1205 of the tile 180 may also function as an aesthetic element. In some embodiments, borders of the mold upon which the outer layer component 172 is formed may itself be incorporated into the tile 180 as a rigidifying component.

The rigidifying component 1205 may be a sheet. Typically, the component is disposed perpendicularly to the exposed surface of the tile 180. The thickness of the rigidifying component 1205 may be the same as or different from the thickness of the corrugated component 159. For example, the thickness of the rigidifying component 1205 may be the same as the thickness of the translucent tile 180. The rigidifying component 1205 may be made from numerous types of material, e.g., carbon fiber, wood, metal, glass, cardboard, etc. An embodiment of a triangular tile 180 with the rigidifying component 1205 that also acts as an aesthetic element may be seen in FIG. 23e. The rigidifying component 1205 in this embodiment may be attached to the remainder of the corrugated component 159 with, for example, adhesive. In another embodiment, the rigidifying component 1205 is attached to the corrugated component 159 during the formation of the outer layer component 172, as depicted in FIG. 18e. Referring to FIG. 23f, a surface 185 may be created with hexagon-shaped motif tiles 180 incorporating the tile component 155 of FIG. 23a. Referring to FIG. 23g, a surface 185 may be created with the tile 180 shown in FIG. 23d.

Incorporating the rigidifying component 1205 within the structure of the tile component 155 may improve the structural integrity of individual tiles 180 and subsequently of the surface that they may cover. Load-bearing capabilities of the tile 180 may be enhanced by placing the rigidifying component 1205 within the tile 180 during assembly. In particular, FIG. 23a-23d illustrate various tile components 155 that have the rigidifying component 1205 disposed within their corrugated layers. The tile component 155 depicted in FIG. 23a may be formed from the finished block 145 illustrated in FIG. 12e. The rigidifying component 1205 may help enhance the load-bearing capabilities of the tile component 155 in one or more directions of forces acting on a tile component 155. The rigidifying component 1205 of the tile 180 may also function as an aesthetic element. Referring to FIG. 22c, a surface 185 may be created with triangular-shaped tiles 180. Each tile 180 may have the rigidifying component 1205 disposed between its layers, with the rigidifying component 1205 also acting as an aesthetic element.

When implementing embodiments of the invention in the construction and building industries, one may take into account that water is an enemy of any building and construction, especially in climates that have much rain and high humidity. It is well known in these industries that one cannot keep water out—one can only try to accommodate it and minimize its potentially detrimental effects. Although the impregnation of the corrugated component 159 with the impregnating agent 705, in combination with the outer layer component 172, provide consistent and nearly impenetrable vapor and water barriers, humidity may still have some effect. This effect may not be a factor when covering a small surface, e.g. hanging lights, stand-alone lamps, furniture. However, this effect may be significant and is preferably considered when covering large surfaces, e.g., glazed building facade panels.

Geometry Considerations

A repeating geometric pattern, as used herein, means a pattern having the same repeating elements or tile components 155 that may be used to cover a surface. Any pattern that is defined by repeating elements may be repeated without limit. Thus, tiles 180 may be sized and shaped to cover a surface of any given size without gaps by using a repeating geometric pattern.

The golden ratio is a proportion that may be represented as:

$$\Phi=(1+\sqrt{5})/2=1.6180339887498948482045868340\ldots$$

which may be rounded off to 1.618 or 1.62. The golden ratio may also be referred to as golden proportion, golden mean, or golden number, divine proportion, sacred proportion. Phi, $\Phi$ or $\varphi$, with $\varphi=1/\Phi=0.618$.

The golden ratio $\Phi$ may be defined as the ratio of two terms, such that the ratio of the larger term to the smaller term is the same as the ratio of the sum of the smaller and larger to the larger term. The Golden Proportion may be observed in any regular polygon shape, i.e., any polygon that is equilateral and equiangular. As the ratio between elements is a constant, the elements exhibit a repeating geometric pattern, within which one may observe $\Phi$. Although the proportion within the pattern may not be immediately apparent, $\Phi$ may be observed in any repeating units, as discussed below Geometric shapes and patterns incorporating the golden ratio are known to be aesthetically pleasing, a notion that has been confirmed by numerous studies. This appeal occurs on a subliminal level, where an observer may be attracted or drawn to an object, shape or a pattern without knowing why. Geometric patterns using repeating elements to tile a surface incorporate $\Phi$, since $\Phi$ may be derived from any two identical polygons disposed next to one another. Referring to FIG. 24. $\Phi$ may also be derived from three abutting circles. For example, when the diameter of these circles is equal to one, a line drawn from the top of the first circle to the bottom of the third circle has a length of $\sqrt{5}$, and a line drawn from the bottom of the first circle to the bottom of the third circle has a length of 2. $\Phi$ may be derived by combining these three lengths since $\Phi=(1+\sqrt{5})/2$. As FIG. 24 helps to illustrate, $\Phi$ can be found in any repeating pattern of identical, adjacent tiles.

Covering a surface with a repeating geometric pattern provides other benefits, e.g., production efficiency. The use of repeating elements enables more efficient use of materials, as the patterns allow small pieces of material to be used more economically. For example, in the design of wooden doors, geometric patterns enable small pieces of wood to be used economically and allow the whole combination to conform to climatic factors such as temperature and humidity. In that sense, individual corrugated components 159 that define sets of tile components 155 and tiles 180, are similar to wood. These factors are preferably considered, especially when making tiles 180 that will be exposed to extreme temperature and humidity changes. When a surface is covered with a symmetrical pattern, expansion and contraction occurs predictably across the plane of the surface. A geometric pattern thereby enables a predictable distribution of force due to expansion and contraction.

Embodiments of invention include translucent tiles 180 in which the structure of the material is visible. Because the structure is visible, it is preferably eye-pleasing as well as functional, especially in structural applications in which tiles 180 may last for the lifetime of a building.

A preferred geometric shape to use as the corrugated component 159 in a tile 180 is an equilateral triangle, or a shape that is derived from an equilateral triangle, e.g., 30-60-90 triangles or equilateral rhombi. By using these shapes, a hexagon may be created. In some embodiments, areas or other dimensions of tile components 155 may be proportional to one another by $\Phi$. By using the same element, e.g., a hexagon, a flat surface may be covered substantially without gaps and have the appropriate structural integrity for a wide array of applications. In other embodiments, other shapes may be used. Structural integrity is not necessary for all applications, and triangles or rhombi may not be desired in the pattern created by the materials' translucency.

In some embodiments, translucent tiles 180 may include more than one set of corrugated components 159. Tiles 180 composed of more than one set of corrugated components 159 are referred to herein as motifs. Preferably, the corrugated components 159 in motifs exhibit a repeating geometric pattern that incorporates the golden proportion, e.g., by varying repeated elements within each motif. $\Phi$ may be incorporated into a repeating geometric pattern defining a surface by deliberately setting equal to $\Phi$ the ratio between certain quantitative qualities associated with a corrugated component 159 or sets of corrugated components 159 to those of other individual corrugated components 159 or sets of components within each tile 180 or motif. These quantitative qualities may include, but are not limited to, surface area, height, and length of edge.

The use of hexagonal motifs may be a preferred element with which to cover a surface with a repeating geometric pattern. Hexagons allow an efficient combination of materials and labor, while providing high stability against forces acting parallel to the surface. Forming a hexagon from numerous corrugated components 159 may increase the load bearing ability of the tile 180, e.g., equilateral triangles may preferably be used to define the hexagons. Such hexagonal patterns may provide more structural stability than a patterns defined by hexagonally shaped tiles 180 having the same dimensions but consisting of one corrugated component 159 each In an embodiment of the invention, tiles 180 are prepared with the intent to cover a surface using hexagons that define a repeating geometric pattern incorporating hexagonally shaped tiles 180 or hexagonally shaped motifs. Hexagonally shaped motifs, as used herein, mean hexagonally shaped tiles 180 including more than one set of corrugated components 159. FIG. 25a-25e illustrate some examples of hexagonally shaped tile motifs. FIG. 25e illustrates a cross section of a tile 180 with various components; some of the components have angles of the flutes that vary with respect to a light source. Referring to FIG. 25f, the tiles 180 and/or tile components 155 may be circular.

A surface may be defined by hexagonally shaped motifs that include corrugated components 159. Items constructed with the incorporation of repeating hexagons are eye pleasing because of the presence of $\Phi$ within the repeating patterns.

Each hexagon shaped motif may include tile components 155 having the following non-limiting list of geometric shapes: twelve 30-60-90 triangles, six equilateral triangles, three regular rhombi, or two parallelograms. A hexagonally shaped tile 180 may include some or all of these shapes.

Referring to FIG. 26a, a hexagonal tile 180 may be formed from tile components 155 that are, for example, triangular, rhomboidal, and/or trapezoidal. The tile components 155 may have a height H. Referring to FIGS. 26b and 26c, the hexagonal tile 180 may be made of tile components that are triangular and trapezoidal. FIGS. 22b-22c and FIGS. 23f-23g illustrate various hexagonal geometric patterns.

An exemplary way to incorporate Φ into the tile's geometry is to have a hexagonal tile 180 defined by two sets of tile components 155. Referring to FIGS. 27a and 27b, the tile 180 may include an outer set $S_o$ of tile components 155 and an inner set Si of tile components 155. The outer set $S_o$ may include six trapezoids with each trapezoid having a height $H_o$. The inner set Si may include three rhombi with each rhombi having a height $H_i$. In one embodiment, $H_i$=2.499 and $H_o$=1.545 so that the heights $H_i$, $H_o$ are related by Φ as follows:

$$H_i/H_o=(H_i+H_o)/H_i=\Phi.$$

Referring to FIGS. 26b and 26c, in other embodiments, the outer set $S_o$ of tile components 155 may include six trapezoids and the inner set Si of tile components may include six triangles.

In another embodiment, the areas of the inner set Si and the outer set $S_o$ may be related by Φ. Specifically, referring to FIGS. 26b-26c and 27a-27b, the combination of the inner set Si plus the outer set $S_o$ (i.e., the entire tile 180) may form a first hexagon HEX1 having an area $A_{HEX1}$, and the inner set $S_i$ alone may form a second hexagon HEX2 having an area $A_{HEX2}$. In another embodiment, referring to FIGS. 26b-26c, $H_i$=2.042 and $H_o$=0.556 so that the areas $A_{HEX1}$, $A_{HEX2}$ are related by Q as follows:

$$A_{HEX1}/A_{HEX2}=A_{HEX2}/(A_{HEX1}-A_{HEX2})=\Phi.$$

Thus, not only is the ratio of $A_{HEX1}$ to $A_{HEX2}$ equal to Φ, but the ratio of $A_{HEX2}$ to $A_{HEX1}$-$A_{HEX2}$ is also equal to Φ.

Using the above-mentioned techniques to determine the size and shape of the tile components 155, one can make sets of tiles 180 related to one another by Φ. Together, these shapes may be used to cover a surface with tiles 180 without gaps. Accordingly, finished blocks 145 are preferably prepared to create the tile components 155 described in FIG. 27a and FIG. 27b. FIG. 27b is a schematic diagram showing the geometry of the finished blocks 145 needed to cover a surface without gaps using the motif illustrated in FIG. 27a. FIG. 23f illustrates a surface filled with hexagonally shaped motifs defining the geometric pattern of FIG. 27a. Referring to FIG. 23f, a surface may be covered with tile components 155 having lengths related to one another by (D, as shown in FIGS. 27a and 27b.

One may easily apply the diagram in FIG. 26b to determine the size of elements needed to make a hexagonal motif of a desired size by assigning a desired length to an edge of the pictured hexagon. For example, if one chooses a length of 3 inches for each of the six sides of first hexagon HEX1, the area $A_{HEX1}$ is 23.382 in².

In particular, since a regular hexagon (all sides being the same length and each internal angle being 120° C.) is defined by six equilateral triangles, the area of the hexagon is equal to six times the area of each equilateral triangle, each side of which is equal to 3 inches in the instant example.

The area of an equilateral triangle is equal to ½ (b*h).

The height of the equilateral triangle may be determined by considering one of the two 30-60-90 triangles that define it. If the hypotenuse of the 30-60-90 triangle is 3 inches, its short side is ³⁄₂ inches=1.5 inches, and the length of its long side (also the height h of the equilateral triangle) may be determined as follows:

$$(\text{short side})^2 + (\text{long side})^2 = \text{hypotenuse}^2$$

$$(\text{long side})^2 = \text{hypotenuse}^2 - (\text{short side})^2$$

$$\text{long side} = \sqrt{(9-2.25)}$$

$$= \sqrt{(6.75)}$$

$$= 2.598 \text{ inches}$$

The area of a regular hexagon composed of 6 equilateral triangles, each having a side with length b of 3 inches and a height h=2.598 inches, may be calculated as follows:

$$\text{Area of regular hexagon} = 6 * [1/2(b*h)]$$
$$= 6 * [1/2(3 \text{ inches} * 2.598 \text{ inches})]$$

$$A_{HEX1} = 23.382 \text{ in}^2$$

To determine the desirable size and dimensions of the second hexagon HEX2, one needs to find the next smallest quantity proportional to the area $A_{HEX1}$ of the outer hexagon by Φ. This is achieved by multiplying the surface area by φ (which is equal to 1/Φ).

$$23.382 \text{ in}^2 \times 0.618 = 14.450 \text{ in}^2$$

Thus, the area $A_{HEX2}$ defined by HEX2 is preferably 14.450 in² when $A_{HEX1}$ is 23.382 in². Working backwards, one may calculate the dimensions of the inner set of components based on the area $A_{HEX2}$ of HEX2. Thus, each side of the second hexagon HEX2 may have a length of 2.358 inches.

The finished block 145 may be prepared accordingly, such that it may be sliced into tile components having appropriate sizes and shapes for making a motif including first and second hexagons HEX1, HEX2. FIG. 26c illustrates the geometry of the finished blocks 145 that may be used to create the tiles 180 that may cover a surface without gaps using the technique and motifs described with respect to FIG. 26b.

A hexagonally shaped tile component 155 may be formed using various techniques. A hexagonally shaped finished block 145 may also be formed in the following way. To prepare a hexagonal tile 180, one preferably first determines the height (H) of the tile 180 to be made, with the height H being equal to ½ the distance between two parallel sides of the hexagon To determine the height H, one has to know the machining capacity of the equipment to be utilized or know the desired size of each hexagon to be used. Finished blocks 145 need to be prepared that are suitably sized, having sides with a common length L for preparing the tile components 155.

A 30-60-90 triangle is the smallest repeating non-symmetrical unit that can form a hexagon, twelve of which define a hexagon. The term 30-60-90 refers to a right triangle with 30° and 60° degree angles, i.e., the ratio of its short side to its hypotenuse is 1:2. An equilateral triangle includes two 30-60-90 triangles placed long side to long side. Six equilateral triangles may be used to form a hexagon.

The following steps may be performed to manufacture finished blocks 145 that define equilateral triangles. An equilateral triangle has internal angles of 60 degrees. Thus, finished blocks 145 have to shaped appropriately to have cross sections defining equilateral triangles. A table saw blade may be set at a 60° degree angle in relation to its table top. The working block 130 is passed through a table saw (blade of which has been set at a 60 degree angle) using the fence as the guide. Then the newly cut side of the working block 130 is used as the reference for the next cut at 60 degrees. The cut piece is rotated three times, each time using the newly cut side as the reference for the next cut. After three passes, one attains a finished block 145 that has the cross-sectional shape of an equilateral triangle.

As mentioned earlier, tiles 180 may have any shape, dimensions, or thickness. For example, tiles 180 may be prepared in the shape of a circle. As used herein, "circle" refers to a tile 180 or tile component 155 in the shape of a cylinder, though oval or elliptical cross-sections are also possible. Finished blocks 145, tiles 180, and tile components 155 in the shape of a cylinder or other contours may also be created. A finished block 145 in the shape of a cylinder has a circular face.

Using circular tiles 180 may be considered as an application of bio-mimics, whereby humans borrow systems and mechanism from everyday nature and use them in various applications. Even though using abutting circles does not cover a surface periodically, their use can provide great benefit. The infinite number of symmetries associated with a circle result in superior stability. Using abutting circles to cover a surface gives the surface a great stability, as well as creates beautiful, eye-pleasing patterns.

As shown in FIG. 28a, when covering a plane in a fully nested pattern with successive circles having the same diameter, six circles surround a single circle. Completely covering a plane with circles is only possible if they overlap one-another, e.g., two surfaces, each formed of abutting circles, may be placed on top of one another and shifted over a distance equal to the circles' radius. As depicted, a hexagon may be formed by lines connecting the centers of six circles surrounding a single circle. Similarly, as seen in FIG. 28b, when circles overlap one another just enough to cover completely a surface, a hexagon shape is created. Thus, covering a surface with hexagons is similar to forming a honeycomb. A honeycomb includes a number of cylinders stacked on top of one another. When they are deposited they are in a form of a fluid. The locations where the fluid melts together (analogy of circles overlapping) is where the face of the cylinder is elongated, thereby creating an optical illusion of a surface being covered with hexagons. A honeycomb is the result of bees following the principle of synergy to form a structure in which a maximum surface area is created with a minimum amount of materials and labor. Using hexagonally shaped tiles to cover a surface may have the same effect.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. The features and functions of the various embodiments may be arranged in various combinations and permutations, and all are considered to be within the scope of the disclosed invention. Accordingly, the described embodiments are to be considered in all respects as only illustrative and not restrictive. Furthermore, the configurations described herein are intended as illustrative and in no way limiting. Similarly, although physical explanations have been provided for explanatory purposes, there is no intent to be bound by any particular theory or mechanism, or to limit the claims in accordance therewith.

What is claimed is:

1. A translucent tile comprising:
   a translucent tile component comprising:
      a plurality of pieces of tubing at least partially coated by an impregnating agent,
   wherein (i) first and second ends of the pieces of tubing define upper and lower exposed surfaces of the tile component and the tile, and (ii) cross-sections of the first and second ends of the tubing pieces intersect the upper and lower exposed surfaces such that the tile component and the tile are translucent.

2. The translucent tile of claim 1, wherein at least two of the pieces of tubing have different radii.

3. The translucent tile of claim 1, wherein at least two of the pieces of tubing have the same radii.

4. The translucent tile of claim 1, wherein one or more of the pieces of tubing are held together with their central axes parallel inside a tube sized to contain the one or more pieces of tubing.

5. The translucent tile of claim 1, wherein the tubing comprises at least one member selected from the group consisting of drinking straws, plastic tubing, metallic tubing, and cardboard tubing.

6. The translucent tile of claim 1, wherein the surface is substantially planar.

7. The translucent tile of claim 1, further comprising a rigidifying component disposed perpendicularly to the surface of the tile.

8. The translucent tile of claim 7, wherein the rigidifying component comprises at least one member selected from the group consisting of a photovoltaic material, a light source, metal, plastic, rubber, wood, carbon fiber, glass, cardboard, and a portion of a mold.

9. The translucent tile of claim 1, further comprising a photovoltaic component.

10. The translucent tile of claim 1, further comprising a transparent outer layer component disposed proximate the surface.

11. The translucent tile of claim 10, wherein the transparent outer layer component is selected from the group consisting of a coating material, glass, a photovoltaic film, a scratch-resistant film, a filter for particular wavelengths of light, a mesh material, a portion of a mold, and quartz.

12. The translucent tile of claim 10, wherein the outer layer component comprises more than one layer.

13. The translucent tile of claim 10, further comprising a second outer layer component and a solar panel, the solar panel disposed between the outer layer component and the second outer layer component.

14. The translucent tile of claim 10, further comprising a second outer layer component comprising at least one of a photovoltaic nanopolymer and nanoparticles.

15. A process for using translucent tile, the process comprising:
   providing a plurality of translucent tiles, each translucent tile comprising a translucent tile component comprising a plurality of pieces of tubing at least partially coated by an impregnating agent, wherein (i) first and second ends of the pieces of tubing defining a surface define upper and lower exposed surfaces of the tile component and the tile, and (ii) cross-sections of the first and second ends of the tubing pieces a direction of the tubes intersect the upper and lower exposed surfaces such that the tile component and the tile are translucent; and
   arranging the plurality of translucent tiles to define a tiled surface.

16. The process of claim 15, wherein one or more of the pieces of tubing are held together with their center axes parallel inside a tube sized to contain the one or more pieces of tubing.

17. The process of claim 15, wherein at least two of the pieces of tubing have different radii.

18. The process of claim 15, wherein at least two of the pieces of tubing have the same radii.

19. The process of claim 15, wherein the tiled surface is selected from the group consisting of a floor, a wall, a roof, a lighting installation, an architectural construction element, an architectural aesthetic element, and a solar panel.

20. A process for manufacturing a translucent tile comprising a translucent tile component, the process comprising the steps of:
providing a plurality of pieces of tubing, the pieces of tubing having central axes parallel to a longitudinal direction of the pieces of tubing;
holding together the pieces of tubing to define a rough block, wherein the central axes of the pieces of tubing are parallel with respect to each other;
at least partially coating the rough block with an impregnating agent to form a working block;
trimming the working block to form a finished block having a cross-section with a precise geometric shape; and
slicing the finished block at a predetermined angle to a direction of the central axes of the tubing pieces into slices to define a plurality of translucent tile components, each tile component comprising a plurality of pieces of tubing at least partially coated by an impregnating agent, wherein (i) first and second ends of the pieces of tubing define upper and lower exposed surfaces of the tile component and the tile, and (ii) cross-sections of the first and second ends of the tubing pieces intersect the upper and lower surfaces such that the tile component and the tile are translucent.

21. The process of claim 20, wherein the holding step comprises adhering the pieces of tubing together with an adhesive.

22. The process of claim 21, wherein the adhesive and the impregnating agent comprise a common material, the common material comprising a plasticizer.

23. The process of claim 20, wherein the impregnating agent comprises a penetrating sealer selected from the group consisting of a two-part epoxy, polyaspartic polyurea, silicates, siliconates, plant-based resins, and combinations thereof.

24. The process of claim 23, wherein the two-part epoxy is thinned with acetone to achieve lower viscosities and/or dissolve the plastic, thereby facilitating adhesion.

25. The process of claim 23, wherein a first part of the two-part epoxy comprises a resin and a second part of the two-part epoxy comprises a hardener.

26. The process of claim 25, wherein the resin comprises a bisphenol-A based epoxy resin.

27. The process of claim 26, wherein the first part of the two-part epoxy further comprises benzyl alcohol, bisphenol-F type epoxy resin, and ethylene glycol monobutyl ether.

28. The process of claim 25, wherein the hardener comprises a modified polyamine.

29. The process of claim 28, wherein the modified polyamine comprises polyoxypropylenediamine, reaction products of isophorone diamine with phenmol/formaldehyde, isophoronediamine, reaction products of benzene-1, 3-dimethaneamine with hydroxybenzene and formaldehyde, hydroxybenzene, and m-Xylene diamine.

* * * * *